(12) United States Patent
Kasukabe et al.

(10) Patent No.: US 7,724,006 B2
(45) Date of Patent: May 25, 2010

(54) PROBE CARD, MANUFACTURING METHOD OF PROBE CARD, SEMICONDUCTOR INSPECTION APPARATUS AND MANUFACTURING METHOD OF SEMICONDUCTOR DEVICE

(75) Inventors: Susumu Kasukabe, Yokohama (JP); Yasunori Narizuka, Hiratsuka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/253,271

(22) Filed: Oct. 17, 2008

(65) Prior Publication Data

US 2009/0212798 A1  Aug. 27, 2009

(30) Foreign Application Priority Data

Feb. 27, 2008  (JP)  ............................. 2008-045809

(51) Int. Cl.
  *G01R 31/02*  (2006.01)
  *G01R 31/26*  (2006.01)
(52) U.S. Cl. .................... 324/754; 324/761; 324/762
(58) Field of Classification Search .......... 324/754–765
  See application file for complete search history.

(56) References Cited

U.S. PATENT DOCUMENTS 6,799,976 B1 * 10/2004 Mok et al. ................... 439/55
7,049,837 B2 * 5/2006 Kasukabe et al. ........... 324/754
7,227,370 B2 * 6/2007 Kasukabe .................... 324/754
7,423,439 B2 * 9/2008 Kasukabe et al. ........... 324/754
2006/0192575 A1 * 8/2006 Kasukabe et al. ........... 324/754
2008/0150558 A1 * 6/2008 Amemiya et al. ........... 324/754

FOREIGN PATENT DOCUMENTS

| JP | 7-283280 | 10/1995 |
|---|---|---|
| JP | 2002-531915 | 9/2002 |
| JP | 2005-024377 | 1/2005 |

OTHER PUBLICATIONS

Membrane Probe Card Technology, B. Leslie, et al, 1988 IEEE., pp. 601-607.

* cited by examiner

*Primary Examiner*—Ha Tran T Nguyen
*Assistant Examiner*—Emily Y Chan
(74) *Attorney, Agent, or Firm*—Mattingly & Malur, P.C.

(57) ABSTRACT

A silicon substrate is used as a mold, and thin films such as metal films and polyimide films are sequentially stacked on the silicon substrate by using photolithography techniques, thereby forming a probe sheet having contact terminals having a pyramidal shape or a truncated pyramidal shape disposed at distal ends of cantilever beam structures. A fixing substrate is further fixed to the probe sheet, and then, the formed probe sheet is sequentially stacked and formed on the silicon substrate, the substrate is fixed, and the silicon substrate and predetermined polyimide films are removed by etching, thereby forming the group of contact terminals with the cantilever beam structures at a time.

12 Claims, 55 Drawing Sheets

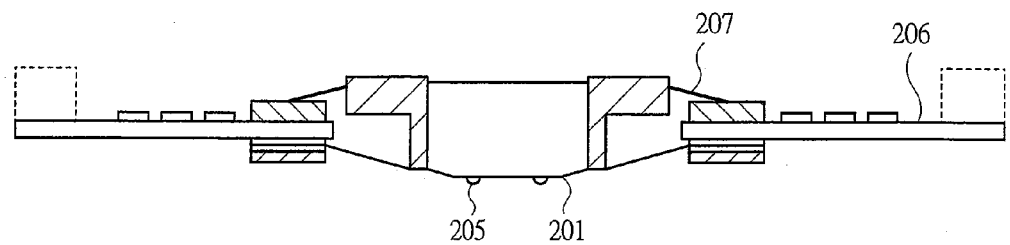
FIG. 52  PRIOR ART
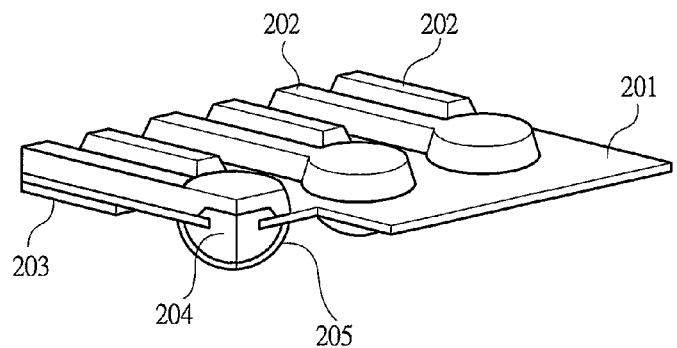
FIG. 53  PRIOR ART

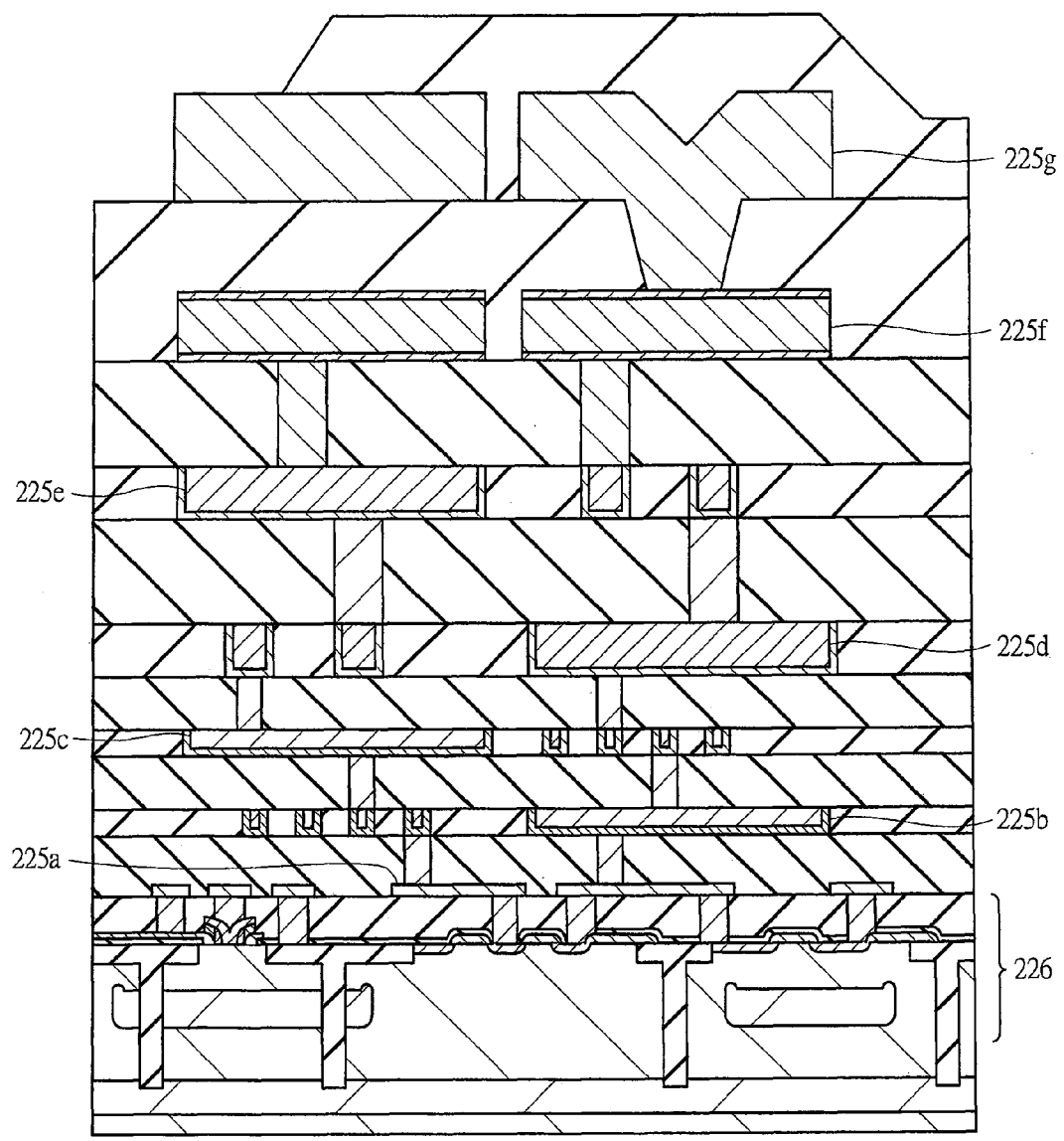
FIG. 56  PRIOR ART

PROBE CARD, MANUFACTURING METHOD OF PROBE CARD, SEMICONDUCTOR INSPECTION APPARATUS AND MANUFACTURING METHOD OF SEMICONDUCTOR DEVICE

CROSS-REFERENCE TO RELATED APPLICATION

The present application claims priority from Japanese Patent Application No. JP 2008-045809 filed on Feb. 27, 2008, the content of which is hereby incorporated by reference into this application.

TECHNICAL FIELD OF THE INVENTION

The present invention relates to a probe card, a semiconductor inspection apparatus, and a manufacturing technology of a semiconductor device. More particularly, it relates to a technology effectively applied to a probe card having a probe sheet formed by the method similar to that used in the manufacture of a semiconductor integrated circuit, a manufacturing technology of the probe card, a semiconductor inspection apparatus including the probe card, and a manufacturing process of a semiconductor device including an inspection process by the semiconductor inspection apparatus.

BACKGROUND OF THE INVENTION

An example of the flow of the inspection process in the manufacturing process of a semiconductor device carried out after forming semiconductor circuits on a semiconductor wafer (hereinafter, simply referred to as a wafer) is shown in FIG. 51 with using a package product, a bare chip, and CSP (Chip Size (Scale) Package), which are typical shipping forms of semiconductor devices, as examples.

In the manufacturing process of the semiconductor device, roughly three inspections described below are carried out as shown in FIG. 51. The first is a wafer inspection carried out in the wafer state in which the semiconductor circuits and electrodes are formed on a wafer to check the conduction state and the electrical signal operating state of the semiconductor elements, the second is a burn-in inspection in which semiconductor elements are placed at a high temperature or high-voltage applied state to extract unstable semiconductor elements, and the third is a sorting inspection to check the product performance before shipping the semiconductor devices.

With respect to the apparatus (semiconductor inspection apparatus) used in such inspections of semiconductor devices, in conventional technologies, many semiconductor devices (semiconductor chips (hereinafter, simply referred to as chips)) are provided on the surface of a wafer, and they are individually separated for use. Many electrodes are disposed in an array on the surface of each of the individually separated semiconductor devices. When a large number of such semiconductor devices are industrially produced and the electrical characteristics thereof are inspected, a connecting device comprising probes formed of tungsten needles obliquely projecting from a probe card is used. The inspection by the connecting device employs the method in which contact is achieved by scrubbing the electrodes with the contact pressure utilizing the flexure of the probes so as to inspect the electrical characteristics thereof.

Recently, along with the density growth of semiconductor elements, in the inspection process in the manufacture of semiconductor devices, the pitches of the probes for inspection have been narrowing, and the number of pins of the probes has been increasing. Therefore, it has been desired to develop an inspection apparatus of semiconductor elements using a connecting device capable of reliably transmitting electrical signals between the electrodes of the semiconductor elements and inspection circuits, probing minute electrodes of the semiconductor elements having narrow pitches and many pins with high precision in the step of carrying out an operation inspection and further probing the semiconductor elements with a low load so as to prevent damages.

As the inspection method and inspection apparatus that enable characteristic inspections of semiconductor elements in the case where the density of the semiconductor elements is grown, the pitches thereof are narrowed and an operation test by high-speed signals is required, there are the technologies described in the collection of papers of ITC (International Test Conference), 1988, pp. 601 to 607 (Non-Patent Document 1). FIG. 52 is a schematic diagram of the structure of the inspection apparatus disclosed in the Non-Patent Document 1, and FIG. 53 is an enlarged perspective view showing the principal part of the inspection apparatus. In a probe for semiconductor inspection used herein, wiring 202 is formed by photolithography techniques on an upper surface of a flexible insulating film 201, a ground layer 203 is formed on a lower surface of the insulating film 201, and semispherical bumps 205 formed by plating at through holes 204 of the insulating film 201 which are provided at the positions corresponding to the electrodes of a semiconductor to be inspected are used as contact terminals. This technology employs the method in which the bumps 205 connected to inspection circuits (not shown in the drawings) via the wiring 202 formed on the surface of the insulating film 201 and via a wiring board 206 are brought into contact with the electrodes of the semiconductor elements to be inspected by scrubbing the bumps 205 with the elastic force of a plate spring 207, thereby mutually transmitting signals to carry out the inspection.

Japanese Patent Application Laid-Open Publication No. 2005-24377 (Patent Document 1) discloses inspection apparatus of semiconductor elements, and FIG. 54 is a schematic view of the structure of a probe card for the inspection thereof. In this probe apparatus, a probe sheet is divided into four, and pyramidal contact terminals 212 and an insulating film 213 on which wiring is formed are pressed down by a spring plunger 211 provided at the center of the probe sheets via a pressing piece 214 and a buffer material.

Also, Japanese Patent Application Laid-Open Publication No. 07-283280 (Patent Document 2) discloses an inspection system in which contact terminals are formed by using the holes, which are formed by performing selective anisotropic etching to a silicon wafer, as molds, the contact terminals are electrically connected to wirings formed in a flexible insulating film, a probe sheet fixing board is fixed to the rear surface of the insulating film reverse to the contact terminal disposed surface of the insulating film via a buffer layer, the probe sheet fixing board is superimposed on a wafer supporting substrate on which a wafer having semiconductor devices to be inspected formed thereon is fixed to a wafer-shaped groove, and the distal-end plane of the contact terminal group and the plane of the electrodes of the wafer are brought into contact with each other, thereby achieving electrical connection and carrying out an inspection of the semiconductor devices.

Further, Published Japanese Translation of PCT Application No. 2002-531915 (Patent Document 3) discloses a spring contact element formed by lithography techniques. FIG. 55 is a schematic diagram showing an intermediate stage of a manufacturing process of the spring contact element formed by the lithography techniques. In this process, a tip part (contact terminal) 217 is formed by using a hole 216, which is formed by performing anisotropic etching to a silicon substrate 215, as a mold, a beam part (beam) 218 and a post part 219 connected to the tip part 217 are formed by the lithography techniques and surface polishing processing (Chemical Mechanical Polishing: CMP), the post part 219 is connected to an electrode 221 of a ceramic multi-layer wiring board 220 by solder 222, and lastly, the tip part 217 is removed from the silicon substrate 215.

SUMMARY OF THE INVENTION

Recently, it has been desired to develop the inspection apparatus of semiconductor elements using a connection device capable of carrying out an operation inspection by transmitting electrical signals between electrodes of the semiconductor elements with narrow pitches and a large number of pins and inspection circuits. Also, in the semiconductor elements for high-speed electrical signals, in order to miniaturize wiring while reducing dielectric loss, low-dielectric-constant films (Low-k films) made of materials having smaller dielectric constants compared with silicon oxide ($SiO_2$) such as fluorine-added silicon oxide (FSG), carbon-added silicon oxide (SiOC), and an organic-based material have been used as insulating films between wiring layers. Since such materials having small dielectric constants have comparatively low withstand load and weak mechanical strength, in order to prevent damage on the low-dielectric materials, inspection apparatus capable of realizing a stable contact resistance value at a load of about several tens of mN or less is desired.

Moreover, when the semiconductor elements are further miniaturized, an active circuit element formation region (active area) and fine wiring are formed in multiple layers immediately below the electrode part for inspection of the semiconductor elements in many cases like a CMOS-LSI 226 in which many layers of wiring 225a to 225g are formed in upper layers as shown in Japanese Patent Application Laid-open Publication No. 2001-53076 (see FIG. 56). Therefore, in order to prevent the active circuit elements and multi-layer wiring from being damaged, the load of a contact terminal in the inspection is required to be a low load as much as possible within the range that can provide a good contact resistance value.

Moreover, electrode pads for inspection of fine semiconductor elements having narrow pitches have to be brought into contact with contact terminals for inspection at high positional precision. In addition, when wire bonding using the electrode pads or bumps for connection are formed in a subsequent step, in order to ensure the connection of the wires or bumps to the electrode pads, roughness of the surfaces of the electrode pads caused by probing is required to be prevented as much as possible. In other words, minute probing marks are required.

Hereinafter, the above-described techniques will be reviewed from these points of view.

In the probe formed of the tungsten needle and the probe in which the semispherical bump is formed, the contact state with a material to be contacted such as an aluminum electrode or a solder electrode in which an oxide is formed on the material surface is ensured by scrubbing the contact terminal with the electrode so as to scrub off the oxide on the surface of the electrode material and allowing the contact terminal to contact the metal conductive material below the oxide. As a result, dust of the electrode material is generated by scrubbing the electrode with the contact terminal, which causes the short circuit between wirings and generation of foreign matters. Furthermore, it has been pointed out that, since the contact state is ensured by scrubbing the electrode with the probe while applying a load of about several hundreds of mN or more, the low-dielectric-constant material may be damaged.

Thus, in the method in which the bumps which are formed by plating a part of wiring are used as the probes as shown in FIG. 52 and FIG. 53, the distal end portion of each bump is flat or semispherical. Therefore, the oxide cannot be readily scrubbed off from a material to be contacted such as the aluminum electrode or the solder electrode in which the oxide is formed on the surface of the material. Accordingly, the contact resistance becomes unstable, and the load in the contact is required to be about several hundreds of mN or more. However, excessive increase of the load in the contact has a problem. More specifically, since the semiconductor element is highly integrated and the electrodes having many high-density pins and narrow pitches are formed on the surface of the semiconductor element, many active elements and fine wirings are formed immediately below the electrodes in many cases. Therefore, when the contact pressure of the probes to the electrodes in the semiconductor element inspection is excessively large, the electrodes and the active elements or wirings immediately below them may be damaged. Accordingly, operation control has to be carried out carefully in the probing, which may cause the decrease of the throughput of the inspection.

Furthermore, since variation in the shape or the like of the bumps is expected to be generated, a further larger contact load is required as a whole in order to achieve complete contact of the protrusions (bumps) whose contact is insufficient, and there is a problem that the contact pressure becomes partially excessive. Therefore, in addition to the shape of the contact terminals capable of penetrating through the oxide or the like on the surface of the material to be contacted so as to ensure stable contact characteristics, a flexible probe sheet is required in order to reliably achieve the contact with the electrodes to be contacted when the probe sheet is pressed.

In the inspection apparatus which vertically probes the electrodes for inspection of the semiconductor elements by using the pyramidal contact terminals shown in FIG. 54 (see Patent Document 1), the contact resistance value is stable. However, when recent further narrowed pitches and a high-speed electrical signal inspection are required, further improvement in the positional precision of the distal ends of the contact terminals is required. In addition, there is a trend that a material having a low dielectric constant and comparatively weak withstand load is used as a circuit formation material for high-speed transmission as described above, and there is also a trend that active elements and circuits are provided immediately below the electrodes for inspection. Therefore, a probe with a further lower load is required in order to prevent the semiconductor elements from being damaged in the probing.

On the other hand, in the above-described technologies disclosed in Patent Document 3, the contact terminal can be individually operated by employing the cantilever beam structure having the contact terminal formed thereon, and the pressurizing load of the contact terminal can be controlled to some extent if the material and the shape constituting the beam are appropriately selected. However, in the formation method of the cantilever beam structure disclosed in Patent Document 3, as described above, the tip part (contact terminal) is formed in the silicon substrate serving as the mold of the distal end of the contact terminal, the beam part (beam) and the post part connected to the tip part are further formed, the post part is connected to the electrode of the ceramic multi-layer wiring board by solder, and finally, the tip part and the silicon substrate are exfoliated by an etching solution. Therefore, the area for the solder connection part has to be ensured, and a permeation space of an etching solution has to be ensured between the silicon substrate and the ceramic multi-layer wiring board. Thus, there remain problems that reduction of the pitches of the tip parts is limited, the positional accuracy of the tip part becomes unstable in the solder connection and exfoliation process, and formation process and assembling process become complicated.

An embodiment of the present invention provides a probe card for a semiconductor device inspection having contact terminals capable of carrying out a probing inspection without damaging electrode pads to be inspected with low loads and capable of achieving contact at many points and a high density (narrow pitch) with small probing marks, wherein the probe card has good transmission characteristics and stable contact characteristics.

Also, another embodiment of the present invention provides a probe card capable of maintaining high accuracy of the distal end positional accuracy of the contact terminals in a probing inspection.

Further, another embodiment of the present invention provides a probe card for a semiconductor device inspection using a probe sheet in which cantilever beam structures having the contact terminals in a pyramidal or truncated pyramidal shape formed at distal ends, lead-out wirings and a fixing substrate are formed at a time, assembly and connection processes are easy, and the contact resistance values are stable even with low loads.

The typical ones of the inventions disclosed in this application will be briefly described as follows.

(1) A probe card according to the present invention comprises: a probe sheet including a plurality of contact terminals to be in contact with electrodes provided on an object to be inspected, wirings electrically led out from the plurality of contact terminals, and a plurality of peripheral electrodes electrically connected to the wirings and connected to electrodes of a multi-layer wiring board, wherein a fixing substrate is fixed to a region having the plurality of contact terminals formed therein at a second surface of the probe sheet on a side reverse to a first surface of the probe sheet on which the plurality of contact terminals are formed, means for allowing the fixing substrate to be inclinable is provided, each of the plurality of contact terminals is formed at one end of a beam which extends so as to be spaced away from the probe sheet and is electrically connected to the wiring, and the other end of the beam is fixed to the probe sheet.

(2) A probe card according to the present invention comprises: a probe sheet including a plurality of contact terminals to be in contact with electrodes provided on an object to be inspected, wirings electrically led out from the plurality of contact terminals, a plurality of peripheral electrodes electrically connected to the wirings and connected to electrodes of a multi-layer wiring board, and a metal sheet formed to a region having the plurality of contact terminals formed therein at a second surface on a side reverse to a first surface on which the plurality of contact terminals are formed, wherein the a fixing substrate is fixed to the metal sheet, means for allowing the fixing substrate to be inclinable is provided, each of the plurality of contact terminals is formed at one end of a beam which extends so as to be spaced away from the probe sheet and is electrically connected to the wiring, and the other end of the beam is fixed to the probe sheet.

(3) In the probe card according to the present invention described in (1) or (2), the multi-layer wiring board is electrically connected to a tester which inspects electrical characteristics of the object to be inspected.

(4) In the probe card according to the present invention described in any one of (1) to (3), the means for allowing the fixing substrate to be inclinable is a plurality of guide pins having a spring characteristic.

(5) In the probe card according to the present invention described in (4), the means for allowing the fixing substrate to be inclinable further use a plurality of guide pins not having the spring characteristic.

(6) In the probe card according to the present invention described in any one of (1) to (5), the means for allowing the fixing substrate to be inclinable is one or more plate springs.

(7) A probe card according to the present invention comprises: a probe sheet including a plurality of contact terminals to be in contact with electrodes provided on an object to be inspected, wirings electrically led out from the plurality of contact terminals, and a plurality of peripheral electrodes electrically connected to the wirings and connected to electrodes of a multi-layer wiring board, wherein a fixing substrate is fixed to a region having the plurality of contact terminals formed therein at a second surface of the probe sheet on a side reverse to a first surface of the probe sheet on which the plurality of contact terminals are formed, one or more blocks formed by fixing the probe sheet to the fixing substrate so that the probe sheet wraps the fixing substrate are further provided, the plurality of peripheral electrodes of the probe sheet of each of the one or more blocks and the electrodes of the multi-layer wiring board are in contact with each other, each of the plurality of contact terminals is formed at one end of a beam which extends so as to be spaced away from the probe sheet and is electrically connected to the wiring, and the other end of the beam is fixed to the probe sheet.

(8) In the probe card according to the present invention described in any one of (1) to (7), the contact terminal has a pyramidal or truncated pyramidal shape.

(9) In the probe card according to the present invention described in (8), the contact terminals are formed by plating in which holes which are formed by performing anisotropic etching to a substrate having crystallinity are used as molds.

(10) In the probe card according to the present invention described in (9), the substrate having crystallinity is made of silicon.

(11) A probe card according to the present invention comprises: a probe sheet including a plurality of contact terminals to be in contact with electrodes provided on an object to be inspected, wirings electrically led out from the plurality of contact terminals, and a plurality of first and second peripheral electrodes electrically connected to the wirings and connected to electrodes of a multi-layer wiring board, wherein a fixing substrate is fixed to a region having the plurality of contact terminals formed therein at a second surface of the probe sheet on a side reverse to a first surface of the probe sheet on which the plurality of contact terminals are formed, means for allowing the fixing substrate to be inclinable is provided, each of the plurality of contact terminals is formed at one end of a beam which extends so as to be spaced away from the probe sheet and is electrically connected to the wiring, the other end of the beam is fixed to the probe sheet, each of the plurality of first peripheral electrodes is formed on the first surface of the probe sheet on a same side as the contact terminals, and each of the plurality of second peripheral electrodes is formed on the second surface of the probe sheet on a side reverse to the contact terminals.

(12) In the probe card according to the present invention described in (11), formation pitches of the first and second peripheral electrodes in the probe sheet are wider than a formation pitch of the plurality of contact terminals.

(13) A manufacturing method of a probe card according to the present invention is a manufacturing method of a probe card having a probe sheet including a plurality of contact terminals to be in contact with electrodes provided on an object to be inspected, wirings electrically led out from the plurality of contact terminals, and a plurality of peripheral electrodes electrically connected to the wirings and connected to electrodes of a multi-layer wiring board, in which a fixing substrate is fixed to a region having the plurality of contact terminals formed therein at a second surface of the probe sheet on a side reverse to a first surface of the probe sheet on which the plurality of contact terminals are formed, means for allowing the fixing substrate to be inclinable is provided, each of the plurality of contact terminals is formed at one end of a beam which extends so as to be spaced away from the probe sheet and is electrically connected to the wiring, and the other end of the beam is fixed to the probe sheet, wherein a process of forming the probe sheet comprises: (a) a step of forming the plurality of contact terminals by plating in which holes which are formed by performing anisotropic etching to a substrate having crystallinity are used as molds; (b) a step of sequentially stacking the beams and the wirings electrically connected to the plurality of contact terminals and insulating layers on the substrate; and (c) a step of allowing the beams to be spaced away from the probe sheet by removing the insulating layers in same wiring layers as the plurality of contact terminals and the beams.

(14) A semiconductor inspection apparatus according to the present invention comprises: a sample stage on which an object to be inspected is placed; and a probe card which includes a plurality of contact terminals to be in contact with electrodes provided on the object to be inspected and is electrically connected to a tester which inspects electrical characteristics of the object to be inspected, wherein the probe card has a probe sheet including the plurality of contact terminals, wirings electrically led out from the plurality of contact terminals, and a plurality of peripheral electrodes electrically connected to the wirings and connected to electrodes of a multi-layer wiring board, a fixing substrate is fixed to a region having the plurality of contact terminals formed therein at a second surface of the probe sheet on a side reverse to a first surface of the probe sheet on which the plurality of contact terminals are formed, means for allowing the fixing substrate to be inclinable is provided, each of the plurality of contact terminals is formed at one end of a beam which extends so as to be spaced away from the probe sheet and is electrically connected to the wiring, and the other end of the beam is fixed to the probe sheet.

(15) A semiconductor inspection apparatus according to the present invention comprises: a sample stage on which an object to be inspected is placed; and a probe card which includes a plurality of contact terminals to be in contact with electrodes provided on the object to be inspected and is electrically connected to a tester which inspects electrical characteristics of the object to be inspected, wherein the probe card has a probe sheet including the plurality of contact terminals, wirings electrically led out from the plurality of contact terminals, a plurality of peripheral electrodes electrically connected to the wirings and connected to electrodes of a multi-layer wiring board, and a metal sheet formed to a region having the plurality of contact terminals formed therein at a second surface on a side reverse to a first surface on which the plurality of contact terminals are formed, a fixing substrate is fixed to the metal sheet, means for allowing the fixing substrate to be inclinable is provided, each of the plurality of contact terminals is formed at one end of a beam which extends so as to be spaced away from the probe sheet and is electrically connected to the wiring, and the other end of the beam is fixed to the probe sheet.

(16) A semiconductor inspection apparatus according to the present invention comprises: a sample stage on which an object to be inspected is placed; and a probe card which includes a plurality of contact terminals to be in contact with electrodes provided on the object to be inspected and is electrically connected to a tester which inspects electrical characteristics of the object to be inspected, wherein the probe card has a probe sheet including the plurality of contact terminals, wirings electrically led out from the plurality of contact terminals, and a plurality of peripheral electrodes electrically connected to the wirings and connected to electrodes of a multi-layer wiring board, a fixing substrate is fixed to a region having the plurality of contact terminals formed therein at a second surface of the probe sheet on a side reverse to a first surface of the probe sheet on which the plurality of contact terminals are formed, one or more blocks formed by fixing the probe sheet to the fixing substrate so that the probe sheet wraps the fixing substrate are further provided, the plurality of peripheral electrodes of the probe sheet of each of the one or more blocks and the electrodes of the multi-layer wiring board are in contact with each other, each of the plurality of contact terminals is formed at one end of a beam which extends so as to be spaced away from the probe sheet and is electrically connected to the wiring, and the other end of the beam is fixed to the probe sheet.

(17) A semiconductor inspection apparatus according to the present invention comprises: a sample stage on which an object to be inspected is placed; and a probe card which includes a plurality of contact terminals to be in contact with electrodes provided on the object to be inspected and is electrically connected to a tester which inspects electrical characteristics of the object to be inspected, wherein the probe card has a probe sheet including the plurality of contact terminals, wirings electrically led out from the plurality of contact terminals, and a plurality of first and second peripheral electrodes electrically connected to the wirings and connected to electrodes of a multi-layer wiring board, a fixing substrate is fixed to a region having the plurality of contact terminals formed therein at a second surface of the probe sheet on a side reverse to a first surface of the probe sheet on which the plurality of contact terminals are formed, means for allowing the fixing substrate to be inclinable is provided, each of the plurality of contact terminals is formed at one end of a beam which extends so as to be spaced away from the probe sheet and is electrically connected to the wiring, the other end of the beam is fixed to the probe sheet, each of the plurality of first peripheral electrodes is formed on the first surface of the probe sheet on a same side as the contact terminals, and each of the plurality of second peripheral electrodes is formed on the second surface of the probe sheet on a side reverse to the contact terminals.

(18) In the semiconductor inspection apparatus according to the present invention described in any one of (14) to (17), the probe sheet is formed by a process comprising: (a) a step of forming the plurality of contact terminals by plating in which holes which are formed by performing anisotropic etching to a substrate having crystallinity are used as molds; (b) a step of sequentially stacking the beams and the wirings electrically connected to the plurality of contact terminals and insulating layers on the substrate; and (c) a step of allowing the beams to be spaced away from the probe sheet by removing the insulating layers in same wiring layers as the plurality of contact terminals and the beams.

(19) A manufacturing method of a semiconductor device according to the present invention comprises the steps of: fabricating circuits and electrodes electrically connected to the circuits on a semiconductor wafer so as to form a plurality of semiconductor elements; inspecting electrical characteristics of the plurality of semiconductor elements by using a probe card having a plurality of contact terminals to be in contact with the electrodes provided on the plurality of semiconductor elements and electrically connected to a tester which inspects electrical characteristics of the circuits formed in the plurality of semiconductor elements; and dicing the semiconductor wafer so as to divide the wafer into the plurality of semiconductor elements, wherein the probe card comprises: a probe sheet including the plurality of contact terminals, wirings electrically led out from the plurality of contact terminals, and a plurality of peripheral electrodes electrically connected to the wirings and connected to electrodes of a multi-layer wiring board, a fixing substrate is fixed to a region having the plurality of contact terminals formed therein at a second surface of the probe sheet on a side reverse to a first surface of the probe sheet on which the plurality of contact terminals are formed, means for allowing the fixing substrate to be inclinable is provided, each of the plurality of contact terminals is formed at one end of a beam which extends so as to be spaced away from the probe sheet and is electrically connected to the wiring, and the other end of the beam is fixed to the probe sheet.

(20) A manufacturing method of a semiconductor device according to the present invention comprises the steps of: fabricating circuits and electrodes electrically connected to the circuits on a semiconductor wafer so as to form a plurality of semiconductor elements; inspecting electrical characteristics of the plurality of semiconductor elements by using a probe card having a plurality of contact terminals to be in contact with the electrodes provided on the plurality of semiconductor elements and electrically connected to a tester which inspects electrical characteristics of the circuits formed in the plurality of semiconductor elements; and dicing the semiconductor wafer so as to divide the wafer into the plurality of semiconductor elements, wherein the probe card comprises: a probe sheet including the plurality of contact terminals, wirings electrically led out from the plurality of contact terminals, a plurality of peripheral electrodes electrically connected to the wirings and connected to electrodes of a multi-layer wiring board, and a metal sheet formed to a region having the plurality of contact terminals formed therein at a second surface on a side reverse to a first surface on which the plurality of contact terminals are formed, a fixing substrate is fixed to the metal sheet, means for allowing the fixing substrate to be inclinable is provided, each of the plurality of contact terminals is formed at one end of a beam which extends so as to be spaced away from the probe sheet and is electrically connected to the wiring, and the other end of the beam is fixed to the probe sheet.

(21) A manufacturing method of a semiconductor device according to the present invention comprises the steps of: fabricating circuits and electrodes electrically connected to the circuits on a semiconductor wafer so as to form a plurality of semiconductor elements; inspecting electrical characteristics of the plurality of semiconductor elements by using a probe card having a plurality of contact terminals to be in contact with the electrodes provided on the plurality of semiconductor elements and electrically connected to a tester which inspects electrical characteristics of the circuits formed in the plurality of semiconductor elements; and dicing the semiconductor wafer so as to divide the wafer into the plurality of semiconductor elements, wherein the probe card comprises: a probe sheet including the plurality of contact terminals, wirings electrically led out from the plurality of contact terminals, and a plurality of peripheral electrodes electrically connected to the wirings and connected to electrodes of a multi-layer wiring board, a fixing substrate is fixed to a region having the plurality of contact terminals formed therein at a second surface of the probe sheet on a side reverse to a first surface of the probe sheet on which the plurality of contact terminals are formed, one or more blocks formed by fixing the probe sheet to the fixing substrate so that the probe sheet wraps the fixing substrate are further provided, the plurality of peripheral electrodes of the probe sheet of each of the one or more blocks and the electrodes of the multi-layer wiring board are in contact with each other, each of the plurality of contact terminals is formed at one end of a beam which extends so as to be spaced away from the probe sheet and is electrically connected to the wiring, and the other end of the beam is fixed to the probe sheet.

(22) A manufacturing method of a semiconductor device according to the present invention comprises the steps of: fabricating circuits and electrodes electrically connected to the circuits on a semiconductor wafer so as to form a plurality of semiconductor elements; inspecting electrical characteristics of the plurality of semiconductor elements by using a probe card having a plurality of contact terminals to be in contact with the electrodes provided on the plurality of semiconductor elements and electrically connected to a tester which inspects electrical characteristics of the circuits formed in the plurality of semiconductor elements; and dicing the semiconductor wafer so as to divide the wafer into the plurality of semiconductor elements, wherein the probe card comprises: a probe sheet including the plurality of contact terminals, wirings electrically led out from the plurality of contact terminals, and a plurality of first and second peripheral electrodes electrically connected to the wirings and connected to electrodes of a multi-layer wiring board, a fixing substrate is fixed to a region having the plurality of contact terminals formed therein at a second surface of the probe sheet on a side reverse to a first surface of the probe sheet on which the plurality of contact terminals are formed, means for allowing the fixing substrate to be inclinable is provided, each of the plurality of contact terminals is formed at one end of a beam which extends so as to be spaced away from the probe sheet and is electrically connected to the wiring, the other end of the beam is fixed to the probe sheet, each of the plurality of first peripheral electrodes is formed on the first surface of the probe sheet on a same side as the contact terminals, and each of the plurality of second peripheral electrodes is formed on the second surface of the probe sheet on a side reverse to the contact terminals.

(23) In the manufacturing method of a semiconductor device according to the present invention described in any one of (19) to (22), the probe sheet is formed by a process comprising: (a) a step of forming the plurality of contact terminals by plating in which holes which are formed by performing anisotropic etching to a substrate having crystallinity are used as molds; (b) a step of sequentially stacking the beams and the wirings electrically connected to the plurality of contact terminals and insulating layers on the substrate; and (c) a step of allowing the beams to be spaced away from the probe sheet by removing the insulating layers in same wiring layers as the plurality of contact terminals and the beams, and each of the plurality of contact terminals has a pyramidal or truncated pyramidal shape.

These and other objects, features and advantages of the invention will be apparent from the following more particular description of preferred embodiments of the invention, as illustrated in the accompanying drawings.

BRIEF DESCRIPTIONS OF THE DRAWINGS

FIG. 52 is a cross sectional view showing the principal part of a conventional semiconductor element inspection apparatus using bumps formed by plating;

FIG. 53 is a perspective view showing a bump portion formed by plating in FIG. 52;

Figure 55:
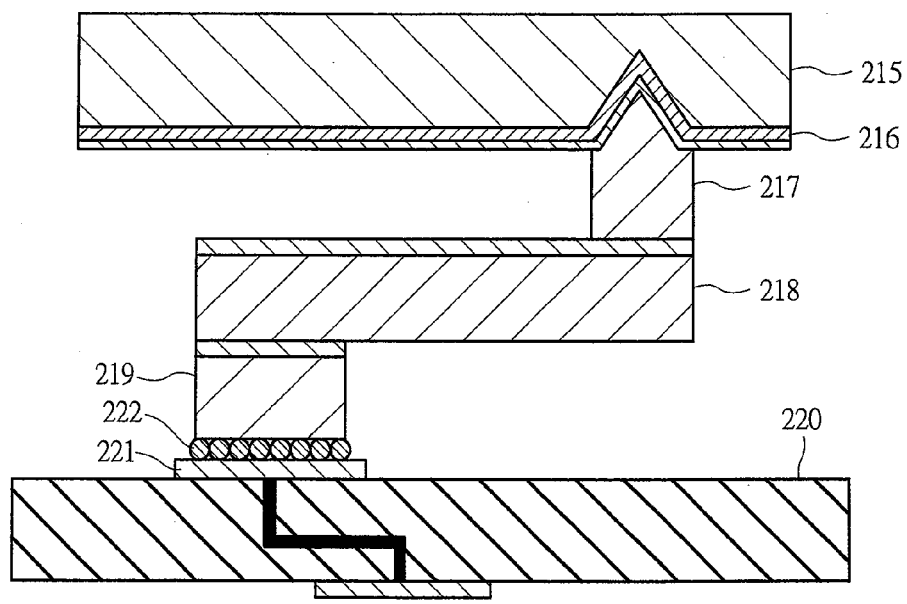

FIG. 55 is a cross sectional view schematically showing an intermediate stage of a manufacturing process of a spring contact element formed by lithography techniques; and FIG. 56 is a cross sectional view showing the principal part for explaining the structure in which active circuit elements and fine wirings are formed in multi-layers immediately below the electrode part for inspection of a semiconductor element.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "comprise A" in the embodiments below, elements other than A are not excluded except the case where it is particularly specified that A is the only element.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Further, when referring to the material or the like, the specified material is a main material thereof unless otherwise stated or except the case where it is not so in principle and in situation, and other subsidiary element, additives, additional elements and others are not excluded. For example, a silicon member contains not only pure silicon but also additive impurities and binary and ternary alloys mainly made of silicon (for example, SiGe) unless otherwise stated.

Also, components having the same function are denoted by the same reference numbers throughout the drawings for describing the embodiments, and the repetitive description thereof will be omitted.

Further, in the drawings used in the embodiments, hatching is used in some cases even in a plan view so as to make the drawings easy to see.

In the following embodiments and examples, main terms are defined as below.

A semiconductor device may be, regardless of the form thereof, that in a wafer state having circuits formed thereon, a semiconductor element, or that packaged thereafter (for example, QFP (Quad Flat Package), BGA (Ball Grid Array), and CSP (Chip Size Package)).

A probe sheet is a thin film in which contact terminals to be brought into contact with an object to be inspected and wirings led therefrom are provided and electrodes for external connection are formed on the wirings, and the thickness of the probe sheet is in a range of about 10 μm to 100 μm.

A probe card is a structure having the terminals to be brought into contact with an object to be inspected, a multi-layer wiring board and the like (for example, the structure described with reference to FIG. 2 in the following embodiment).

A semiconductor inspection apparatus is an inspection apparatus having a sample supporting system on which the probe card and an object to be inspected are placed.

Figure 1:
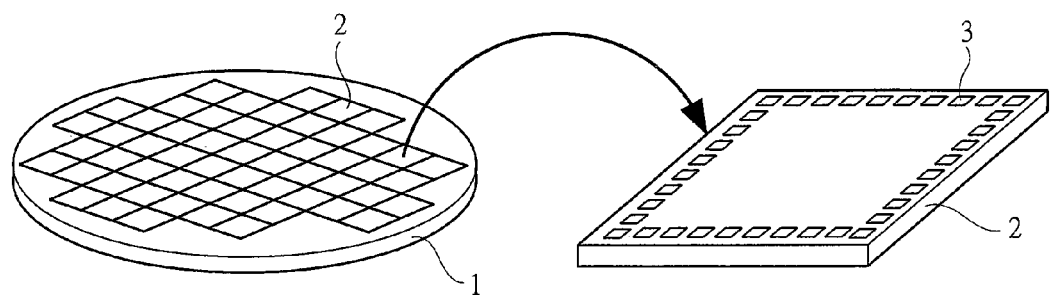
FIG. 1 is a perspective view showing a wafer which is an object to be contacted on which semiconductor elements (chips) are arranged and the semiconductor element (chip) which is a part thereof.

A large number of semiconductor elements (chip) 2 for LSIs which are an example of the object to be inspected are formed on a wafer 1 as shown in FIG. 1, and are then separated for use. FIG. 1 is a perspective view showing the wafer 1 on which many semiconductor elements 2 for LSIs are arranged, and one of the semiconductor elements 2 which is a part thereof is shown in an enlarged manner. On the surface of the semiconductor element 2, many electrodes 3 to be electrically connected to the circuit formed in the semiconductor element 2 are arranged along the periphery thereof.

Meanwhile, in the semiconductor element, the density of the disposition of the above-described electrodes 3 has been further growing and the pitches thereof have been further narrowing along with the advance of the high integration. The pitches of the disposition of the electrodes 3 reach about 0.1 mm or less, for example, 0.08 mm, 0.04 mm or less. As the trend of the density growth of the electrodes 3, the number of rows of the electrodes along the periphery of the semiconductor element 2 is increased from one to two, and further the electrodes are disposed on the entire surface.

Also, there is a trend that a high-temperature operation test (85° C. to 150° C.) for more clearly checking the characteristics and reliability of the semiconductor element is carried out by performing an operation test to the semiconductor element at a high temperature. Further, there is a trend that a low-temperature operation test (−55° C.) is also carried out along with expansion of the use environment.

The semiconductor inspection apparatus according to the following embodiments is capable of adapting to the grown density and narrowed pitches of the above-described electrodes 3 and enables inspection by high-speed electrical signals (100 MHz to 20 GHz).

Further, since a material having thermal resistance of 150° C. and a linear expansion coefficient similar to that of the object to be inspected is used as a constituent material of a part of the probe card in the semiconductor inspection apparatus, the positional misalignment of the distal ends of probes due to the ambient temperature can be prevented.

Hereinafter, probe cards for semiconductor device inspection according to the embodiments of the present invention will be described with reference to FIG. 2 to FIG. 15.

First Embodiment

Figure 2:
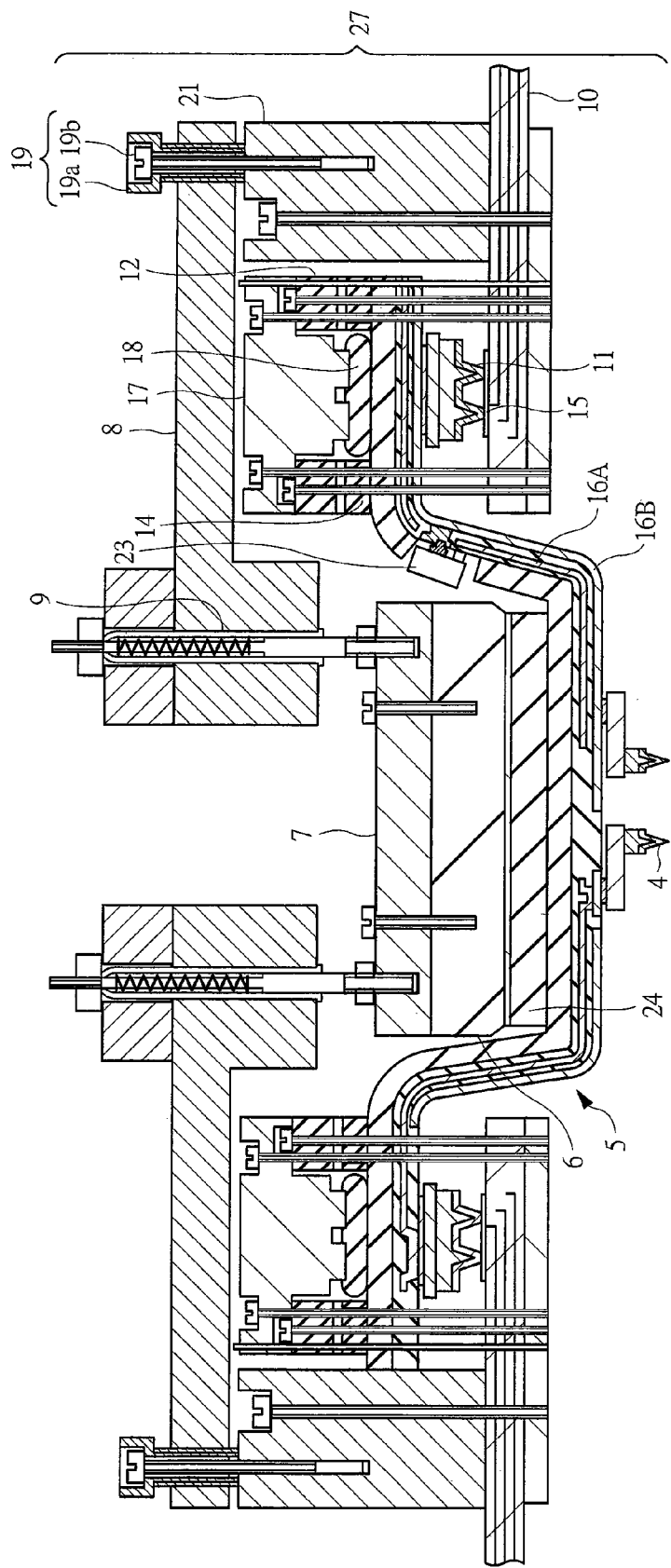
FIG. 2 is a cross sectional view showing the principal part of a probe card according to a first embodiment of the present invention.
Figure 3:
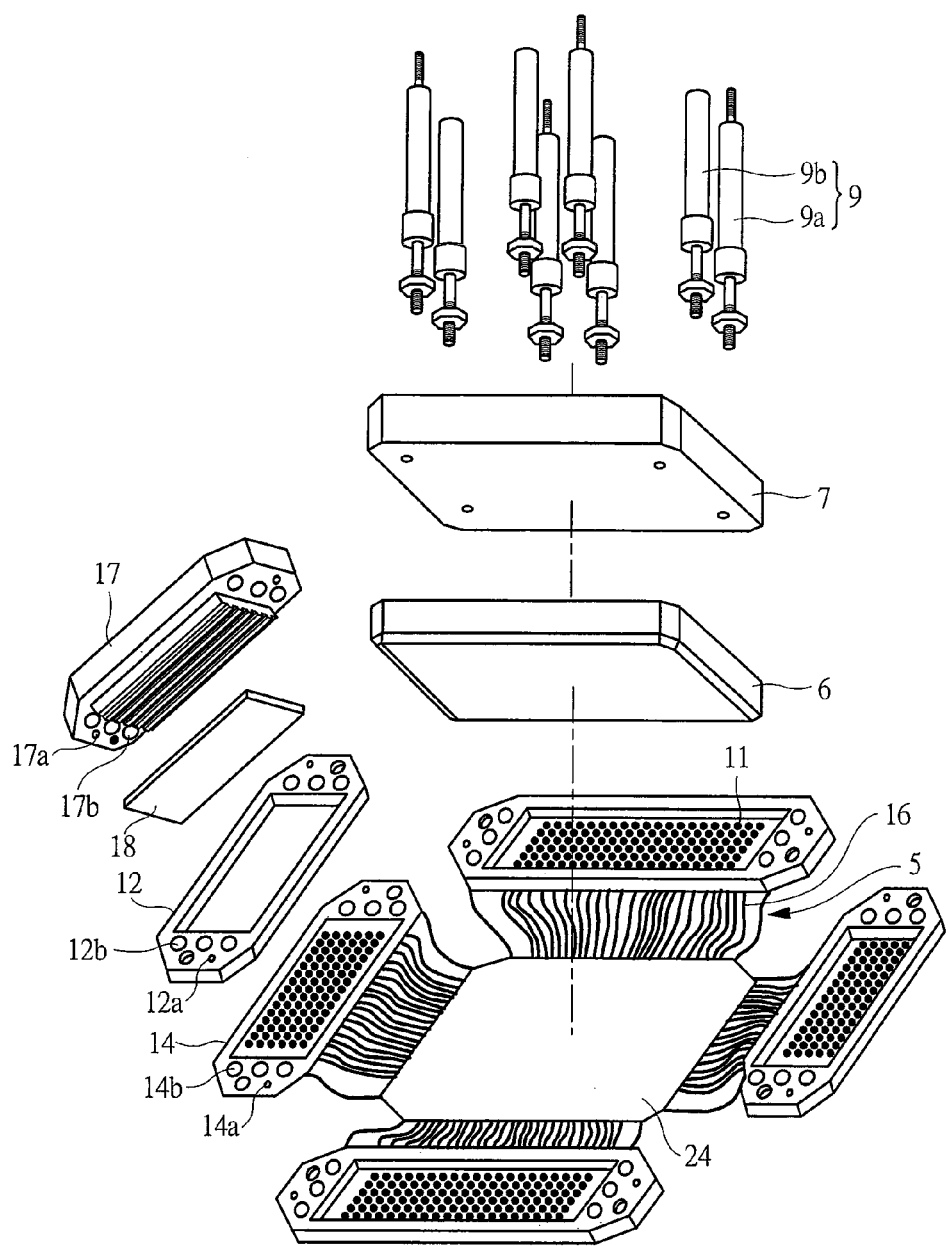
FIG. 3 is a perspective view showing main parts of the probe card shown in FIG. 2 in an exploded manner.
Figure 4:
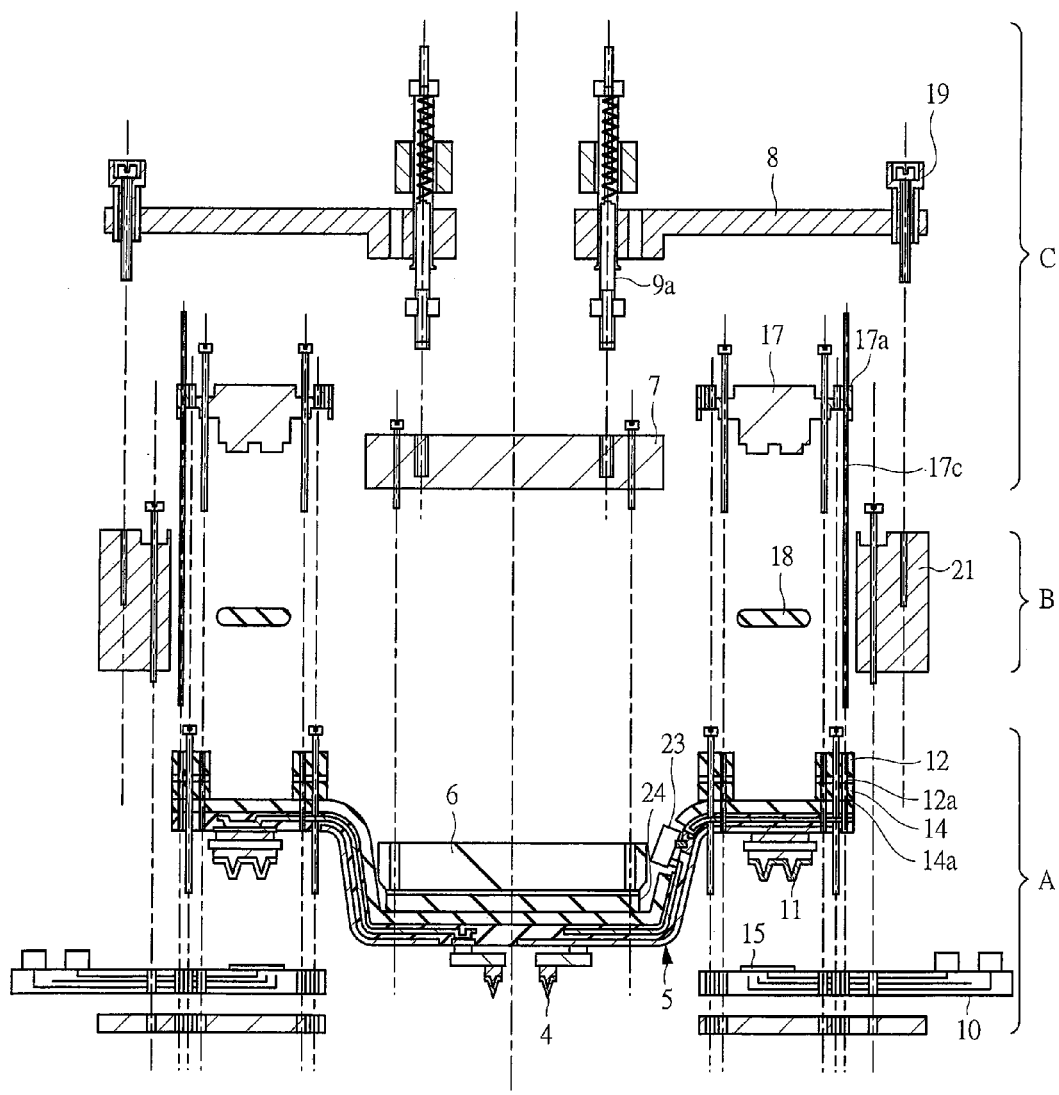
FIG. 4 is an assembly cross sectional view showing the main parts of the probe card shown in FIG. 2 in an exploded manner.

FIG. 2 is a cross sectional view showing a principal part of the probe card of a first embodiment, FIG. 3 is a perspective view showing the main parts in FIG. 2 in an exploded manner, and FIG. 4 is an assembly cross sectional view showing the main parts in FIG. 2 in an exploded manner. The probe card of the first embodiment will be described with reference to these drawings.

The probe card of the first embodiment comprises a probe sheet 5 on which a group of contact terminals 4 is formed, a fixing substrate 6, an intermediate plate 7, guide pins 9 inserted into a supporting member (upper fixing plate) 8 and fixed to the intermediate plate 7 by screwing and the like.

On the probe sheet 5, the above-described group of the contact terminals 4 for achieving contact with the group of the electrodes 3 of the semiconductor element 2 is formed on a center region part on the probing side (principal surface (first surface)) of the sheet. In addition, in the peripheries of four sides of the probe sheet 5, groups of peripheral electrodes 11 for I/O signals to or from multi-layer wiring boards 10 are formed, and metal films 14 are formed in the regions corresponding to peripheral electrode fixing plates 12 so as to surround the groups of the peripheral electrodes 11, respectively. Although details will be described later, the groups of the peripheral electrodes 11 are formed in the same process as the above-described group of the contact terminals 4, and the distal ends of the peripheral electrodes are connected to electrodes 15 of the multi-layer wiring boards 10. In addition, many lead-out wirings 16 shown in FIG. 3 are formed between the group of the contact terminals 4 and the groups of the peripheral electrodes 11. Although the details will be described later, each of the contact terminals forming the group of the contact terminals 4 and the groups of the peripheral electrodes 11 has a pyramidal shape or a truncated pyramidal shape.

Furthermore, the above-described peripheral electrode fixing plate 12 is fixed by bonding to the metal film 14 on the rear surface of the probe sheet 5 at the part where the group of the peripheral electrodes 11 for I/O signal is formed.

Guide pin holes 14a for positioning and screw insertion holes 14b are pattern-formed in the metal film 14 by etching, and guide pin holes 12a and 17a for positioning and screw insertion holes 12b and 17b are formed also in the peripheral electrode fixing plate 12 and a periphery holding plate 17. By this means, it is possible to improve the assembly properties.

The periphery holding plate 17 is screwed to the periphery electrode fixing plate 12, which is fixed to the probe sheet 5 so as to surround the group of the periphery electrodes 11, with interposing a buffer material 18 therebetween, while positioning the periphery holding plate 17 by guide pins 17c using the above-described guide pin holes 17a. By this means, the group of the peripheral electrodes 11 is connected to the electrodes 15 of the multi-layer wiring board 10 via the buffer material 18.

Note that the inclination of the probe sheet 5 in the region in which the group of the contact terminals 4 is formed may be finely adjusted by using double screws 19 for finely adjusting the inclination provided in the supporting member 8 or by using spacers 20 (see FIG. 7) which will be described later. The double screw 19 mentioned here is a screw in which an inner screw 19b is formed at the center of an outer screw 19a and has the structure that adjusts the distance between the supporting member 8 and an upper plate 21 so as to finely adjust their inclinations by an outer screw 19a and then fixes them by screwing by the inner screw 19b.

Further, in order to reduce disturbance of high-speed electrical signals for inspection in accordance with needs, grounding lead-out wirings 16A electrically connected to a reference potential (ground potential) and lead-out wirings 16B for signals and power supply are formed in the probe sheet 5. These lead-out wirings 16A and 16B constitute the above-described lead-out wirings 16. With respect to the lead-out wirings 16A and 16B as mentioned above, impedance matching or a shield structure can be formed by designing and fabricating the disposition state therebetween and the shapes by using photolithography techniques in the manufacturing process of the probe sheet 5.

Also, a chip capacitor 23 is attached to the rear surface of the probe sheet 5. The chip capacitor 23 is electrically connected to a predetermined contact terminal in the group of the contact terminals 4 via the wirings formed in the probe sheet 5. Such a chip capacitor 23 exerts effects when it is disposed near the contact terminals 4 so as to prevent disturbance of signals as much as possible.

The fixing substrate 6 is bonded and fixed to the rear surface (second surface) of the probe sheet 5 via a metal film 24 so as to be planarly overlapped on the region of the probe sheet 5, in which the group of the contact terminals 4 is formed. Although the details will be described later, the metal film 24 is made of the same material as the above-described metal film 14 and is formed and patterned in the same step. Furthermore, the intermediate plate 7 is fixed to the fixing substrate 6 by screwing.

Figure 5:
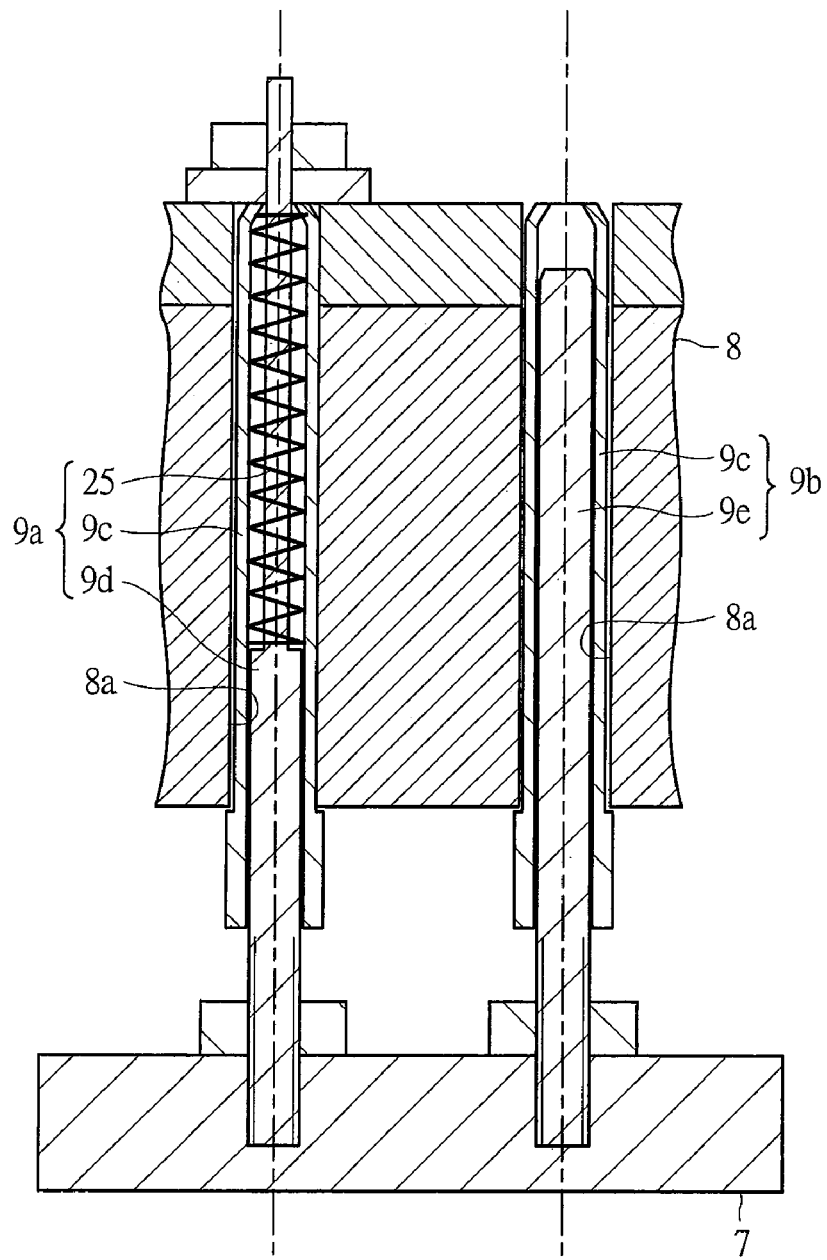
FIG. 5 is a cross sectional view showing the principal part of guide pins which are the main parts of the probe card shown in FIG. 2.

The guide pins 9 are inserted into the supporting member (upper fixing plate) 8 and screwed to the above-described intermediate plate 7. Also, the guide pins 9 have a function as a leveling mechanism for preventing positional misalignment of the distal ends of the contact terminals in the probing inspection as much as possible and for aligning the region in which the group of the contact terminals 4 is formed with the plane of the group of the electrodes 3 to be inspected. In other words, in order to realize an approximately constant pressing force (for example, in the case of about 500 pins, about 5 to 10 N with a pressing distance of about 100 µm) that is at the same level as or smaller than the pressing force of the contact terminals 4 caused by the flexure of the cantilever beam structures described later in the state in which the region in which the group of the contact terminals 4 is formed can be operated in a slightly inclined state (slightly inclined operation), spring-incorporated guide pins 9a, each of which incorporates a spring 25, and guide pins 9b dedicated to positioning as shown in FIG. 5 are used in the guide pins 9. The plurality of spring-incorporated guide pins (plural means for applying pressing force to a frame) 9a and the plurality of guide pins 9b dedicated to positioning are inserted into the supporting member 8 and fixed to the intermediate plate 7 by screwing. Also, the spring-incorporated guide pin 9a has the structure in which the above-described spring 25 and a center shaft 9d are incorporated in a metal tube 9c, and the center shaft 9d presses the intermediate plate 7 by the elastic force of the spring 25. The guide pin 9b dedicated to positioning has the structure in which a center shaft 9e is incorporated in a metal tube 9c, and positioning is performed when the center shaft 9e is fixed to the intermediate plate 7. At least three guide pins 9 are disposed, and four or more guide pins 9 are preferably disposed. Further, each of insertion holes 8a into which the guide pin 9 is inserted in the supporting member 8 preferably does not have a gap (allowance) between the hole and the guide pin 9 after insertion as much as possible in order to prevent positional misalignment of the contact terminal distal end, and the first embodiment shows an example in which the diameter of the insertion hole 8a is larger than the diameter of the guide pin 9 only by about 10 µm to 20 µm.

A probe card 27 of the first embodiment is formed by the above-described various members.

According to the above-described first embodiment, the probe sheet 5 is configured to apply pressing force at the same time when the probe sheet 5 is positioned by the plurality of the guide pins 9 (the spring-incorporated guide pins 9a having spring characteristics and the guide pins 9b dedicated to positioning). As a result, the probe card for an inspection of narrow-pitch many-pin semiconductor in which the pressing load is controlled in a wide range can be realized. When the semiconductor elements 2 are further highly integrated, the electrodes 3 having many pins in a high density and narrow pitches are formed on the surface of the semiconductor element 2. Therefore, many active elements or fine wirings are formed immediately below the electrodes 3 in many cases, and when the contact pressure of the group of the contact terminals 4 to the group of the electrodes 3 in the inspection of the semiconductor element 2 is excessively large, the electrodes 3 and the active elements or wirings immediately below them may be damaged. However, in the probe card for the semiconductor inspection in the first embodiment, the pressing load can be controlled in a wide range, and therefore, such damage on the active-elements and wirings can be prevented.

Figure 6:
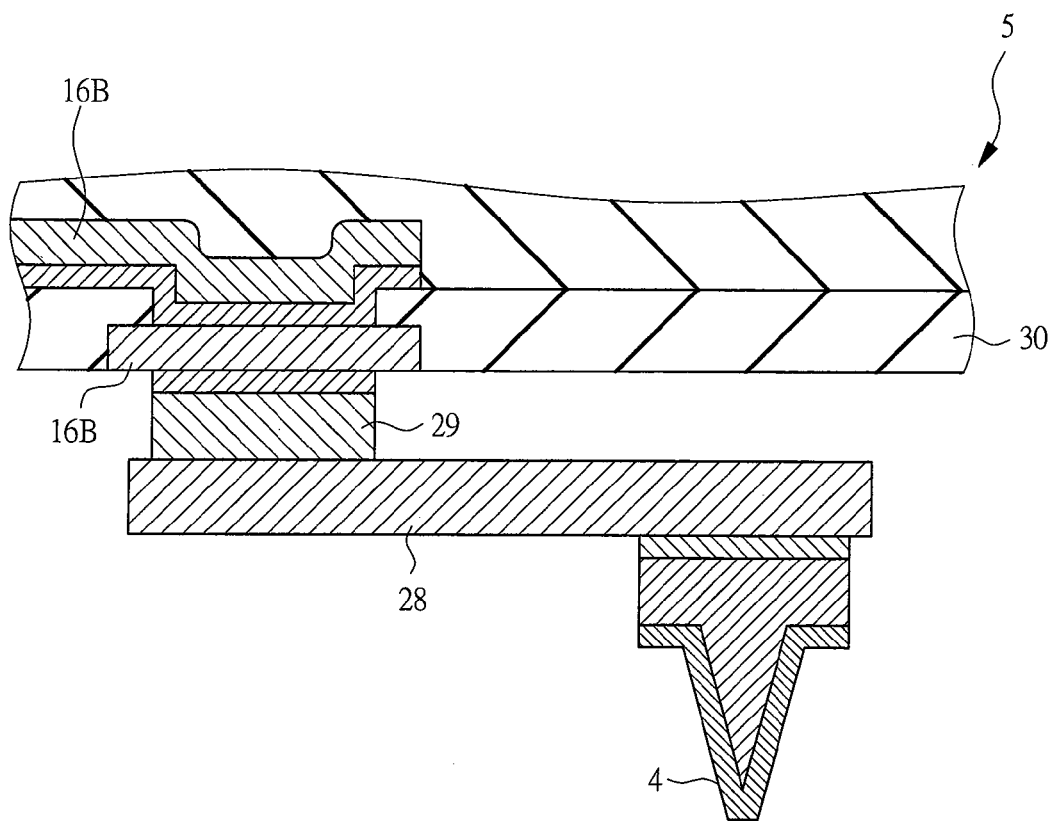
FIG. 6 is a cross sectional view showing the principal part in an enlarged manner in the vicinity of the group of the contact terminals of the probe card according to the first embodiment of the present invention.

FIG. 6 is a cross sectional view showing the principal part of the vicinity of one contact terminal 4 of the probe sheet 5 in an enlarged manner. The contact terminal 4 in the first embodiment is connected to the vicinity of the distal end of a metal beam 28 which is patterned by using photolithography techniques, and in the vicinity of the other end of the beam 28, a metal post 29 is connected to the surface of the beam which is reverse to the surface to which the contact terminal 4 is connected. The post 29 is connected to the lead-out wiring 16B which is formed so as to be embedded in a polyimide film 30, and the beam 28 is in a state of being spaced away from the polyimide film 30. In other words, the beam 28 is supported on the probe sheet 5 only by the connection with the post 29 (hereinafter, referred to as a cantilever beam structure). The contact terminal 4 disposed in the vicinity of the distal end of the beam 28 can be individually operated by the flexibility of the beam 28. Accordingly, a further large contact load for allowing the contact terminal 4 and the electrode 3 having insufficient contact to be in complete contact with each other becomes unnecessary.

Meanwhile, it can be expected that the plane of the group of the electrodes 3 on the surface of the semiconductor element 2 and the plane of the group of the contact terminals 4 of the probe sheet 5 may be inclined with respect to each other. In the first embodiment, the intermediate plate 7, the fixing substrate 6, the metal film 24, and the probe sheet 5 enable the pressing operation under the conditions that the region in which the group of the semiconductor terminals 4 is formed can be operated to incline slightly, and the further larger contact load for allowing the contact terminals 4 and the electrodes 3 having insufficient contact to be in complete contact with each other is unnecessary. Furthermore, as described above, the need of the further contact load for allowing the contact terminals 4 and the electrodes 3 having insufficient contact to be in complete contact with each other is eliminated also by individually operating the contact terminals 4 by the flexibility of the beams 28. Therefore, the group of the contact terminals 4 and the group of the electrodes 3 which are the objects to be contacted can be reliably brought into contact with each other while preventing the contact pressure of the group of the contact terminals 4 and the group of the electrode 3 from becoming partially excessive. As a result, roughness of the surfaces of the electrodes 3 due to the probing can be prevented as much as possible, and therefore, stable contact characteristics, that is, stable contact resistance values can be ensured even with a low load.

Second Embodiment

Figure 7:
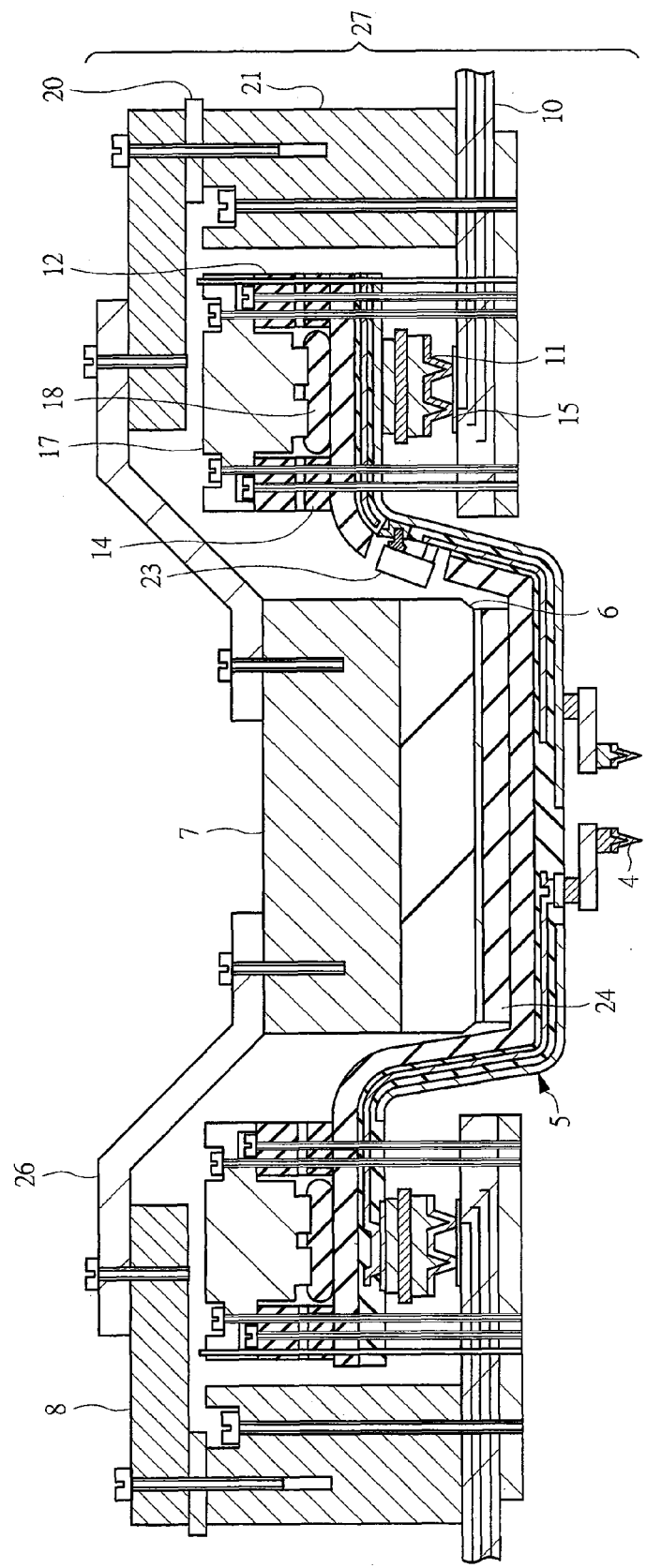
FIG. 7 is a cross sectional view showing the principal part of a probe card according to the second embodiment of the present invention.

FIG. 7 is a cross sectional view showing the principal part of a probe card of a second embodiment.

In the above-described first embodiment, the guide pins 9 (spring-incorporated guide pins 9a and the pins 9b dedicated to positioning) are used as the leveling mechanism of the probe sheet 5. However, as shown in FIG. 7, the slightly inclinable structure may be formed by using one or more plate springs 26 instead of the guide pins 9. Also, spacers 20 may be used instead of the double screws 19 for initial fine adjustment of inclination. The spacers 20 or the double screws 19 described in the above-described first embodiment can be used in accordance with needs, and it goes without saying that they can be omitted.

Further, FIG. 7 and FIG. 2 of the above-described first embodiment show the examples in which the metal films 24 and 14 are disposed on the surface of the probe sheet 5 that is reverse to the surface thereof on which the group of the contact terminals 4 is formed so that they are planarly overlapped with the regions in which the group of the contact terminals 4 and the groups of the peripheral electrodes 11 are formed. However, depending on the required distal end positional precision of the contact terminals 4 and the peripheral electrodes 11, one or both of the metal film 24 and the metal film 14 may be omitted.

The effects similar to those of the above-described first embodiment can be also obtained by the above-described second embodiment.

Third Embodiment

Figure 8:
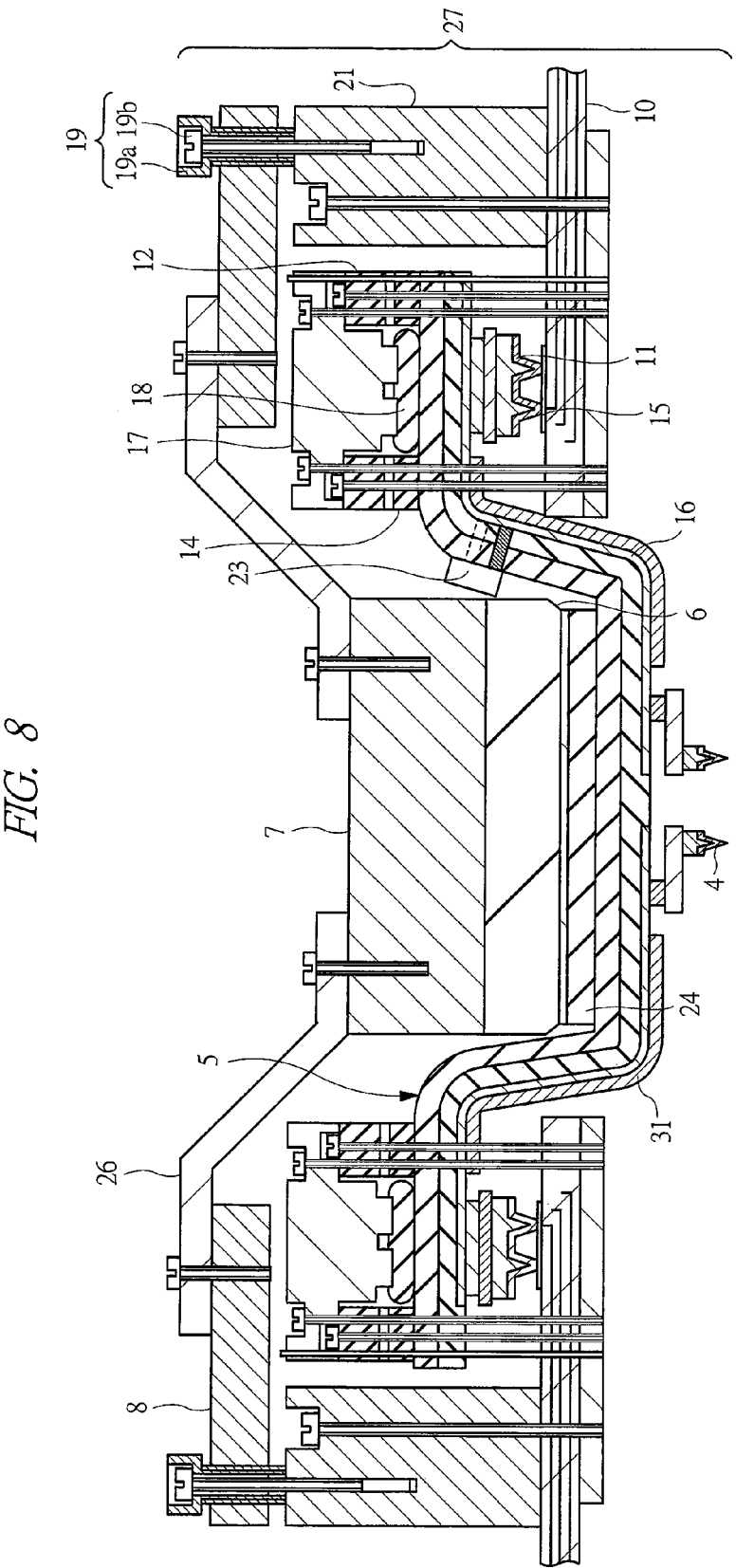
FIG. 8 is a cross sectional view showing the principal part of a probe card according to the third embodiment of the present invention.

FIG. 8 is a cross sectional view showing the principal part of a probe card of a third embodiment.

As shown in FIG. 8, the probe sheet 5 of the third embodiment has the structure in which the lead-out wirings 16 from the contact terminals 4 with the cantilever beam structures are formed by one layer, and the surface on which the contact terminals 4 are formed is protected by a protective film 31 of polyimide.

Also, FIG. 8 shows the example in which the chip capacitor 23 is disposed between the lead-out wiring 16 for power supply and the lead-out wiring 16 for grounding among the lead-out wirings 16 formed by one layer for signals, power supply, and grounding, in order to reduce the disturbance of high-speed electrical signals. However, it can be omitted in accordance with needs.

Further, FIG. 8 shows the example in which the metal films 24 and 14 are disposed on the surface of the probe sheet 5 that is reverse to the surface thereof on which the group of the contact terminals 4 is formed so that the metal films are planarly overlapped with the regions in which the group of the contact terminals 4 and the groups of the peripheral electrodes 11 are formed. However, in accordance with required distal end positional precision of the contact terminals 4 and the peripheral electrodes 11, one of or both of the metal film 24 and the metal film 14 may be omitted.

The effects similar to those of the above-described first and second embodiments can be also obtained by the above-described third embodiment.

Fourth Embodiment

Figure 9:
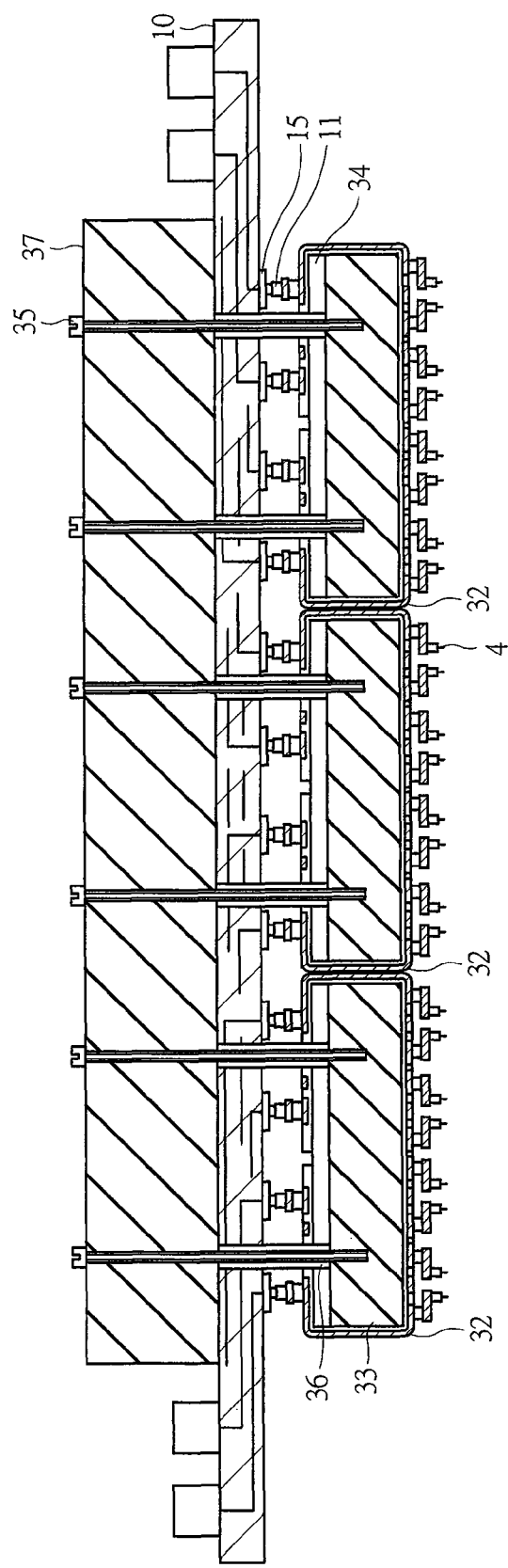
FIG. 9 is a cross sectional view showing the principal part of a probe card according to the fourth embodiment of the present invention.
Figure 10A:
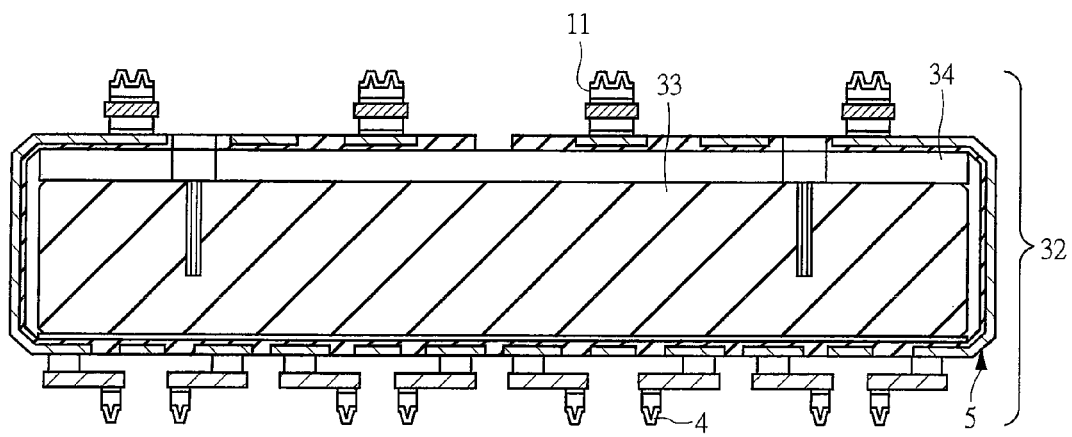
FIG. 10A is a cross sectional view schematically showing one block which is a constituent element of the probe card according to the fourth embodiment of the present invention.

FIG. 9 is a cross sectional view showing the principal part of a probe card of a fourth embodiment. Also, FIG. 10A is a schematic cross sectional view showing one block 32 which is a constituent element of the probe card of the fourth embodiment shown in FIG. 9. The fourth embodiment shows the example in which a required number of blocks 32 are attached to the multi-layer wiring board 10 so as to use them as an integrated probe card.

Figure 10B:
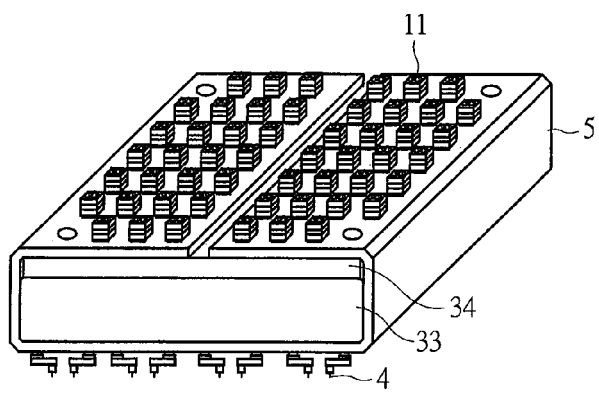
FIG. 10B is a perspective view showing the configuration of the block shown in FIG. 10A.

In the manufacture of the block 32 shown in FIG. 10A, as shown in FIG. 10B, a surface of the probe sheet 5 that is reverse to the surface on which the plurality of contact terminals 4 with the cantilever beam structure are formed is opposed to a fixing substrate 33, and the probe sheet 5 is turned up around the fixing substrate 33 so as to cover the substrate from two opposed sides of the upper surface of the fixing substrate 33, and then fixed with interposing a buffer material 34 therebetween. The groups of the peripheral electrodes 11 on the rear surface of the probe sheet 5 fixed to the fixing substrate 33 and the buffer material 34 in this manner are positioned by positioning pins (not shown) with respect to the group of the electrodes 15 of the multi-layer wiring board 10, and the fixing substrate 33 and an upper holding plate 37 are fixed by screwing by fixing screws 35 via spacers 36 penetrating through the multi-layer wiring board 10. In this manner, the probe card using the plurality of blocks 32 shown in FIG. 9 can be formed.

Figure 10C:
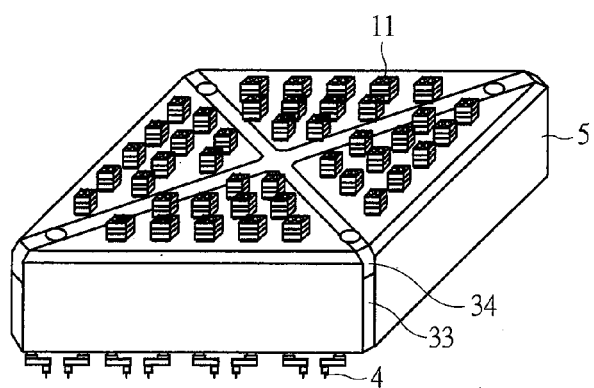
FIG. 10C is a perspective view showing the configuration of the block shown in FIG. 10A.

Alternatively, in the manufacture of the block 32 shown in FIG. 10A, the configuration as shown in FIG. 10C may be employed, in which a surface of the probe sheet 5 that is reverse to the surface on which the plurality of contact terminals 4 with the cantilever beam structure are formed is opposed to the fixing substrate 33, and the probe sheet 5 is turned up around the fixing substrate 33 so as to cover the substrate from the four sides of the upper surface of the fixing substrate 33, and then fixed with interposing the buffer material 34 therebetween. Also in this configuration, the groups of the peripheral electrodes 11 on the rear surface of the probe sheet 5 fixed to the fixing substrate 33 and the buffer material 34 in this manner are positioned by positioning pins (not shown) with respect to the group of the electrodes 15 of the multi-layer wiring board 10, and the fixing substrate 33 and the upper holding plate 37 are fixed by screwing by the fixing screws 35 via the spacers 36 penetrating through the multi-layer wiring board 10. In this manner, the probe card using the plurality of blocks 32 shown in FIG. 9 can be formed.

Note that, in accordance with needs, stable inspections or circuits may be formed by disposing or mounting electronic parts (capacitors, resistors, fuses, connectors, etc.) necessary for the lead-out wirings on the surface of the probe sheet 5 reverse to the surface thereof on which the group of the contact terminals 4 is formed.

Fifth Embodiment

Figure 11A:
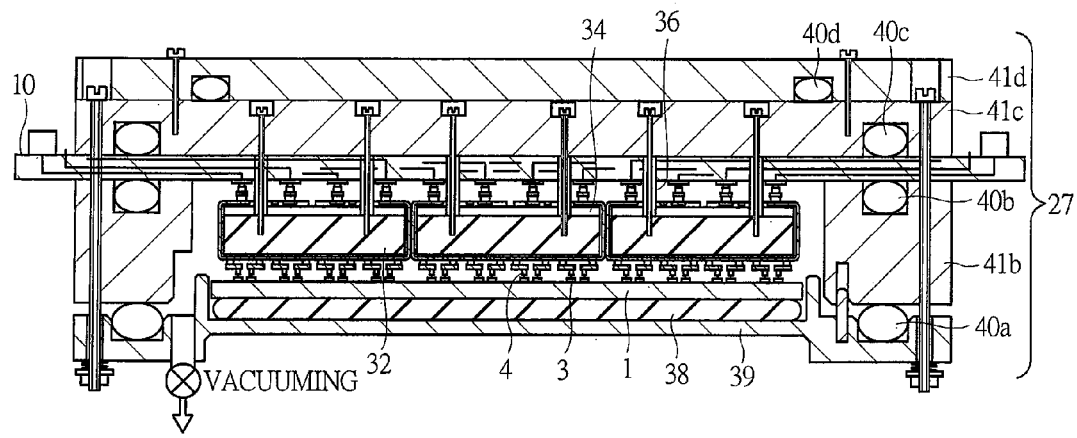
FIG. 11A is a cross sectional view showing the principal part of a probe card according to the fifth embodiment of the present invention.
Figure 11B:
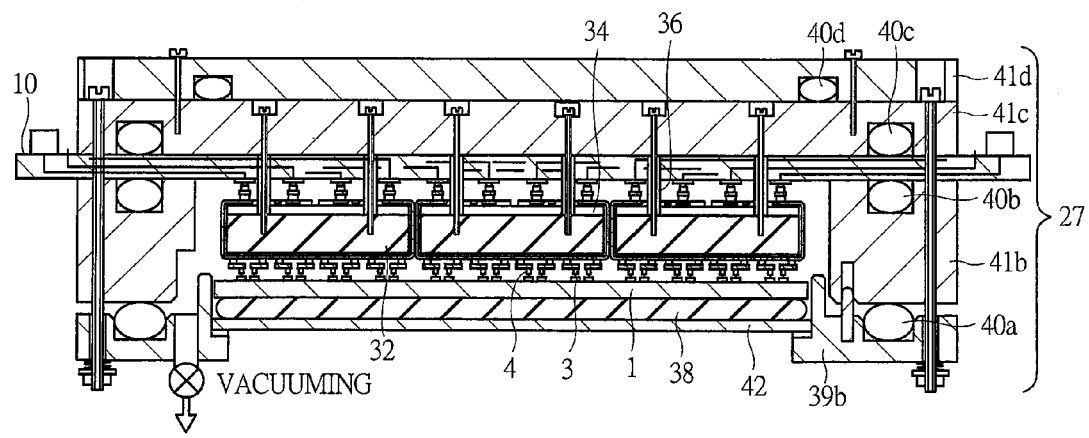
FIG. 11B is a cross sectional view showing the principal part of the probe card according to the fifth embodiment of the present invention.

FIGS. 11A and 11B are cross sectional views showing the principal parts of probe cards of a fifth embodiment.

The fifth embodiment has a configuration equivalent to that of the probe card (see FIG. 9) to which the plurality of the blocks 32 described in the above-described fourth embodiment (see FIG. 9 and FIGS. 10A and 10B) are attached. The group of the contact terminals 4 and the group of the electrodes 3 of the wafer 1 mounted on a wafer mount stage 39 on which a buffer material 38 is placed are positioned to each other, and sealing is made by O rings 40a fitted on the wafer mount stage 39, O rings 40b fitted on a lower substrate 41b, O rings 40c fitted on a middle substrate 41c, and O rings 40d fitted on an upper substrate 41d. Under these circumstances, the pressure in the space between the wafer mount stage 39 and the multi-layer wiring board 10 is reduced, whereby the group of the contact terminals 4 and the group of the electrodes 3 of the wafer 1 can be reliably brought into contact with each other by utilizing an appropriate atmospheric pressure even if the area thereof is large, and inspection apparatus for full-wafer inspection can be formed as a wafer cassette.

Alternatively, as shown in FIG. 11B, instead of using the above-described wafer mount stage 39, a flexible wafer mount film 42 (for example, polyimide sheet) whose periphery is fixed to the wafer mount stage 39b may be employed, and the wafer 1 is mounted on the wafer mount film 42 via the buffer material 38. Under these circumstances, the pressure in the space between the wafer mount film 42 and the multi-layer wiring board 10 is reduced, whereby the group of the contact terminals 4 and the group of the electrodes 3 of the wafer 1 can be reliably brought into contact with each other by utilizing an appropriate atmospheric pressure even if the area thereof is large, and inspection apparatus for full-wafer inspection can be formed as a wafer cassette.

Note that the above-described sealing structure is arbitrary as the configuration of the inspection apparatus for full-wafer inspection. It goes without saying that, as long as the group of the contact terminals 4 and the group of the electrodes 3 of the wafer 1 are reliably in contact with each other, the wafer cassette structure is not required to have the pressure reduction mechanism.

Sixth Embodiment

Figure 12:
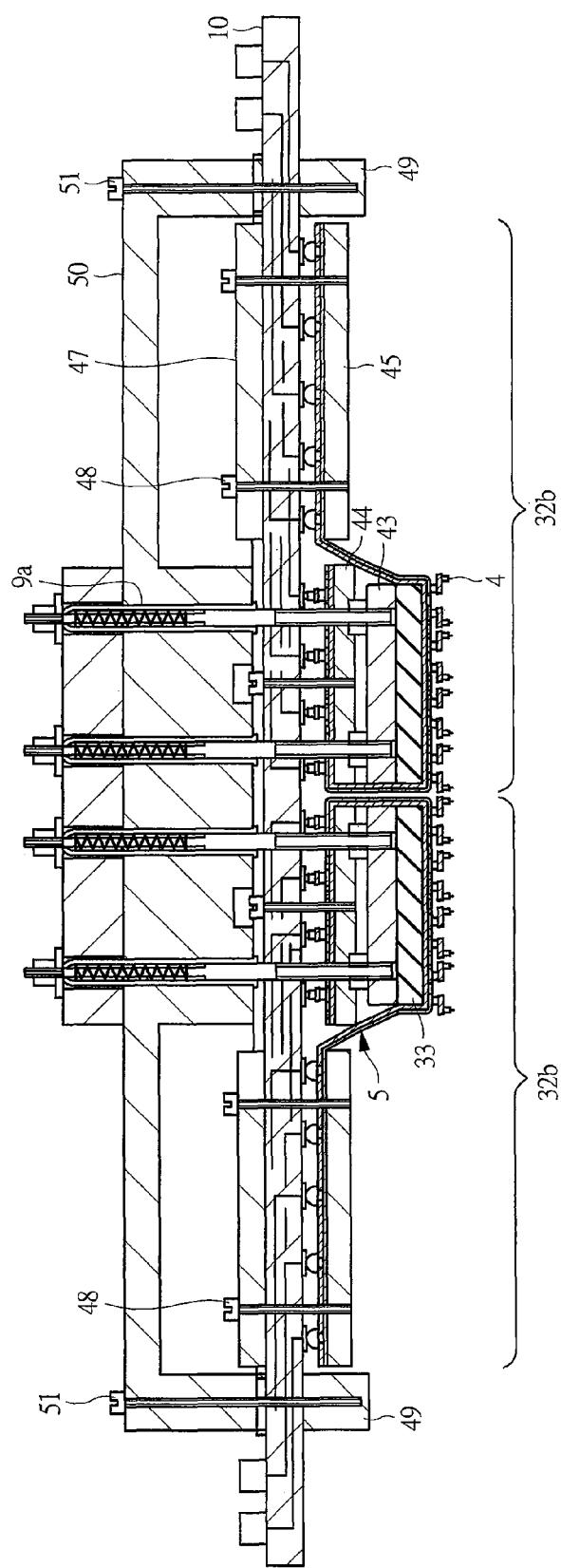
FIG. 12 is a cross sectional view showing the principal part of a probe card according to the sixth embodiment of the present invention.
Figure 13:
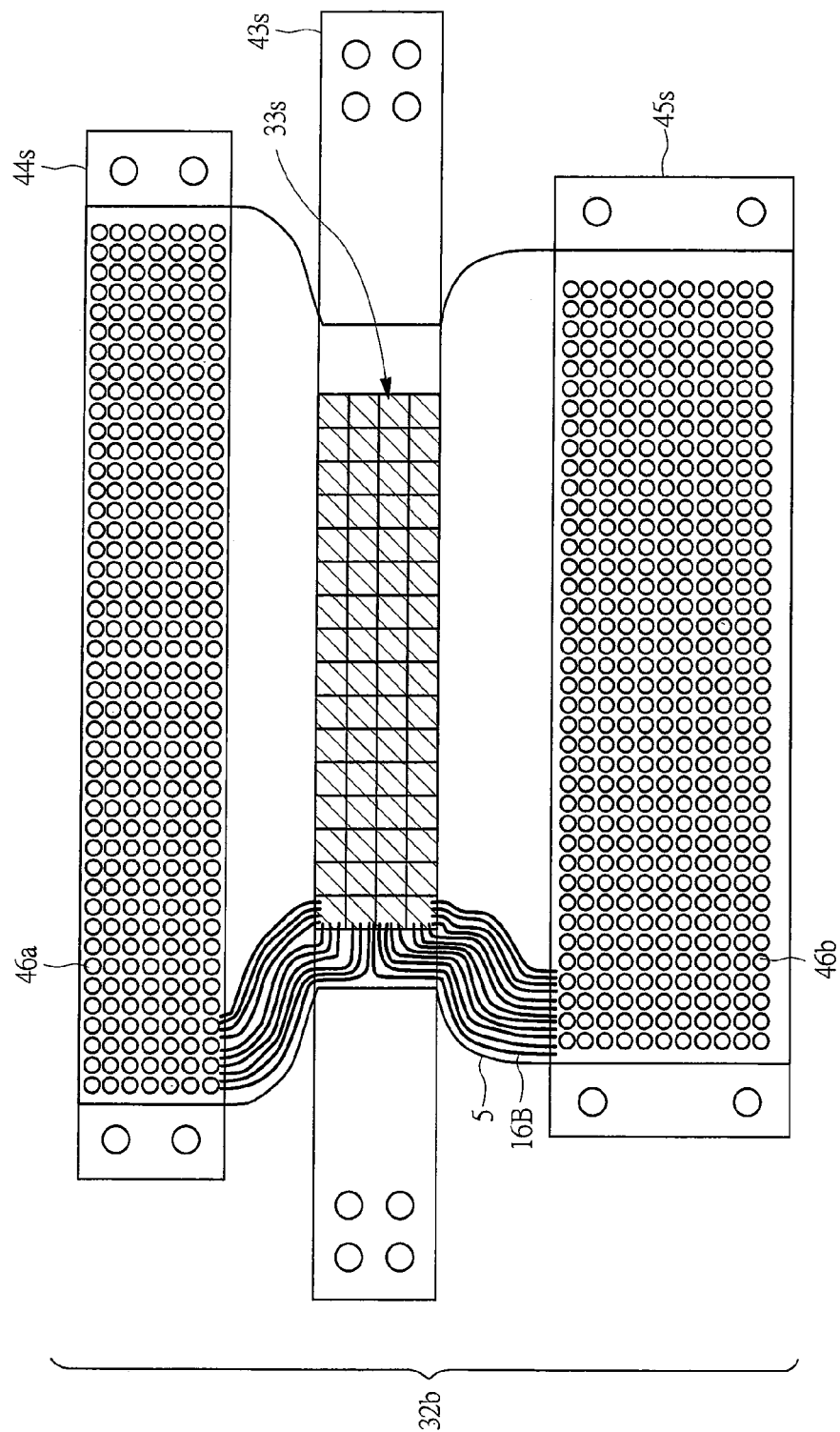
FIG. 13 is a development view of a probe sheet attached to one block which is a constituent element of the probe card according to the sixth embodiment of the present invention.

FIG. 12 is a cross sectional view showing the principal part of a probe card of a sixth embodiment. FIG. 13 is a development view of the probe sheet 5 attached to one block 32b which is a constituent element of the probe card of the sixth embodiment. FIG. 13 also shows a fixing position 33s (hatched part) of the fixing substrate 33 with respect to the probe sheet 5, a fixing position 43s of a block suspension plate 43, a fixing position 44s of a sheet holding plate 44 immediately above the fixing substrate, and a fixing position 45s of a substrate lower-surface sheet holding plate 45.

The fixing substrate 33 is fixed to the region corresponding to the contact terminal formation region on the surface of the probe sheet 5 that is reverse to the surface on which the contact terminals 4 are formed. Similar to the fixing substrate 33, the sheet holding plate 44 immediately above the fixing substrate is also fixed to the surface of the probe sheet 5 on the reverse side of the surface on which the contact terminals 4 are formed, and the fixing position thereof is in the region in which wiring pitch enlarging pads (first peripheral electrodes) 46a corresponding to the substrate electrodes of the multi-layer wiring board 10 are formed. The wiring pitch enlarging pads 46a are the terminals formed in the same step as the contact terminals 4 in the formation of the probe sheet 5, are formed on the same surface as the contact terminals 4 in the probe sheet 5, and have wider formation pitches than the contact terminals 4. Meanwhile, the substrate lower-surface sheet holding plate 45 is fixed to the surface of the probe sheet 5 on which the contact terminals 4 are formed, and the fixing position thereof is in the region in which wiring pitch enlarging pads (second peripheral electrodes) 46b corresponding to the substrate electrodes of the multi-layer wiring board 10 are formed. The wiring pitch enlarging pads 46b are formed on the surface of the probe sheet 5 that is on a reverse side of the contact terminals 4 and have wider formation pitches than the contact terminals 4.

Figure 14:
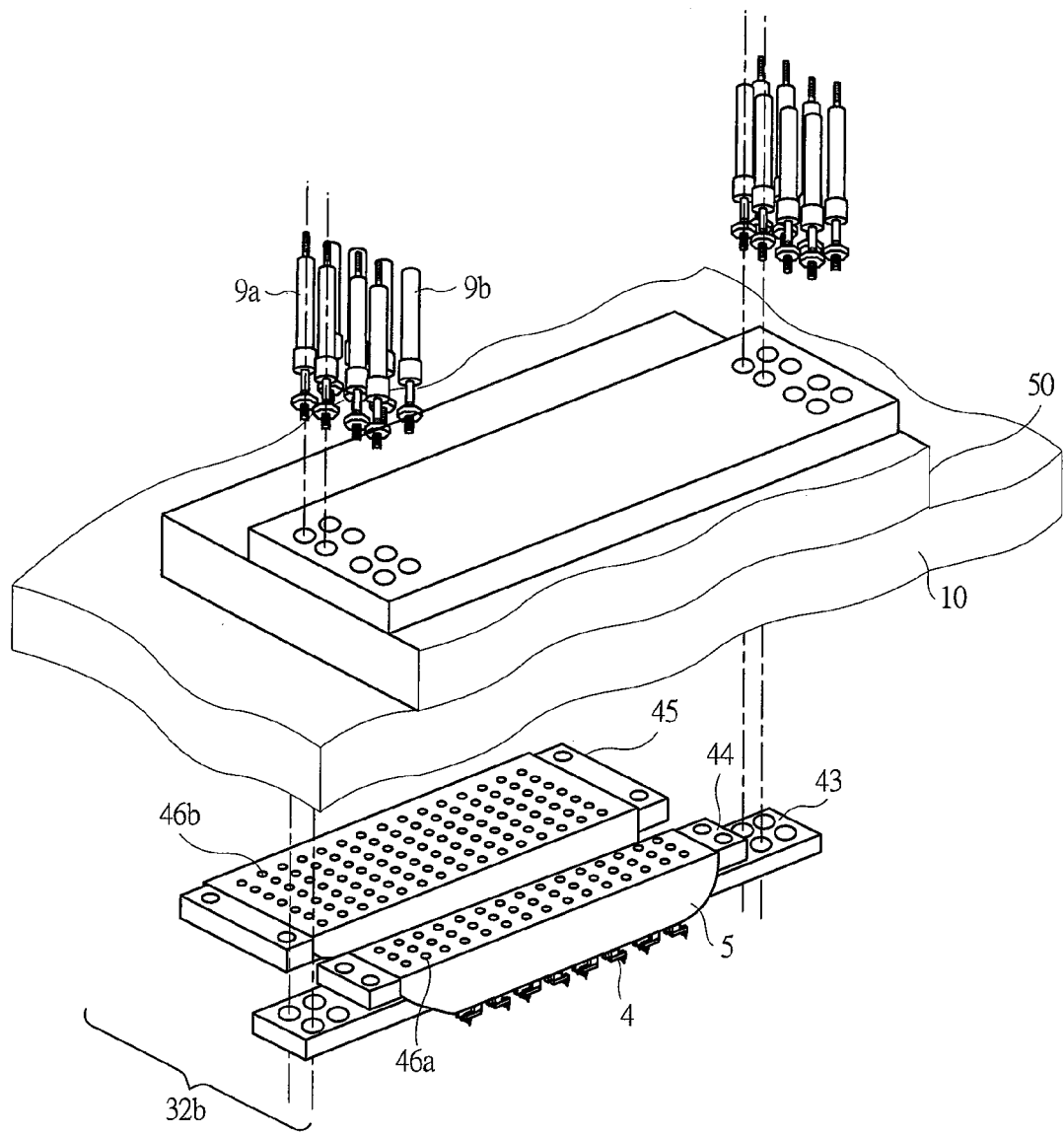
FIG. 14 is a perspective view showing the principal part of an attachment example of one block which is a constituent element of the probe card according to the sixth embodiment of the present invention to a multi-layer wiring board.

FIG. 14 is a perspective view showing an example of attachment of the block 32b shown in FIG. 12 and FIG. 13 to the multi-layer wiring board 10.

In the sixth embodiment, the substrates (the fixing substrate 33, the sheet holding plate 44 immediately above the fixing substrate, and the substrate lower-surface sheet holding plate 45) fixed to the probe sheet 5 have the above-described configurations, and the pitches of the lead-out wirings 16B are enlarged on the probe sheet 5, on which the contact terminals 4 are formed, in consideration of the assembled state, thereby enlarging the pitches of the peripheral electrodes (the wiring pitch enlarging pads 46a and 46b) of the probe sheet 5 to the formation pitches of normal substrate electrodes of the multi-layer wiring board 10. Accordingly, even when the wirings are formed to have many pins and narrow pitches like a probe card for simultaneously inspecting many chips, an intermediate substrate for enlarging electrode pad pitches between the peripheral electrodes of the probe sheet 5 and the substrate electrodes of the multi-layer wiring board 10 can be omitted. More specifically, since the number of parts for forming the probe card can be reduced, the contact portions between the parts can be reduced, and assembly becomes easy.

Note that, in the example shown in FIG. 12, the probe card is configured by using two blocks 32b shown in FIG. 14.

In the manufacture of the block 32b, the block may be processed and formed integrally with the fixing substrate 33 and the block suspension plate 43. Also, when the stroke of the part of the contact terminals 4 in the inspection can be ensured by the contact terminals 4 with the cantilever beam structure, the individual blocks 32b may be fixed by a block fixing plate and used as an integrated block.

In the state in which the peripheral electrodes of the probe sheet 5 and the corresponding substrate electrodes of the multi-layer wiring board 10 are positioned, the probe sheet 5 and the multi-layer wiring board 10 are sandwiched by the substrate lower-surface sheet holding plate 45 and a substrate upper-surface holding plate 47, and these are fixed by screwing by fixing screws 48, whereby the peripheral electrodes (wiring pitch enlarging pads 46a and 46b) of the probe sheet 5 and the corresponding substrate electrodes of the multi-layer wiring board 10 are electrically connected to each other. In addition, the multi-layer wiring board 10 is sandwiched by a lower holding plate 49 and an upper holding plate 50 and fixed by screwing by fixing screws 51. By this means, the probe card of the sixth embodiment can be formed. Note that the spring-incorporated guide pins 9a serving as the leveling mechanism and the positioning-dedicated guide pins 9b for preventing positional misalignment of the distal ends of the contact terminals 4 penetrate through the upper holding plate 50 and fixed at the upper surface of the upper holding plate 50.

Seventh Embodiment

Figure 15:
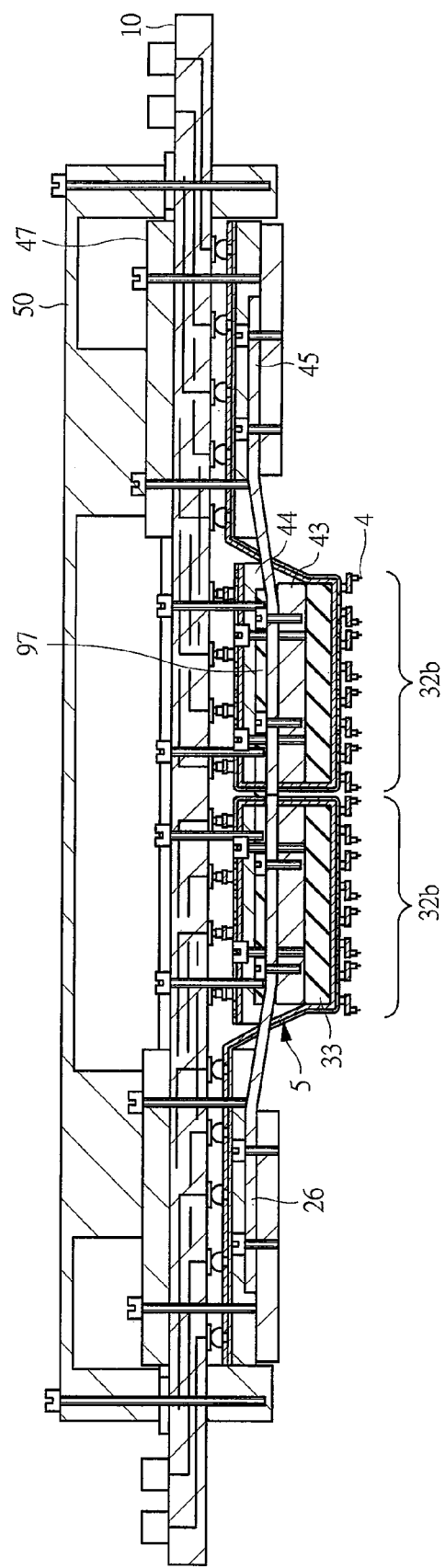
FIG. 15 is a cross sectional view showing the principal part of a probe card according to the seventh embodiment of the present invention.

FIG. 15 is a cross sectional view showing the principal part of a probe card of a seventh embodiment.

As shown in FIG. 15, in the seventh embodiment, a plate spring 26 is used instead of the spring-incorporated guide pins 9a (see FIG. 12) used in the above-described sixth embodiment, and the plurality of blocks 32b are attached to a block fixing substrate 97 so as to form an integrated block.

The effects similar to those of the above-described sixth embodiment can be obtained also by the above-described seventh embodiment.

Eighth Embodiment

Next, an example of a manufacturing method of the probe sheets (probe sheet structures) used in the probe cards described in the first to seventh embodiments will be described with reference to FIG. 16 to FIG. 28. Note that the members for forming the probe sheet mentioned below have been arbitrarily shown also in the cross sectional views showing the principal part of the probe cards of the first to seventh embodiments in FIG. 2 to FIG. 15.

Of the manufacturing processes for forming the probe card shown in FIG. 2 in the first embodiment, manufacturing processes such as a step of forming the contact terminals 4 having the truncated pyramidal shape, the beams 28 (see FIG. 6), and a wiring material for the lead-out wirings 16 integrally with a polyimide film (insulating sheet) with using the holes having the truncated pyramidal shape formed in a silicon wafer by anisotropic etching as a mold and a step of forming a polyimide film and a wiring material on the surface thereof and fixing the fixing substrate 6 are particularly shown in FIG. 16 to FIG. 28 in the order of steps.

Figure 16:
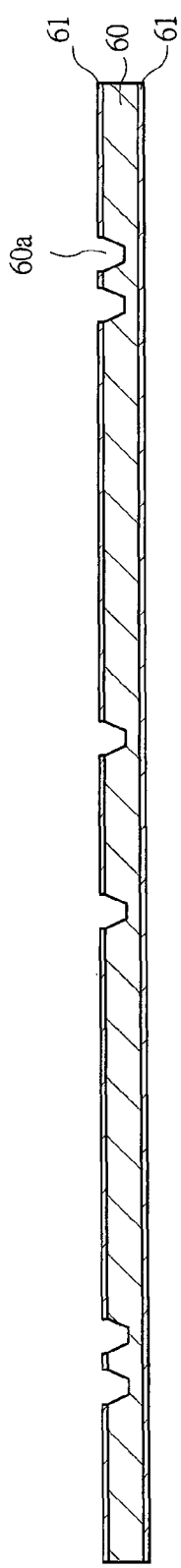
FIG. 16 is a cross sectional view showing the principal part of a manufacturing process for forming a probe sheet part (probe sheet structure) in a probe card according to the eighth embodiment of the present invention.

First, the step shown in FIG. 16 is performed. In this step, a silicon dioxide film 61 having a thickness of about 0.5 μm is formed by thermal oxidation on each of both surfaces of the (100) plane of a silicon wafer 60 having a thickness of 0.2 to 0.6 mm, a photoresist is applied thereon, and a pattern in which portions of the photoresist at the positions where holes 60a having a truncated pyramidal shape are to be formed are removed is formed by a photolithography process. Then, the silicon dioxide film 61 is removed by etching using a mixed solution of hydrofluoric acid and ammonium fluoride with using the photoresist as a mask, and the silicon wafer 60 is subjected to anisotropic etching using a strong alkali solution (for example, potassium hydroxide) with using the silicon dioxide film 61 as a mask, thereby forming the etching holes 60a having the truncated pyramidal shape surrounded by the (111) plane and the (100) plane.

Note that, although the silicon wafer 60 is used as a mold in the eighth embodiment, any material can be used as the mold as long as the mold has crystallinity, and it goes without saying that various changes can be made within the range thereof. In addition, although the hole formed by the anisotropic etching has the truncated pyramidal shape in the eighth embodiment, the shape may be a pyramidal shape, and various modifications can be made within the range of the shape as long as it is possible to form the contact terminal 4 capable of ensuring stable contact resistance with a small needle pressure. Moreover, it goes without saying that a plurality of the contact terminals 4 may be brought into contact with one electrode which is an object to be contacted.

Figure 17:
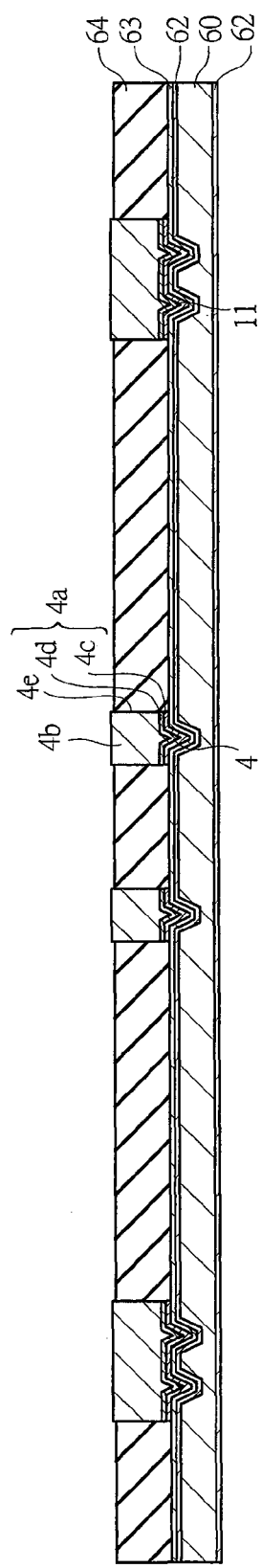
FIG. 17 is a cross sectional view showing the principal part of the manufacturing process of the probe sheet part subsequent to FIG. 16.

Next, the step shown in FIG. 17 is performed. In this step, the silicon dioxide film 61 used as the mask is removed by etching using a mixed solution of hydrofluoric acid and ammonium fluoride, and a silicon dioxide film 62 having a thickness of about 0.5 μm is formed on the entire surface of the silicon wafer 60 again by thermal oxidation in wet oxygen. Then, conductive coating 63 is formed on the surface of the silicon dioxide film 62, and a photoresist mask 64 is then formed on the surface of the conductive coating 63 so that the portions for the contact terminals 4 are opened.

Next, electroplating using materials having high hardness as primary components is performed with using the photoresist mask 64 as a mask and using the above-described conductive coating 63 as a power feeding layer, thereby integrally forming the contact terminals 4 and connection electrode portions 4b. At this time, the peripheral electrodes 11 having similar structures as the contact terminals 4 are also formed. As the plating materials having high hardness, for example, nickel 4c, rhodium 4d, and nickel 4e can be sequentially plated so as to form contact terminal portions 4a in each of which the contact terminal 4 and the contact electrode portion 4b are integrally formed. The photoresist mask 64 may be a liquid resist or a film-like resist (dry film).

Figure 18:
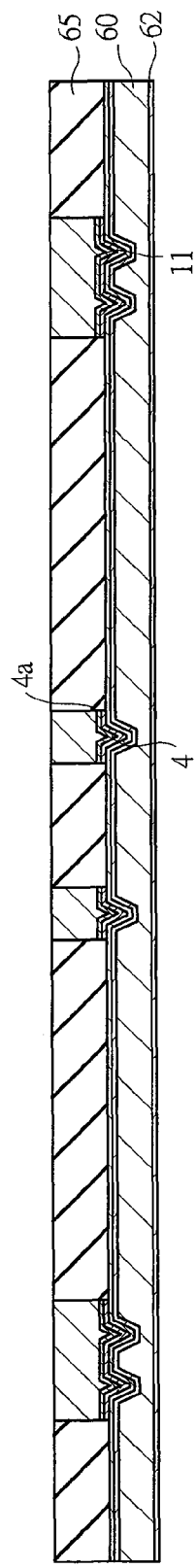
FIG. 18 is a cross sectional view showing the principal part of the manufacturing process of the probe sheet part subsequent to FIG. 17.

Next, the step shown in FIG. 18 is performed. In this step, after the above-described photoresist mask 64 is removed, a polyimide film 65 is formed so as to cover the above-described contact terminal portions 4a and the conductive coating 63, and polishing is flatly carried out so that the surfaces of the contact terminal portions 4a are exposed from the polyimide film 65. For example, CMP (Chemical Mechanical Polishing) or polishing processing using a polishing sheet can be used for the polishing of the surface of the polyimide film 65 and the surfaces of the contact terminal portions 4a.

Figure 19:
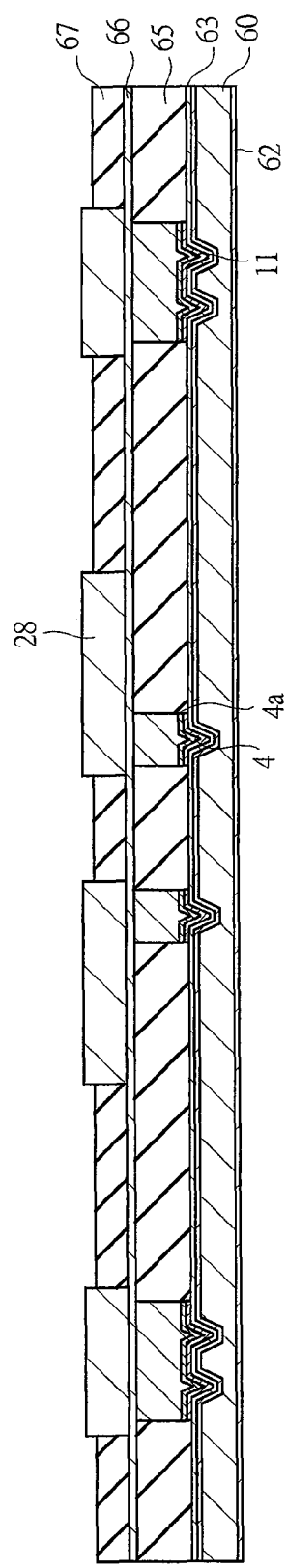
FIG. 19 is a cross sectional view showing the principal part of the manufacturing process of the probe sheet part subsequent to FIG. 18.

Next, the step shown in FIG. 19 is performed. In this step, after conductive coating 66 and a photoresist mask 67 are formed on the polyimide film 65, the beams 28 are plated. The conductive coating 66 can be formed by, for example, forming a chromium film having a thickness of about 0.1 μm by sputtering or vapor deposition and forming a copper film having a thickness of about 1 μm on the surface of the chromium film by sputtering or vapor deposition. As the material of the beams 28, for example, a material obtained by performing nickel plating on copper plating or nickel-cobalt plating can be used. The photoresist mask 67 may be a liquid resist or a film-like resist (dry film) like the photoresist mask 64.

Figure 20:
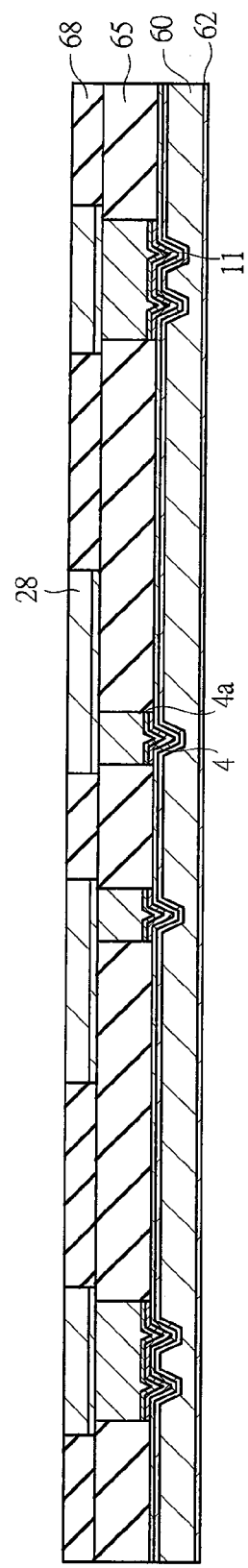
FIG. 20 is a cross sectional view showing the principal part of the manufacturing process of the probe sheet part subsequent to FIG. 19.

Next, the step shown in FIG. 20 is performed. In this step, after the above-described photoresist mask 67 is removed, the above-described conductive coating 66 is subjected to soft etching with using the plating film of the beams 28 as a mask, a polyimide film 68 is then formed so as to cover the beams 28 and the polyimide film 65, and polishing is flatly performed so that the surfaces of the beams 28 are exposed from the polyimide film 68. For example, CMP or polishing processing using a polishing sheet can be used to polish the surface of the polyimide film 68 and the surfaces of the beams 28.

Figure 21:
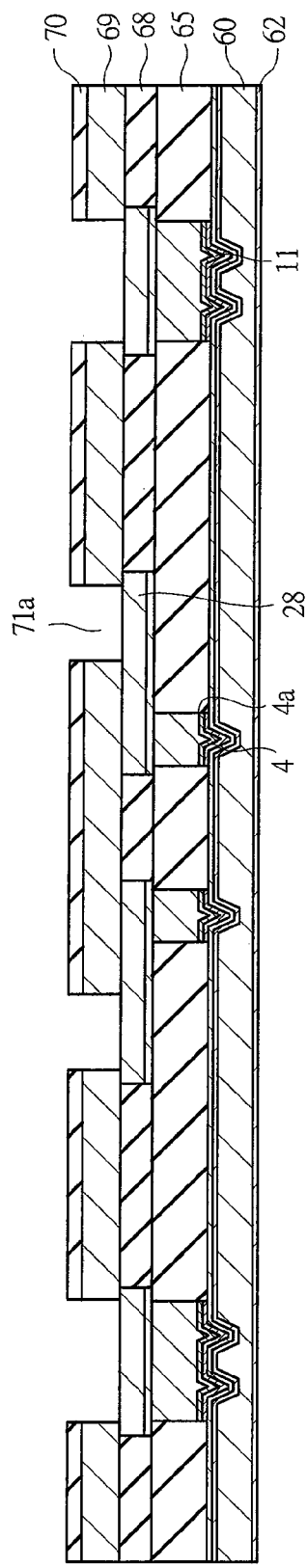
FIG. 21 is a cross sectional view showing the principal part of the manufacturing process of the probe sheet part subsequent to FIG. 20.

Next, the step shown in FIG. 21 is performed. In this step, after a polyimide film 69 is formed so as to cover the above-described beams 28 and the polyimide film 68, an aluminum mask 70 is formed on the surface thereof, and portions of the polyimide film 69 at the positions where lead-out wiring connection holes 71a are to be formed are removed by etching until reaching the surfaces of the beams 28.

In the formation of the above-described lead-out wiring connection holes 71a, dry etching or laser etching can be used with using the aluminum mask 70 as an etching mask. Alternatively, it is also possible to form the lead-out wiring connection holes 71a by directly performing laser drilling processing while omitting the formation of the aluminum mask 70.

Figure 22:
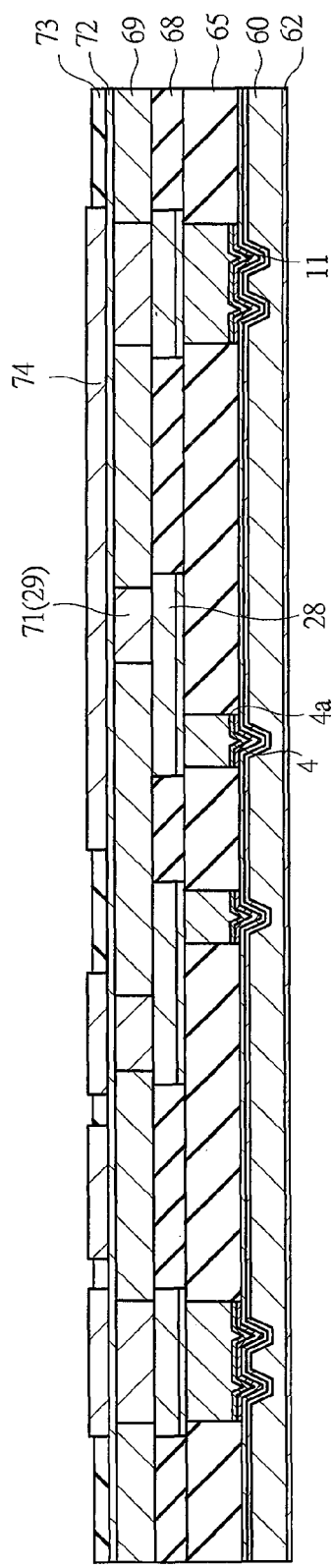
FIG. 22 is a cross sectional view showing the principal part of the manufacturing process of the probe sheet part subsequent to FIG. 21.

Next, the step shown in FIG. 22 is performed. In this step, after the above-described aluminum mask 70 is removed, the lead-out wiring connection holes 71a are filled with plating 71, conductive coating 72 is formed thereon, and after a photoresist mask 73 is formed, a wiring material 74 is plated.

The conductive coating 72 can be formed by, for example, forming a chromium film having a thickness of about 0.1 μm by sputtering or vapor deposition and forming a copper film having a thickness of about 1 μm on the surface of the chromium film by sputtering or vapor deposition. Note that copper having a thickness of several μm may be formed on the copper film by plating so as to increase the tolerance for drilling processing. As the wiring material 74, a material obtained by copper plating or performing nickel plating on copper plating can be used. The photoresist mask 73 may be a liquid resist or a film-like resist (dry film) like the photoresist masks 64 and 67.

Figure 23:
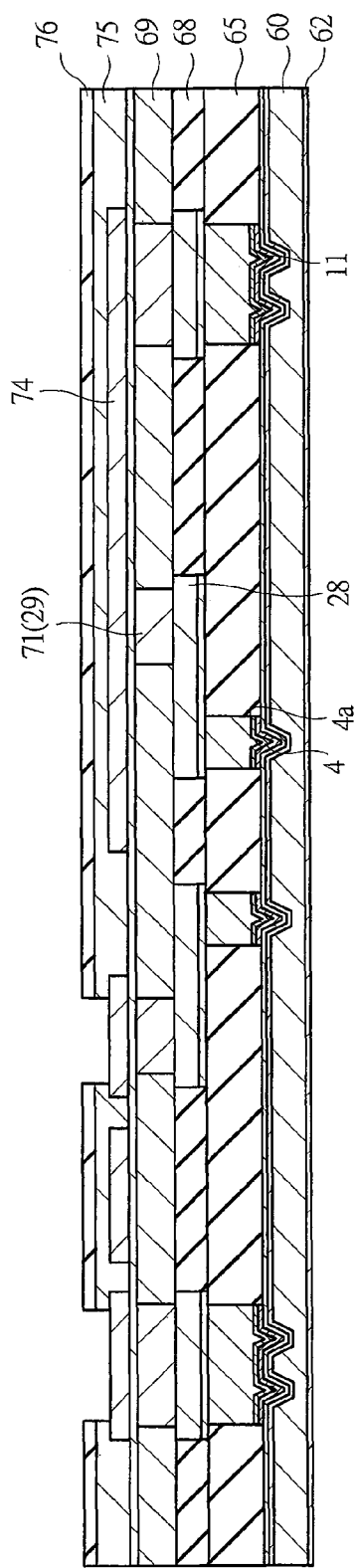
FIG. 23 is a cross sectional view showing the principal part of the manufacturing process of the probe sheet part subsequent to FIG. 22.

Next, the step shown in FIG. 23 is performed. In this step, the above-described photoresist mask 73 is removed, a polyimide film 75 is formed, an aluminum mask 76 is formed, and then portions of the polyimide film 75 at the positions where the holes for connection between the wiring material 74 and an upper wiring material 79 (described later with reference to FIG. 24) are to be formed are removed until reaching the surface of the wiring material 74.

In the removal of the polyimide film 75 until reaching the surface of the wiring material 74, dry etching or laser etching using the aluminum mask 76 as an etching mask can be employed. Alternatively, it is also possible to directly perform laser drilling processing while omitting the formation of the aluminum mask 76.

Figure 24:
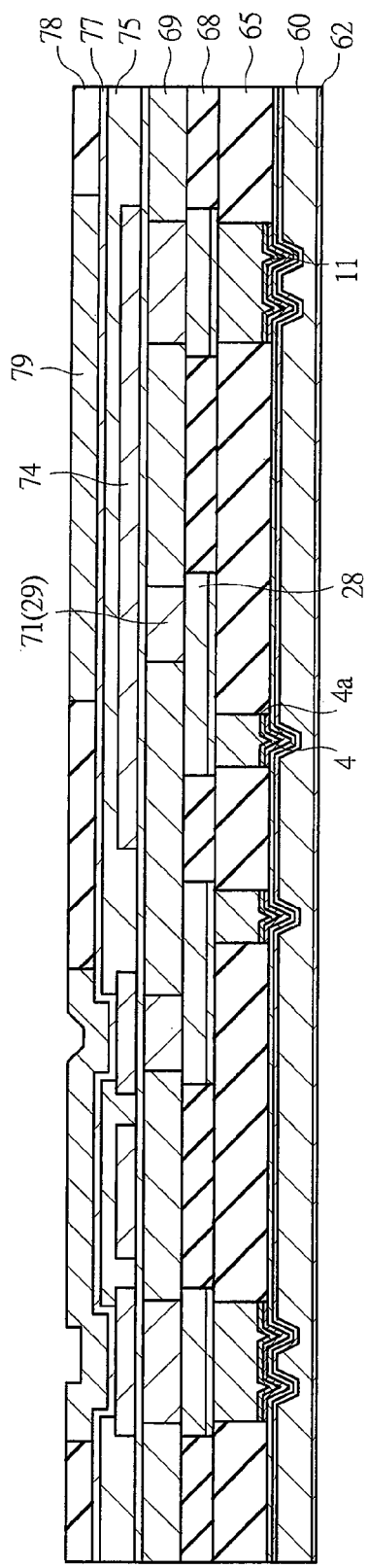
FIG. 24 is a cross sectional view showing the principal part of the manufacturing process of the probe sheet part subsequent to FIG. 23.

Next, the step shown in FIG. 24 is performed. In this step, after the aluminum mask 76 is removed, conductive coating 77 is formed on the polyimide film 75, a photoresist mask 78 is formed, and then the wiring material 79 is plated.

The conductive coating 77 can be formed by, for example, forming a chromium film having a thickness of about 0.1 μm by sputtering or vapor deposition and forming a copper film having a thickness of about 1 μm on the surface of the chromium film by sputtering or vapor deposition. As the wiring material 79, a material obtained by copper plating or performing nickel plating on copper plating can be used. The photoresist mask 78 may be a liquid resist or a film-like resist (dry film) like the photoresist masks 64, 67 and 73.

The reason why the wiring materials 74 and 79 to be the lead-out wirings 16 have the two-layer structure is that a microstrip structure is formed between the wiring materials 74 and 79 by using the wiring material 74 as grounding wirings (lead-out wiring 16A) and using the wiring material 79 as the wirings for signals and power supply (lead-out wirings 16B) so as to achieve impedance matching and prevent disturbance of high-speed electrical signals as much as possible. Further, the reason why the lead-out wirings 16 from the group of the contact terminals 4, which are disposed to have narrow pitches and many pins, to the groups of the peripheral electrodes 11 are formed to have the two-layer structure is to facilitate the formation of the lead-out wirings 16, to reduce the wiring resistance values and voltage drops by avoiding extension of fine wirings and increasing the widths of the wirings, and to ensure the current capacities.

Note that it goes without saying that the formation of the wiring material 79 may be omitted to provide only one layer of the wiring material 74 in accordance with needs.

Figure 25:
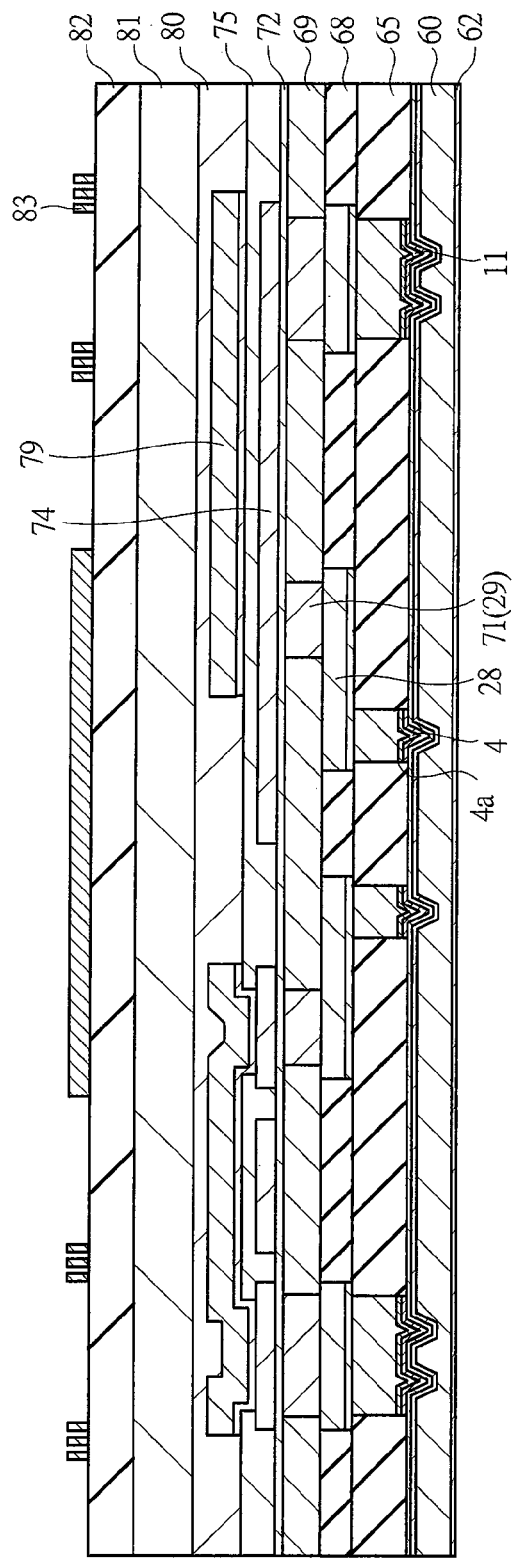
FIG. 25 is a cross sectional view showing the principal part of the manufacturing process of the probe sheet part subsequent to FIG. 24.

Next, the step shown in FIG. 25 is performed. In this step, after the above-described photoresist mask 78 is removed and the conductive coating 77 is removed by soft etching with using the wiring material 79 as a mask, a polyimide film 80 is formed, a bonding layer 81 and a metal film 82 are bonded to the polyimide film 80, and a photoresist mask 83 for forming a desired pattern is formed on the metal film 82.

As the bonding layer 81, for example, a polyimide-based bonding sheet or an epoxy-based bonding sheet can be used. Further, as the metal film 82, a metal sheet with a low linear expansion ratio like that of 42 alloy (alloy of nickel 42% and iron 58% with a linear expansion ratio of 4 ppm/° C.) or invar (for example, alloy of nickel 35% and iron 64% with a linear expansion ratio of 1.5 ppm/° C.) and a linear expansion ratio close to that of a silicon wafer (silicon mold) 60 is adhered to the polyimide film 80 by the bonding layer 81. By this means, it is possible to improve the strength and increase the area of the probe sheet to be formed and achieve the positional accuracy under various conditions such as the prevention of positional misalignment due to temperature at the time of inspection. In this sense, for the purpose of ensuring the positional accuracy at the burn-in inspection, a material with a linear expansion ratio close to that of a semiconductor element to be inspected may be employed as the metal film 82.

In the above-described bonding step, for example, the silicon wafer on which the contact terminal portions 4a and the polyimide film 80 are formed, the bonding layer 81 and the metal film 82 are overlapped, and they are subjected to heating/pressurizing bonding in vacuum while applying a pressure of about 10 to 200 Kgf/cm$^2$ and applying a temperature equal to or higher than the glass transition point temperature (Tg) of the bonding layer 81. Note that the photoresist mask 83 for forming the desired pattern on the metal film 82 may be a liquid resist or a film-like resist (dry film) like the photoresist masks 64, 67, 73, and 78.

Figure 26:
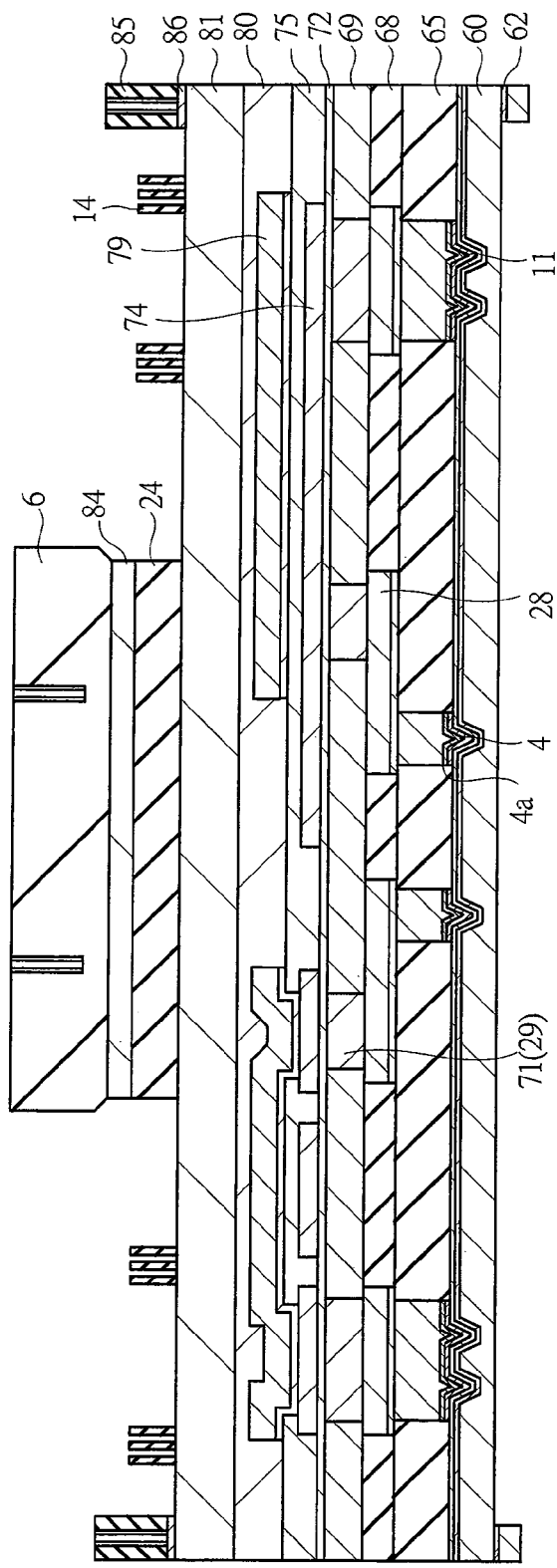
FIG. 26 is a cross sectional view showing the principal part of the manufacturing process of the probe sheet part subsequent to FIG. 25.

Next, the step shown in FIG. 26 is performed. In this step, after the metal film 82 is etched with using the above-described photoresist mask 83 as a mask so as to form desired patterns of the metal films 14 and 24, as the preprocessing of the next step (see FIG. 27), the surface of the bonding layer 81 on which the patterns of the metal films 14 and 24 are formed is covered with a protective film, and on the reverse surface, the silicon dioxide film 62 in the region exposed from a lid 100b of a protective jig for silicon etching (details thereof will be described later with reference to FIG. 27) is removed by etching using a mixed solution of hydrofluoric acid and ammonium fluoride with using a protective film having a hollow center as a mask. Subsequently, after the protective film is removed, the fixing substrate 6 is bonded and fixed by a bonding material 84 to the metal film 24 corresponding to the region in which the group of the contact terminals 4 is formed, and a holding ring 85 for silicon etching is bonded to the bonding layer 81 by a bonding material 86.

When a 42 alloy sheet or an invar sheet is used as the metal film 82, as the etching for forming the patterns of the metal films 14 and 24, for example, spray etching using a ferric chloride solution can be used.

Figure 27:
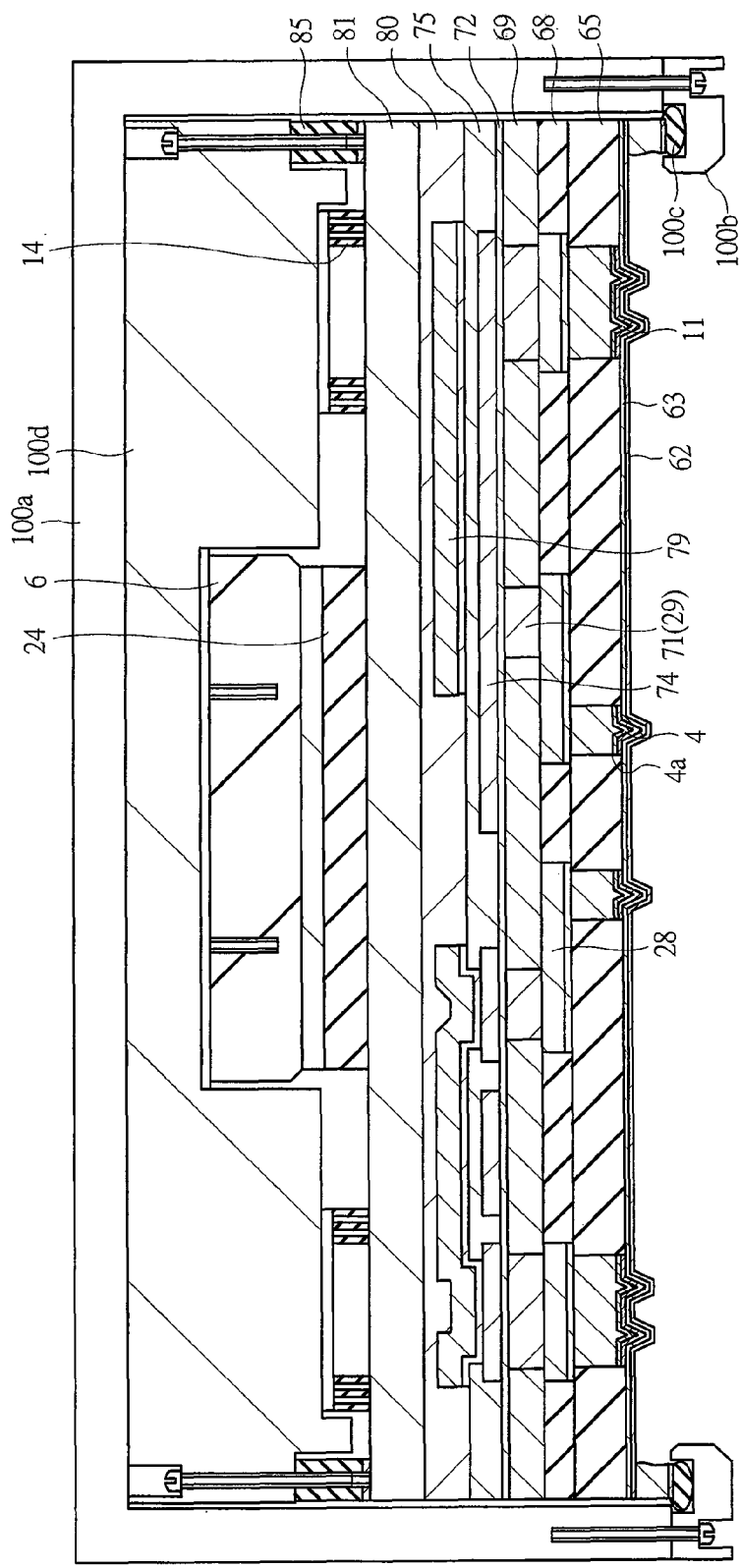
FIG. 27 is a cross sectional view showing the principal part of the manufacturing process of the probe sheet part subsequent to FIG. 26.

Next, the step shown in FIG. 27 is performed. In this step, a protective jig for silicon etching is attached, and the silicon wafer 60 is removed by etching. For example, the holding ring 85 for silicon etching is screwed to an intermediate fixing plate 100d, a stainless-steel fixing jig 100a and the stainless-steel lid 100b are attached via an O ring 100c, and the silicon wafer 60 which is the mold is removed by etching using a strong alkali solution (for example, potassium hydroxide).

Figure 28:
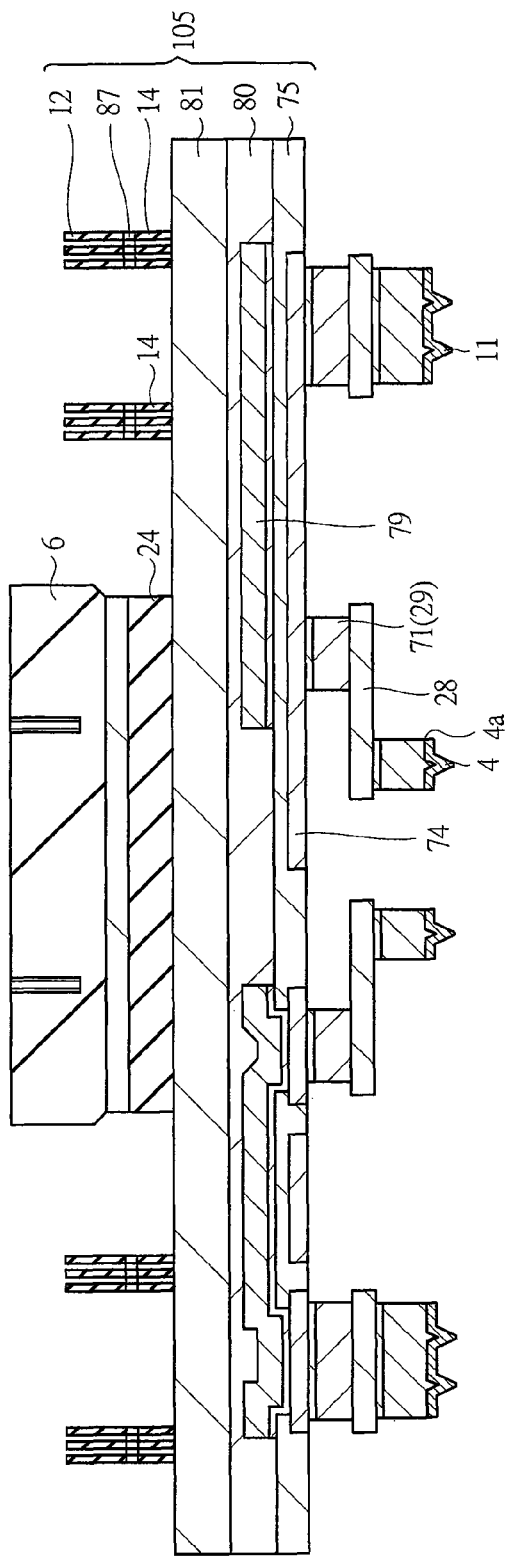
FIG. 28 is a cross sectional view showing the principal part of the manufacturing process of the probe sheet part subsequent to FIG. 27.

Next, the step shown in FIG. 28 is performed. In this step, the protective jig for silicon etching (the fixing jig 100a, the lid 100b, the O ring 100c, and the intermediate fixing plate 100d) is removed, a protective film is bonded to the holding ring 85 for silicon etching so as to cover one side, and the silicon dioxide film 62, the conductive coating 63 (chromium and copper), and the nickel 4c are removed by etching. Subsequently, after the protective film is removed, the polyimide films 65, 68, and 69 are removed by etching with using the conductive coating 72 as a stopper, and the unnecessary conductive coating 72 is removed. Then, the peripheral electrode fixing plates 12 are fixed to the metal film 14 by a bonding material 87, the polyimide films 75 and 80 and the bonding layer 81 are cut along the outer peripheral portions of the peripheral electrode fixing plate 12 and the fixing substrate 6, thereby fabricating a probe sheet structure 105. Note that explanatory drawings of the steps of assembling the probe sheet structure 105 to the probe card are shown in the perspective view of FIG. 3 and the cross sectional view of FIG. 4 in the above-described first embodiment.

In the step shown in FIG. 28, the silicon dioxide film 62 can be removed by etching using a mixed solution of hydrofluoric acid and ammonium fluoride, the chromium film can be removed by etching using a potassium permanganate solution, and the copper film and the nickel film 4c can be removed by etching using an alkaline copper etching solution. Through the series of etching treatment, the rhodium 4d is exposed on the surface of the contact terminal 4, and since the rhodium 4d serves as the surface of the contact terminal 4 in this manner, solder, aluminum, and the like which are the materials of the electrode 3 (see FIG. 1) do not readily adhere to the contact terminal 4. Moreover, since the rhodium 4d has hardness higher than that of nickel and is not readily oxidized, the contact resistance of the contact terminal 4 can be stabilized.

Ninth Embodiment

Next, a manufacturing method of a probe sheet structure of a ninth embodiment that is slightly different from the manufacturing process of the probe sheet structure 105 described in the above-described eighth embodiment will be described with reference to FIG. 29 to FIG. 32.

FIG. 29 to FIG. 32 show the manufacturing process of forming the probe sheet of the ninth embodiment in the order of steps.

This manufacturing method basically conforms to the manufacturing method described in the eighth embodiment with reference to FIG. 16 to FIG. 28, but all the polishing steps are eliminated in this manufacturing method. Note that it goes without saying that the polishing steps described in the eighth embodiment can be introduced in accordance with needs.

Figure 29:
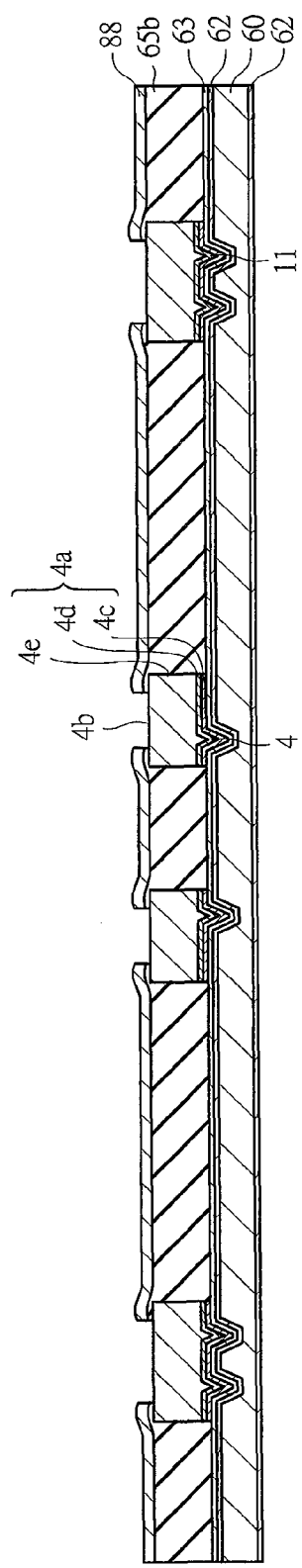
FIG. 29 is a cross sectional view showing the principal part of a manufacturing process for forming a probe sheet part (probe sheet structure) in a probe card according to the ninth embodiment of the present invention.

First, the step shown in FIG. 29 is performed. In this step, after the contact terminal portions 4a are formed through the steps similar to those shown in FIG. 16 and FIG. 17 in the eighth embodiment, the photoresist or dry film 64 (see FIG. 17) is removed, and a polyimide film 65b is formed. Then, an aluminum mask 88 is formed on the surface of the polyimide film 65b, and the polyimide film 65b on the contact terminal portions 4a to be the electrical connection positions between beams 28b formed in a next step and the contact terminal portions 4a is removed until reaching the surface of the contact terminal portions 4a.

In the removal of the polyimide film 65b, dry etching or laser etching using the aluminum mask 88 as an etching mask can be employed. Alternatively, it is also possible to remove the polyimide film 65b at the desired positions by directly performing laser drilling processing while omitting the formation of the aluminum mask 88.

Figure 30:
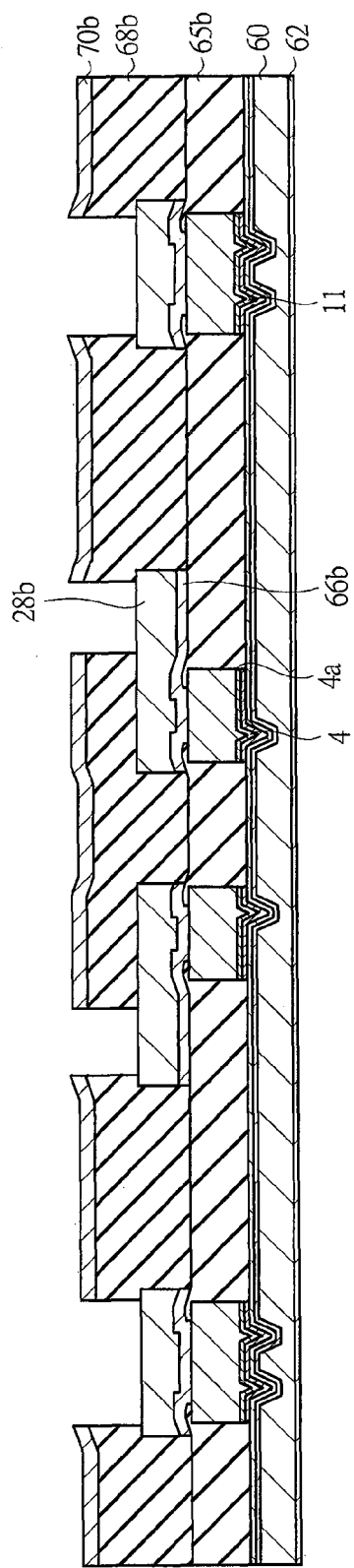
FIG. 30 is a cross sectional view showing the principal part of the manufacturing process of the probe sheet part subsequent to FIG. 29.

Next, the step shown in FIG. 30 is performed. In this step, after conductive coating 66b is formed on the polyimide film 65b through the steps similar to those shown in FIG. 19 and FIG. 20 in the eighth embodiment and a photoresist mask is formed, the beams 28b are formed by plating. Then, after the photoresist mask is removed, the conductive coating 66b is subjected to soft etching with using the plating film of the beams 28b as a mask, and a polyimide film 68b is then formed so as to cover the beams 28b and the polyimide film 65b. Then, an aluminum mask 70b is formed on the surface of the polyimide film 68b, and the polyimide film 68b at the positions where lead-out wiring connection holes (posts) are to be formed is removed by etching until reaching the surfaces of the beams 28b.

The conductive coating 66b can be formed by, for example, forming a chromium film having a thickness of about 0.1 µm by sputtering or vapor deposition and forming a copper film having a thickness of about 1 µm on the surface of the chromium film by sputtering or vapor deposition. As the material of the beams, for example, a material obtained by performing nickel plating on copper plating or nickel-cobalt plating can be used. In the formation of the lead-out wiring connection holes (posts), dry etching or laser etching using the aluminum mask 70b as an etching mask can be used. Alternatively, it is also possible to form the lead-out wiring connection holes by directly performing laser drilling processing while omitting the formation of the aluminum mask 70b.

Figure 31:
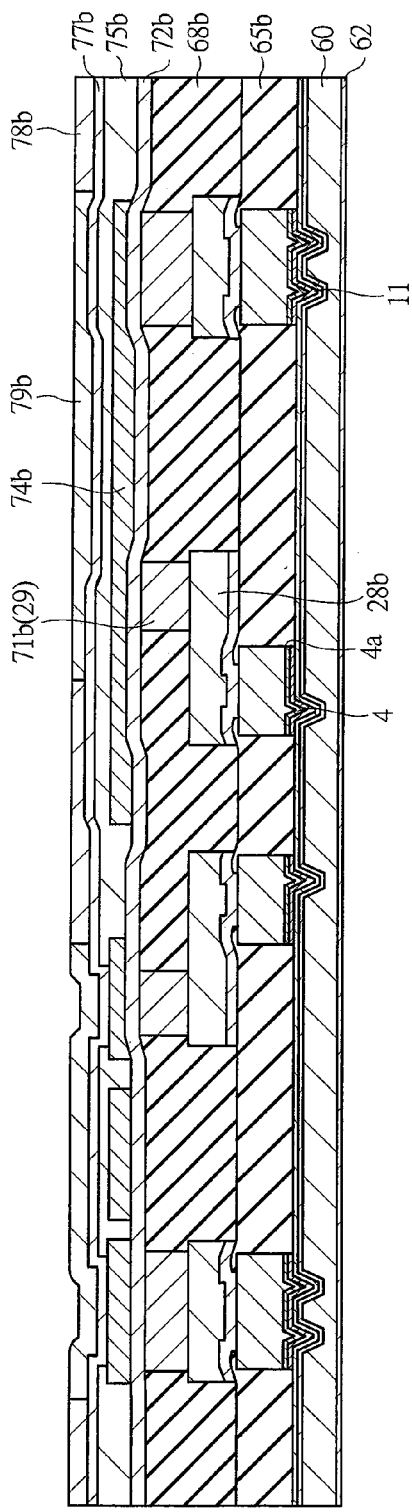
FIG. 31 is a cross sectional view showing the principal part of the manufacturing process of the probe sheet part subsequent to FIG. 30.

Next, the step shown in FIG. 31 is performed. In this step, after the aluminum mask 70b is removed through the steps similar to those shown in FIG. 22 and FIG. 23 in the eighth embodiment, the lead-out wiring connection holes are filled with plating 71b, and conductive coating 72b is further formed thereon. Next, a photoresist mask is formed on the conductive coating 72b, and a wiring material 74b is plated thereon. Then, after the photoresist mask is removed and a polyimide film 75b is formed, an aluminum mask is formed on the surface of the polyimide film 75b, and the polyimide film 75b at the positions where the holes for connection between a wiring material 79b formed above the wiring material 74b and the wiring material 74b are to be formed is removed until reaching the surface of the wiring material 74b. Then, after the aluminum mask is removed, conductive coating 77b is formed on the surface of the polyimide film 75b, a photoresist mask 78b is formed, and the wiring material 79b is plated thereon.

Figure 32:
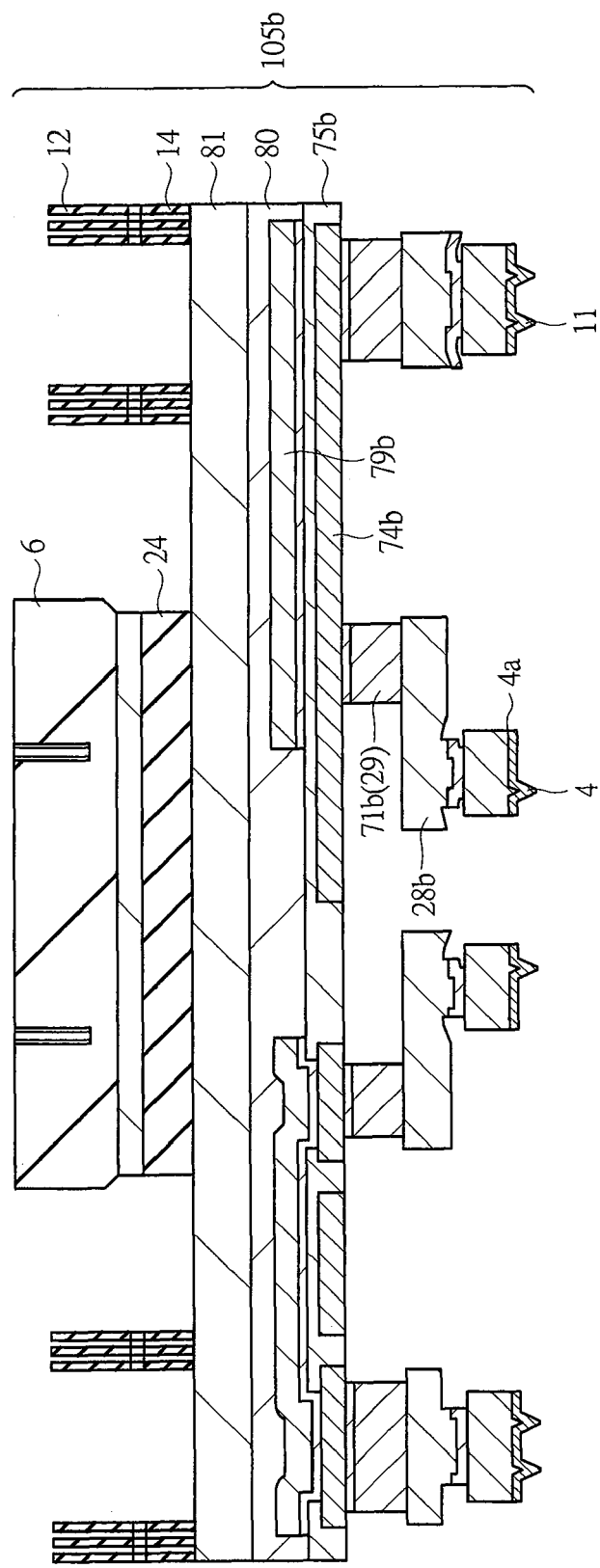
FIG. 32 is a cross sectional view showing the principal part of the manufacturing process of the probe sheet part subsequent to FIG. 31.

Thereafter, through the steps similar to those shown in FIG. 25 to FIG. 27 in the eighth embodiment, a probe sheet structure 105b of the ninth embodiment shown in FIG. 32 is fabricated.

Tenth Embodiment

Figure 33:
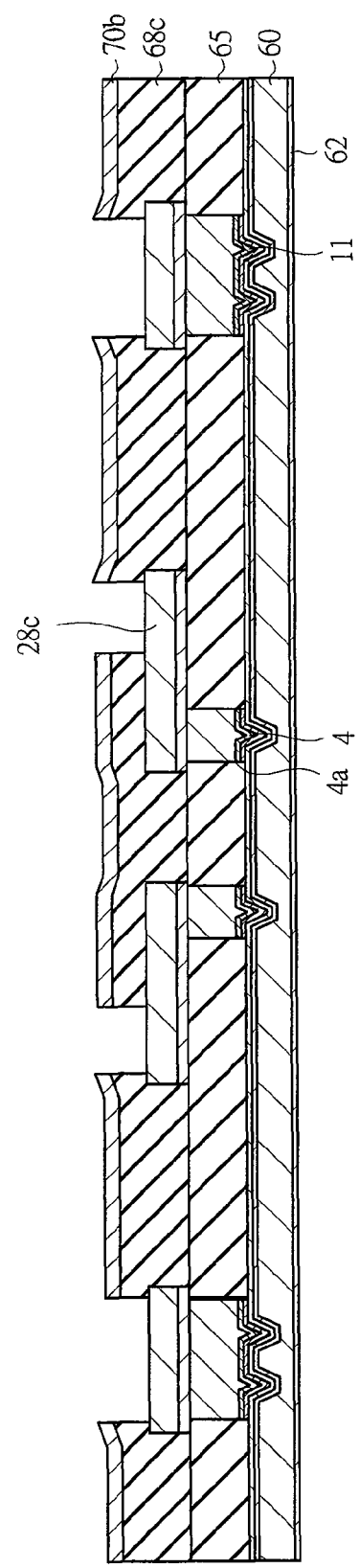
FIG. 33 is a cross sectional view showing the principal part of a manufacturing process for forming a probe sheet part (probe sheet structure) in a probe card according to the tenth embodiment of the present invention.
Figure 34:
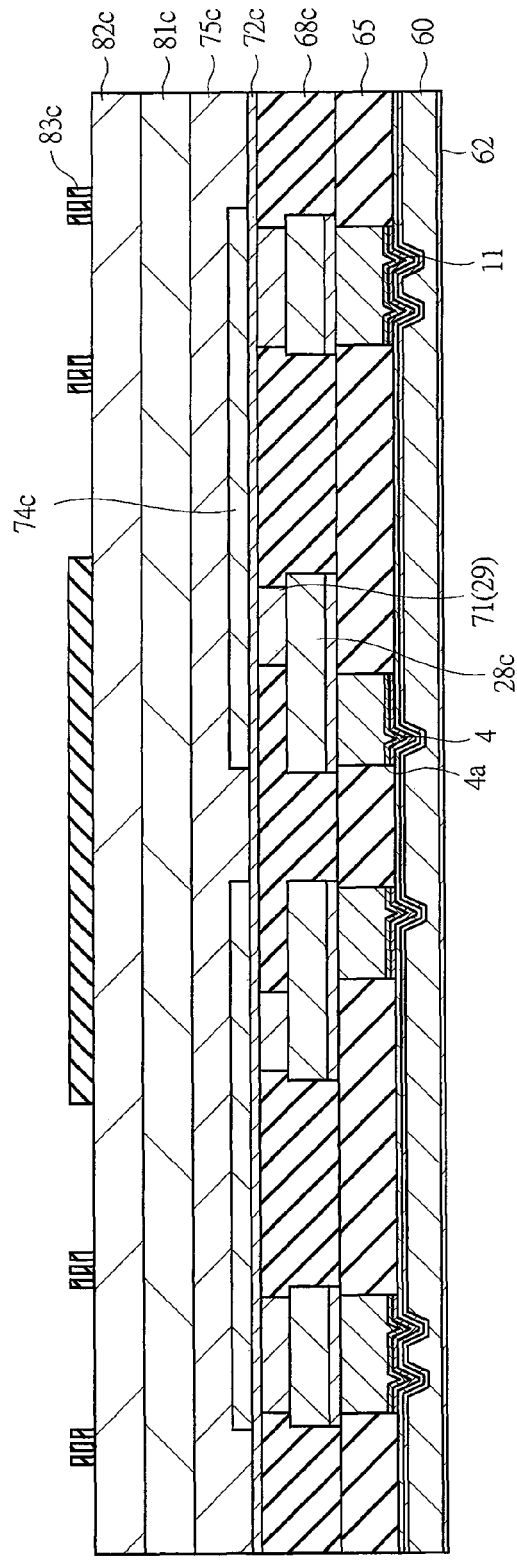
FIG. 34 is a cross sectional view showing the principal part of the manufacturing process of the probe sheet part subsequent to FIG. 33.
Figure 35:
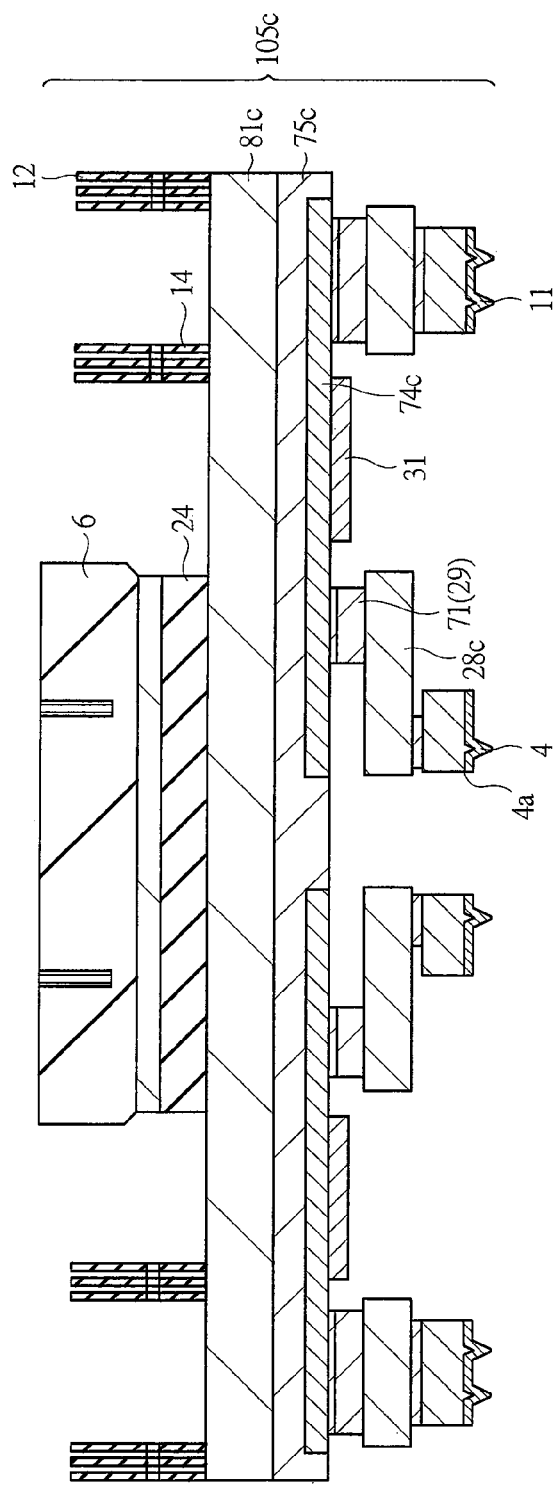
FIG. 35 is a cross sectional view showing the principal part of the manufacturing process of the probe sheet part subsequent to FIG. 34.

Next, a manufacturing method of a probe sheet of a tenth embodiment will be described with reference to FIG. 33 to FIG. 35. FIG. 33 to FIG. 35 show the manufacturing process of forming the probe sheet of the tenth embodiment in the order of steps.

In the tenth embodiment, the probe sheet 5 in which the lead-out wirings from the posts of the cantilever beam structures are formed by one layer and a protective film of polyimide is formed on the contact terminal formation surface of the cantilever beam structures is provided. Note that, although the case where no polishing steps are carried out is shown in FIG. 33 to FIG. 35, it goes without saying that a polishing step can be introduced in accordance with needs.

First, the step shown in FIG. 33 is performed. In this step, after the contact terminal portions 4a are formed through the steps similar to those shown in FIG. 16 to FIG. 19 in the eighth embodiment, the photoresist mask 67 or dry film is removed, and a polyimide film 68c is formed. Then, an aluminum mask 70b is formed on the surface of the polyimide film 68c, and the polyimide film 68c at the positions where the wiring material to be formed above the beams 28c and the beams 28c are connected to each other is removed by etching until reaching the surface of the beams 28b.

Next, the step shown in FIG. 34 is performed. In this step, after the above-described aluminum mask 70b is removed, the lead-out wiring connection holes are filled with plating 71b, and conductive coating 72c is further formed thereon. Then, after a photoresist mask is formed, a wiring material 74c is plated. Thereafter, the photoresist mask is removed, a polyimide film 75c is formed, a bonding layer 81c and a metal film 82c are bonded to the polyimide film 75c, and a photoresist mask 83c for forming a desired pattern is formed on the metal film 82c.

Next, after the steps similar to those shown in FIG. 26 to FIG. 28 in the above-described eighth embodiment, as shown in FIG. 35, a polyimide protective film 31 (see above-described third embodiment and FIG. 8) is formed on the contact terminal formation surface of the cantilever beam structures in accordance with needs for the protection against short circuit between wirings or protection of the wiring surface, and a probe sheet structure 105c is assembled, thereby fabricating the probe card shown in FIG. 8.

Note that, for the stabilization of high-speed transmission signals, as shown in FIG. 8, the capacitor 23 may be disposed and mounted between the grounding lead-out wiring 16 and the power-supply lead-out wiring 16 in accordance with needs.

Eleventh Embodiment

Figure 36:
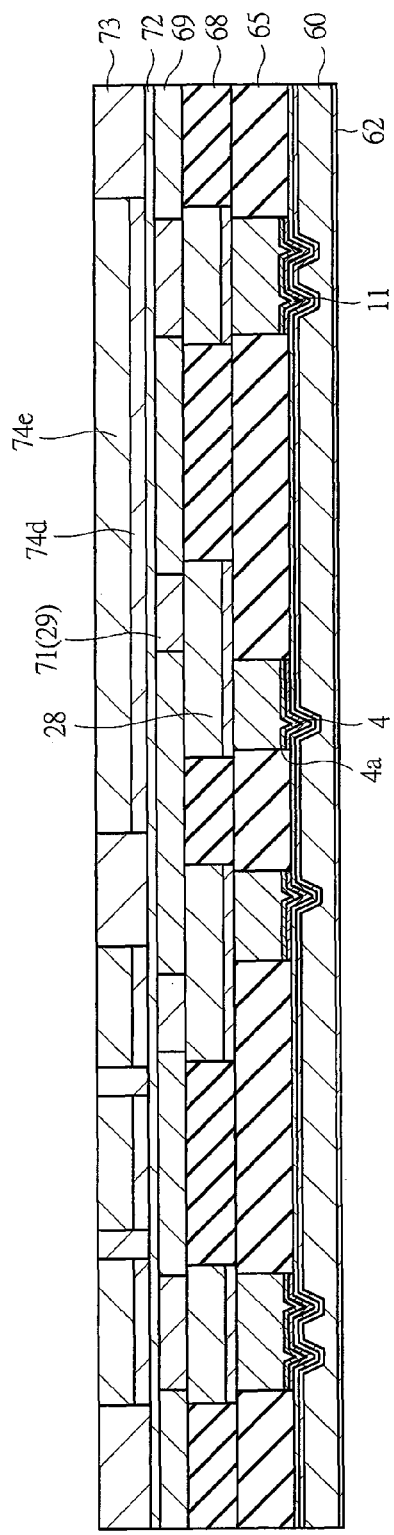
FIG. 36 is a cross sectional view showing the principal part of a manufacturing process for forming a probe sheet part (probe sheet structure) in a probe card according to the eleventh embodiment of the present invention.
Figure 37:
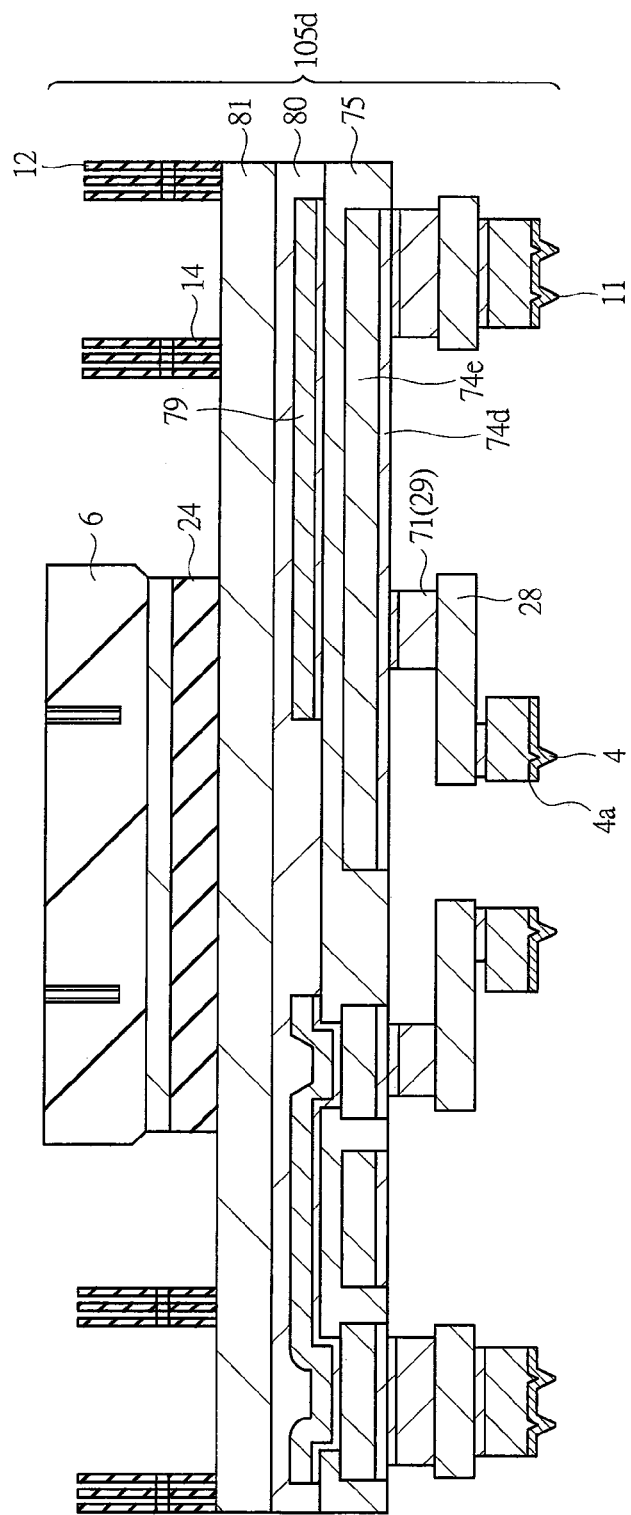
FIG. 37 is a cross sectional view showing the principal part of the manufacturing process of the probe sheet part subsequent to FIG. 36.

Next, a manufacturing method of a probe sheet of an eleventh embodiment will be described with reference to FIG. 36 and FIG. 37. FIG. 36 and FIG. 37 show the manufacturing process of forming the probe sheet of the eleventh embodiment in the order of steps.

The eleventh embodiment shows the example in which the wiring material (lead-out wirings 16) connected to the posts 29 is formed to have a two-layer structure of copper and nickel to reinforce itself in consideration of the stress applied between the posts (size-increasing parts of the cantilever beams) 29 and the lead-out wirings due to flexure of the beams. The connecting portions of the posts 29 and the wiring material may be reinforced in the entirety of the wiring material as shown in FIG. 36 and FIG. 37 or they may be partially reinforced.

First, as shown in FIG. 36, after the steps similar to those shown in FIG. 16 to FIG. 21 in the above-described eighth embodiment, in the stage of the step shown in FIG. 22, the part of the wiring material 74 is formed to have a two-layer structure of plating of copper 74d and nickel 74e.

Then, through the steps similar to those shown in FIG. 23 to FIG. 27 in the above-described eighth embodiment, a probe sheet structure 105d shown in FIG. 37 is fabricated.

Note that, as a reinforcement material, an alloy material such as a nickel alloy or a palladium alloy or a metal material such as tungsten may be used.

Twelfth Embodiment

Next, a manufacturing method of a probe sheet structure of a twelfth embodiment that is slightly different from the manufacturing process of the probe sheet structure 105 described in the above-described eighth embodiment will be described with reference to FIG. 38 to FIG. 43.

FIG. 38 to FIG. 43 show the manufacturing process of forming the probe sheet of the twelfth embodiment in the order of steps.

This manufacturing method basically conforms to the manufacturing method described in the eighth embodiment with reference to FIG. 16 to FIG. 28, but this is an example of the fabrication in which the height of the contact terminal portions 4a is increased by using two sacrifice layers of polyimide films 65 and 65c, and when the polyimide films 65, 65c, 68, and 69 are to be removed by etching, the polyimide film on the rear surfaces of the beams 28 is allowed to remain with using the metal material of the beams 28 as a mask. Note that it goes without saying that the sacrifice layer of the polyimide film 65 may be omitted, a polishing step may be omitted, or the polyimide film 69 on the rear surfaces of the beams 28 may be removed in accordance with required specifications.

Figure 38:
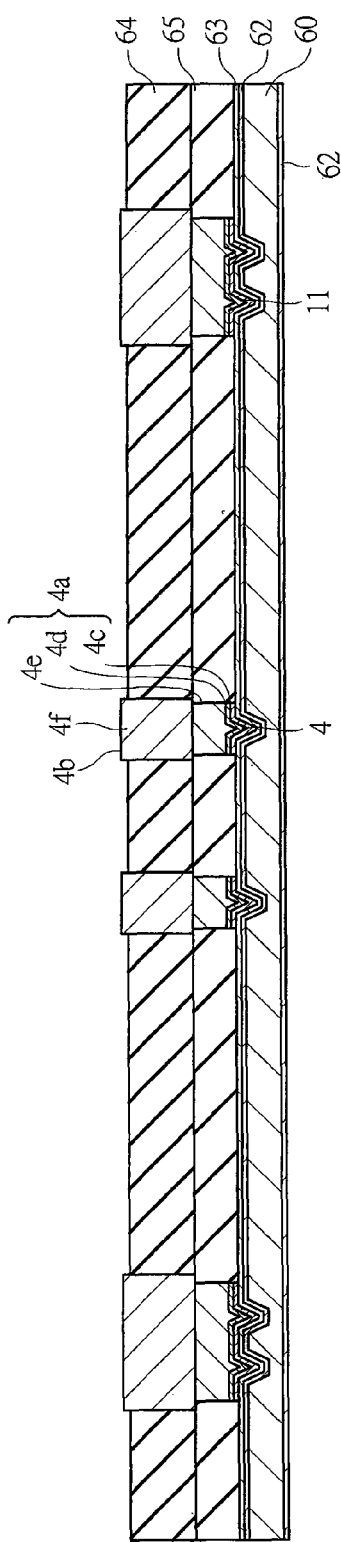
FIG. 38 is a cross sectional view showing the principal part of a manufacturing process for forming a probe sheet part (probe sheet structure) in a probe card according to the twelfth embodiment of the present invention.

First, the step shown in FIG. 38 is performed. In this step, after the contact terminal portions 4a are formed through the steps similar to those shown in FIG. 16 to FIG. 18 in the above-described eighth embodiment, a photoresist mask 64 is formed on the polyimide film 65, and a metal material 4f of a second layer is formed by carrying out electroplating with using the conductive coating 63 as a power feeding layer and using a material having a high hardness as a primary component, thereby forming the connection electrode portions 4b integrally with the contact terminal portions 4a. Note that the photoresist mask 64 may be a liquid resist or a film-like resist (dry film). The nickel plating can be used as the metal material 4f of the second layer.

Figure 39:
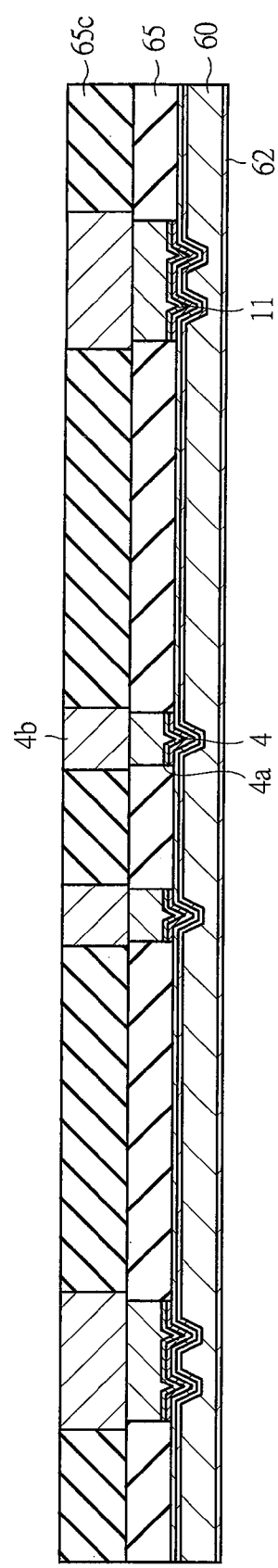
FIG. 39 is a cross sectional view showing the principal part of the manufacturing process of the probe sheet part subsequent to FIG. 38.

Next, the step shown in FIG. 39 is performed. In this step, after the above-described photoresist mask 64 is removed, the polyimide film 65c is formed so as to cover the above-described connection electrode portions 4b, and the polyimide film 65c is flatly polished so that the surfaces of the connection electrode portions 4b are exposed from the polyimide film 65c. For example, CMP or polishing processing using a polishing sheet can be used to polish the surface of the polyimide film 65c and the surfaces of the connection electrode portions 4b.

Figure 40:
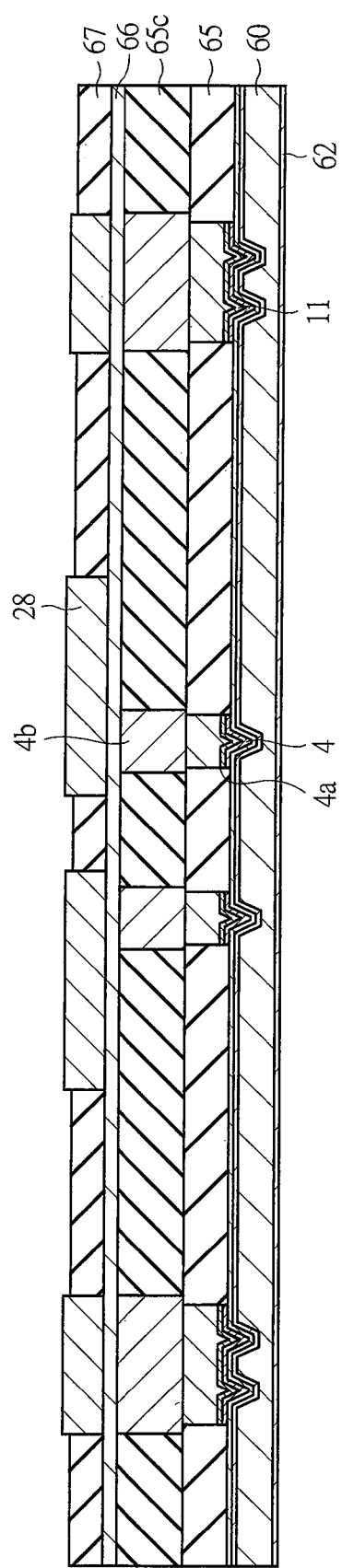
FIG. 40 is a cross sectional view showing the principal part of the manufacturing process of the probe sheet part subsequent to FIG. 39.

Next, the step shown in FIG. 40 is performed. In this step, similar to the step shown in FIG. 19 in the above-described eighth embodiment, after conductive coating 66 is formed on the polyimide film 65c and a photoresist mask 67 is further formed, the beams 28 are plated.

Figure 41:
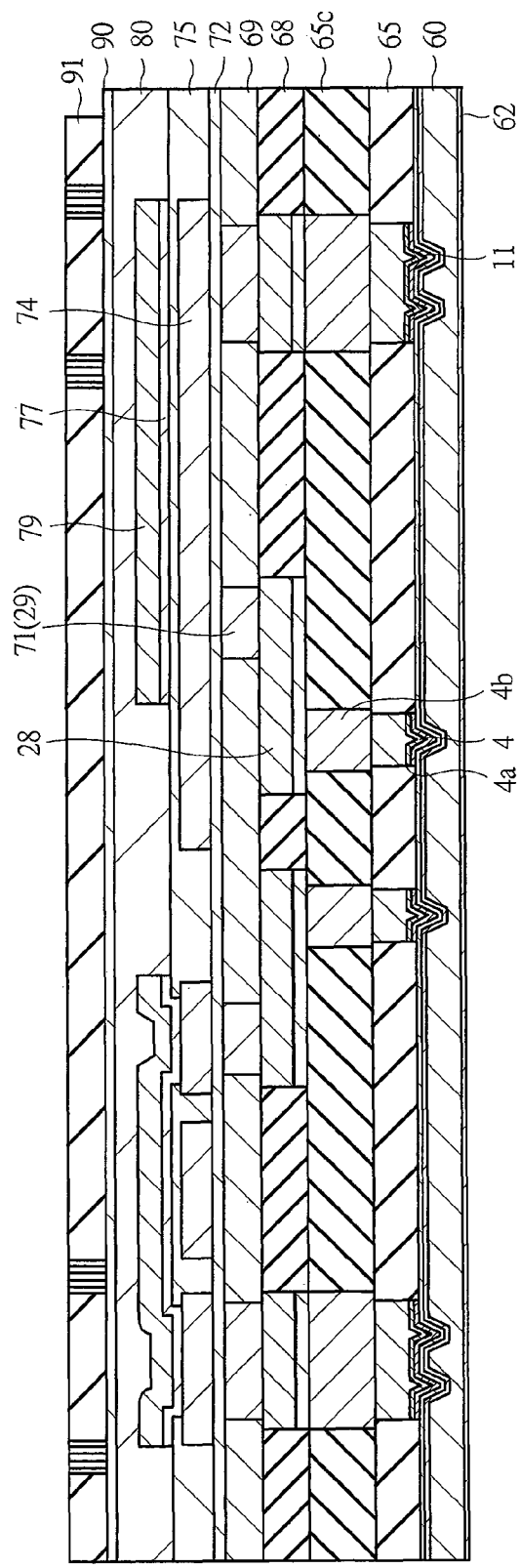
FIG. 41 is a cross sectional view showing the principal part of the manufacturing process of the probe sheet part subsequent to FIG. 40.

Next, the step shown in FIG. 41 is performed. In this step, after the steps similar to those shown in FIG. 20 to FIG. 24 in the above-described eighth embodiment, the photoresist mask 78 is removed, and then the conductive coating 77 is removed by soft etching with using the wiring material 79 as a mask. Then, a polyimide film 80 is formed, conductive coating 90 is formed on the polyimide film 80, and a photoresist mask 91 for forming a desired peripheral pattern is formed thereon. The photoresist mask 91 may be a liquid resist or a film-like resist (dry film).

Figure 42:
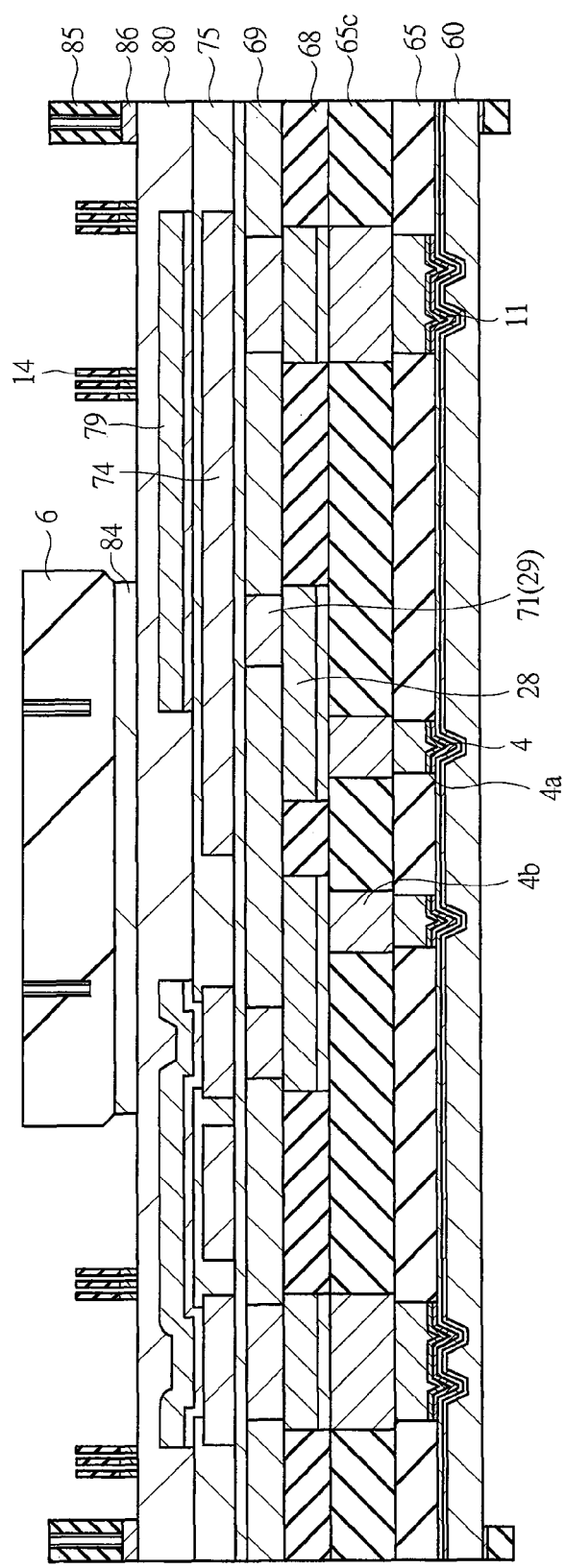
FIG. 42 is a cross sectional view showing the principal part of the manufacturing process of the probe sheet part subsequent to FIG. 41.

Next, the step shown in FIG. 42 is performed. In this step, the pattern of the metal film 14 is formed by carrying out electroplating with using the above-described conductive coating 90 as a power feeding layer, the photoresist mask 91 is removed, and then the conductive coating 90 is removed by soft etching with using the pattern of the metal film 14 as a mask. Thereafter, as the preprocessing of the next step, the surface of the polyimide film 80 on which the pattern of the metal film 14 is formed is covered with a protective film, and on the reverse surface, the silicon dioxide film 62 in the region exposed from the lid 100b of the protective jig for silicon etching (see FIG. 27) is removed by etching using a mixed solution of hydrofluoric acid and ammonium fluoride with using a protective film having a hollow center as a mask. Subsequently, after the protective film is removed, the fixing substrate 6 is bonded and fixed by a bonding material 84 to the polyimide film 80 corresponding to the region in which the group of the contact terminals 4 is formed, and a holding ring 85 for silicon etching is bonded to the polyimide film 80 by a bonding material 86.

The conductive coating 90 can be formed by, for example, forming a chromium film having a thickness of about 0.1 μm by sputtering or vapor deposition and forming a copper film having a thickness of about 1 μm on the surface of the chromium film by sputtering or vapor deposition. Also, the metal film 14 can be formed by, for example, using nickel plating, copper plating, or the like.

Figure 43:
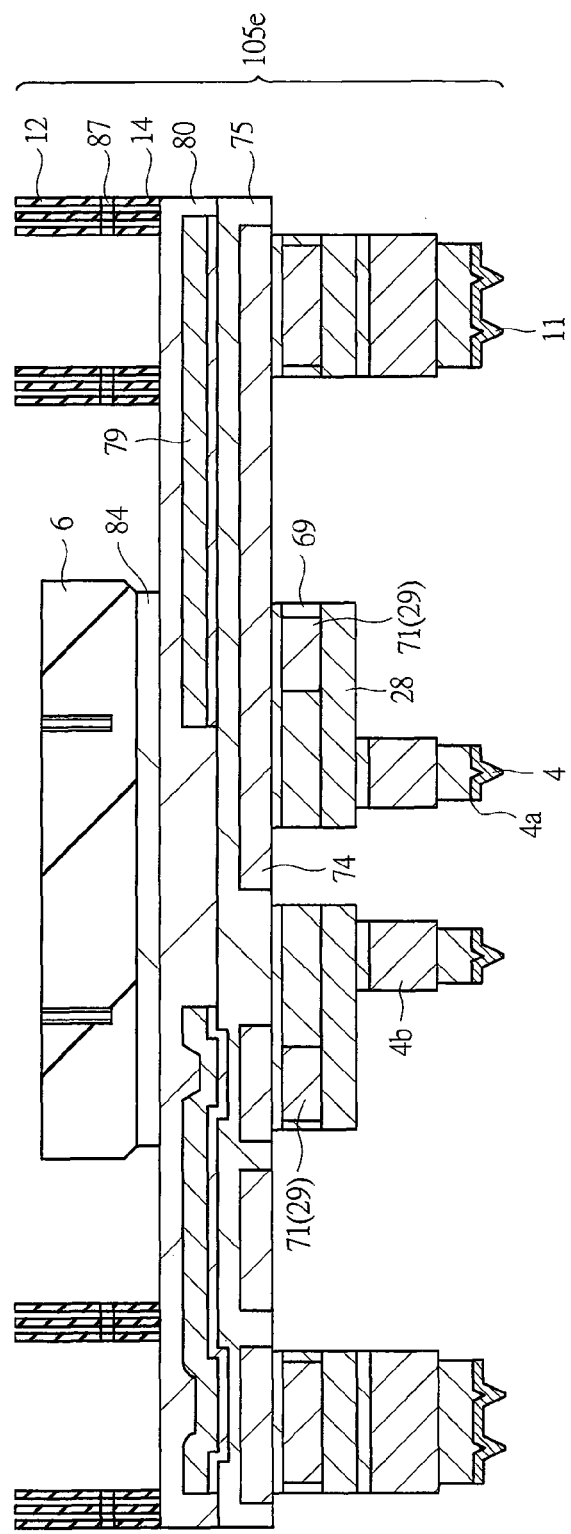
FIG. 43 is a cross sectional view showing the principal part of the manufacturing process of the probe sheet part subsequent to FIG. 42.

Next, through the steps similar to those shown in FIG. 27 and FIG. 28 in the above-described eighth embodiment, a probe sheet structure 105e of the twelfth embodiment shown in FIG. 43 is fabricated.

The twelfth embodiment shows the example in which the polyimide films 65, 65c, 68, and 69 are removed by etching with using the metal material of the beams 28 as a mask so that the polyimide film on the rear surfaces of the beams 28 is allowed to remain. The removal of these polyimide films can employ, for example, dry etching or laser processing. Note that, since a part of the polyimide film 69 is allowed to remain, the strength and the elastic modulus of the contact terminals with the cantilever beam structures can be ensured. Further, it goes without saying that the polyimide film may be removed so that the posts 29 are completely exposed.

Note that, although the manufacturing steps shown in FIG. 38 to FIG. 43 show the example in which the plating material is used as a pattern material of the metal films 14 in the peripheries of the probe sheet and the fixing substrate 6 is directly bonded and fixed by the bonding material 84 to the portion of the polyimide film 80 corresponding to the region in which the group of the contact terminals 4 is formed, it goes without saying that the bonding layer 81 and the metal layer 82 shown in FIG. 16 to FIG. 28 in the above-described first embodiment may be used.

Thirteenth Embodiment

Next, a manufacturing method of a probe sheet structure of a thirteenth embodiment that is slightly different from the manufacturing process of the probe sheet structure 105 described in the above-described eighth embodiment will be described with reference to FIG. 44 and FIG. 45.

Figure 44:
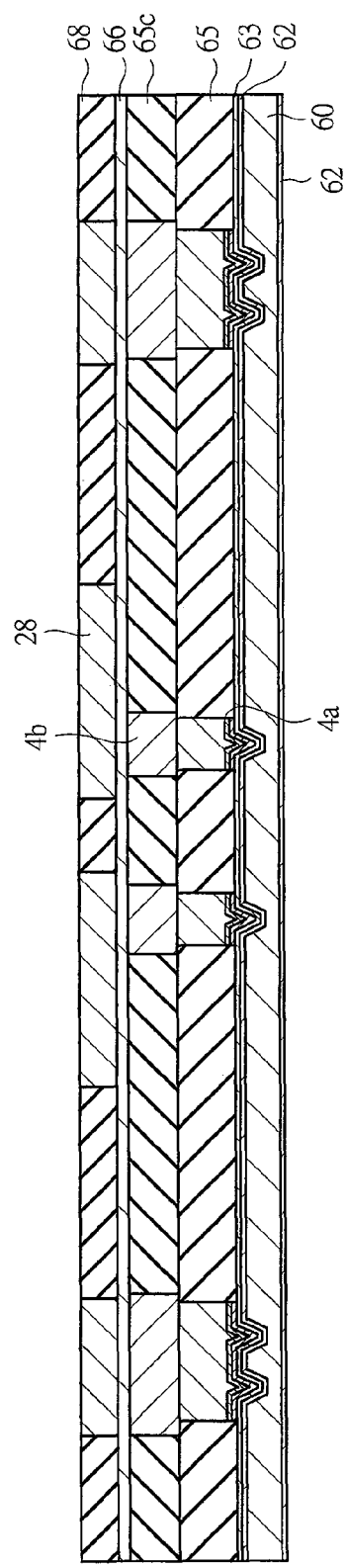
FIG. 44 is a cross sectional view showing the principal part of a manufacturing process for forming a probe sheet part (probe sheet structure) in a probe card according to the thirteenth embodiment of the present invention.
Figure 45:
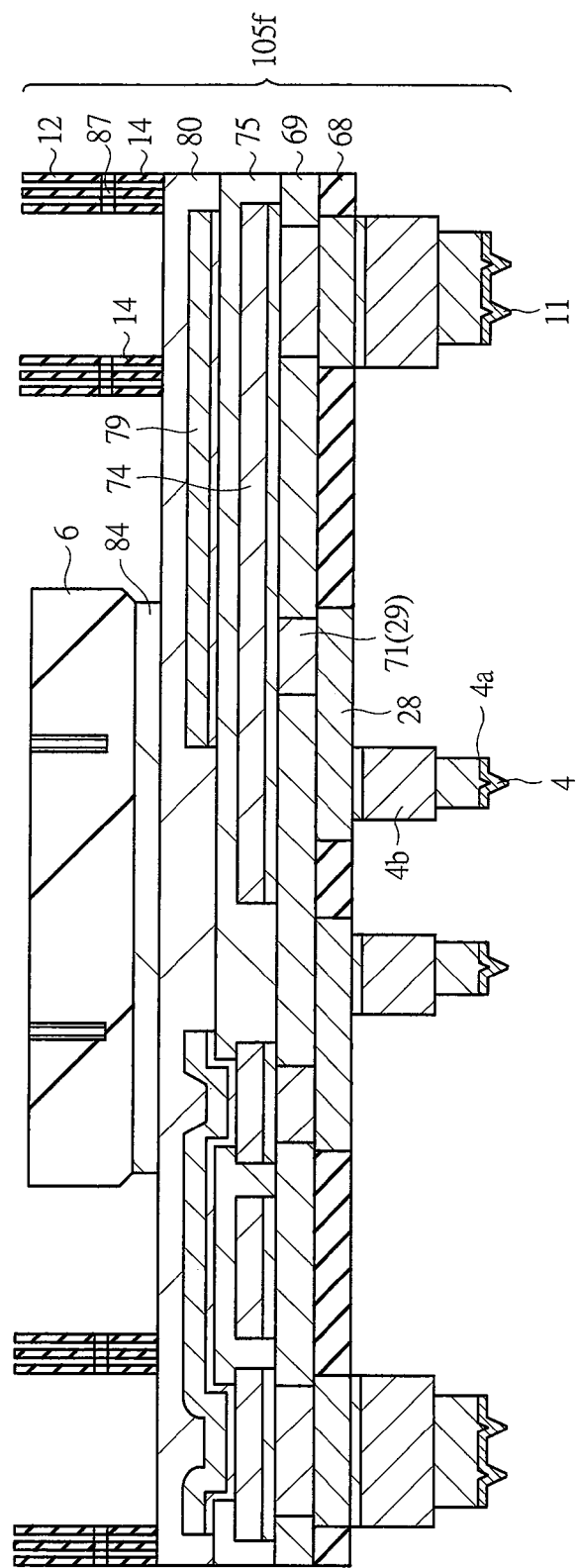
FIG. 45 is a cross sectional view showing the principal part of the manufacturing process of the probe sheet part subsequent to FIG. 44.

FIG. 44 and FIG. 45 show the manufacturing process of forming the probe sheet of the thirteenth embodiment in the order of steps.

This manufacturing method basically conforms to the manufacturing method described in the above-described eighth embodiment with reference to FIG. 16 to FIG. 28 and the manufacturing method described in the above-described twelfth embodiment with reference to FIG. 38 to FIG. 43, but this is an example of the fabrication in which only the polyimide films 65 and 65c are removed by etching and the other polyimide films are allowed to remain. Note that it goes without saying that the sacrifice layer of the polyimide film 65c may be omitted or the polishing step may be omitted in accordance with required specifications.

First, the step shown in FIG. 44 is performed. In this step, after the photoresist mask 67 is removed through the steps similar to those shown in FIG. 38 to FIG. 40 in the above-described twelfth embodiment, a polyimide film 68 is formed so as to cover the connection electrode portions 4b while leaving the conductive coating 66, and it is flatly polished so that the surfaces of the connection electrode portions 4b are exposed from the polyimide film 68. For example, CMP or polishing processing using a polishing sheet can be used to polish the surface of the polyimide film 68 and the surfaces of the connection electrode portions 4b.

Next, the step shown in FIG. 45 is performed. In this step, through the steps similar to those shown in FIG. 41 and FIG. 42 in the above-described twelfth embodiment, a probe sheet structure 105f shown in FIG. 45 is fabricated.

The thirteenth embodiment shows the example in which only the polyimide films 65 and 65c are removed by etching. Means such as dry etching, alkaline solution etching, laser processing, oxygen plasma etching, or the like can be used for the removal of the polyimide films. Here, since the polyimide films 68 and 69 are allowed to remain, the strength and the elastic modulus of the contact terminals with the cantilever beam structures can be ensured.

Fourteenth Embodiment

Next, a manufacturing method of a probe sheet structure of a fourteenth embodiment that is slightly different from the manufacturing process of the probe sheet structure 105 described in the above-described eighth embodiment will be described with reference to FIG. 46 to FIG. 49.

FIG. 46 to FIG. 49 show the manufacturing process of forming the probe sheet of the fourteenth embodiment in the order of steps.

This manufacturing method basically conforms to the manufacturing method described in the eighth embodiment with reference to FIG. 16 to FIG. 28, but this is an example of the fabrication in which a metal layer 92 is further formed below the polyimide film 65 of FIG. 18 to increase the height of the contact terminal portions 4a by using the metal layer 92 as a sacrifice layer, and the metal layer 92 and the polyimide films 65, 68, and 69 are removed. Note that it goes without saying that the polishing step may be omitted or the polyimide film 69 on the rear surfaces of the beams 28 may be allowed to remain with using the metal material of the beams 28 as a mask in accordance with required specifications.

Figure 46:
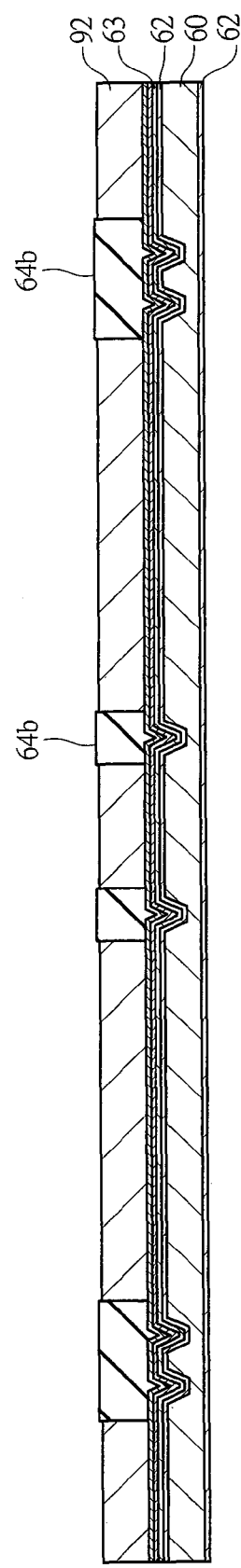
FIG. 46 is a cross sectional view showing the principal part of a manufacturing process for forming a probe sheet part (probe sheet structure) in a probe card according to the fourteenth embodiment of the present invention.

First, the step shown in FIG. 46 is performed. In this step, holes 60a are formed through the steps similar to those shown in FIG. 16 in the above-described eighth embodiment.

Next, the silicon dioxide film 61 used as a mask is removed by etching using a mixed solution of hydrofluoric acid and ammonium fluoride, and a silicon dioxide film 62 having the thickness of about 0.5 µm is formed again on the entire surface of the silicon wafer 60 by thermal oxidation in wet oxygen. Then, conductive coating 63 is formed on the surface of the silicon dioxide film 62, and then a photoresist mask 64b is formed at the portions where the contact terminal portions 4a and the peripheral electrodes 11 are to be formed on the surface of the conductive coating 63.

Next, a metal material is electroplated on the above-described conductive coating 63 with using the photoresist mask 64b as a mask, thereby forming the metal layer 92 (sacrifice layer). As the metal material to form the metal layer 92 (sacrifice layer), a metal that can be selectively etched (having etching selectivity) with respect to the material of the contact terminals can be used as the sacrifice layer. For example, in the case where the contact terminals made of the rhodium 4d and the nickel 4e are formed for the contact terminal portions 4a to be formed in a later step (see FIG. 48), copper having etching selectivity with respect to nickel and rhodium can be used as the sacrifice layer. The photoresist mask 64b may be a liquid resist or a film-like resist (dry film).

Figure 47:
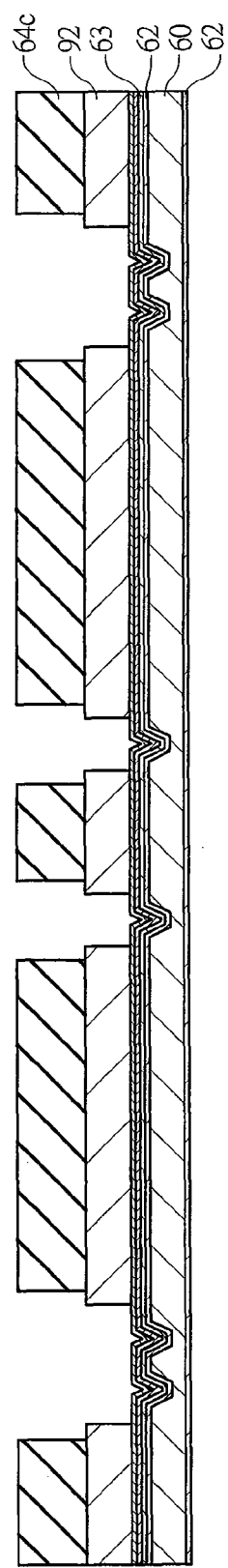
FIG. 47 is a cross sectional view showing the principal part of the manufacturing process of the probe sheet part subsequent to FIG. 46.

Next, the step shown in FIG. 47 is performed. In this step, after the photoresist mask 64b is removed, a photoresist is formed and a photoresist mask 64c in which the photoresist at the portions where the contact terminal portions 4a and the peripheral electrodes 11 are to be formed is removed is formed. The photoresist mask 64c may be a liquid resist or a film-like resist (dry film).

Figure 48:
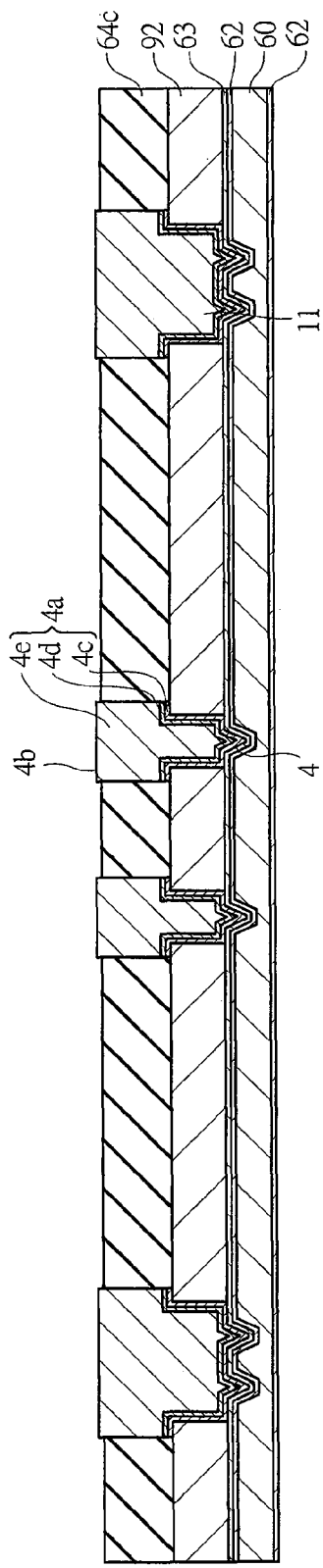
FIG. 48 is a cross sectional view showing the principal part of the manufacturing process of the probe sheet part subsequent to FIG. 47.

Next, the step shown in FIG. 48 is performed. In this step, electroplating using the photoresist mask 64c as a mask is carried out with using the conductive coating 63 as a power feeding layer and using a material having a high hardness as a primary component, thereby integrally forming the contact terminals 4 and the connection electrode portions 4b. At this time, the peripheral electrodes 11 having similar structures as the contact terminals 4 are also formed. As the plating materials having high hardness, for example, nickel 4c, rhodium 4d, and nickel 4e can be sequentially plated so as to form contact terminal portions 4a in each of which the contact terminal 4 and the contact electrode portion 4b are integrally formed.

Figure 49:
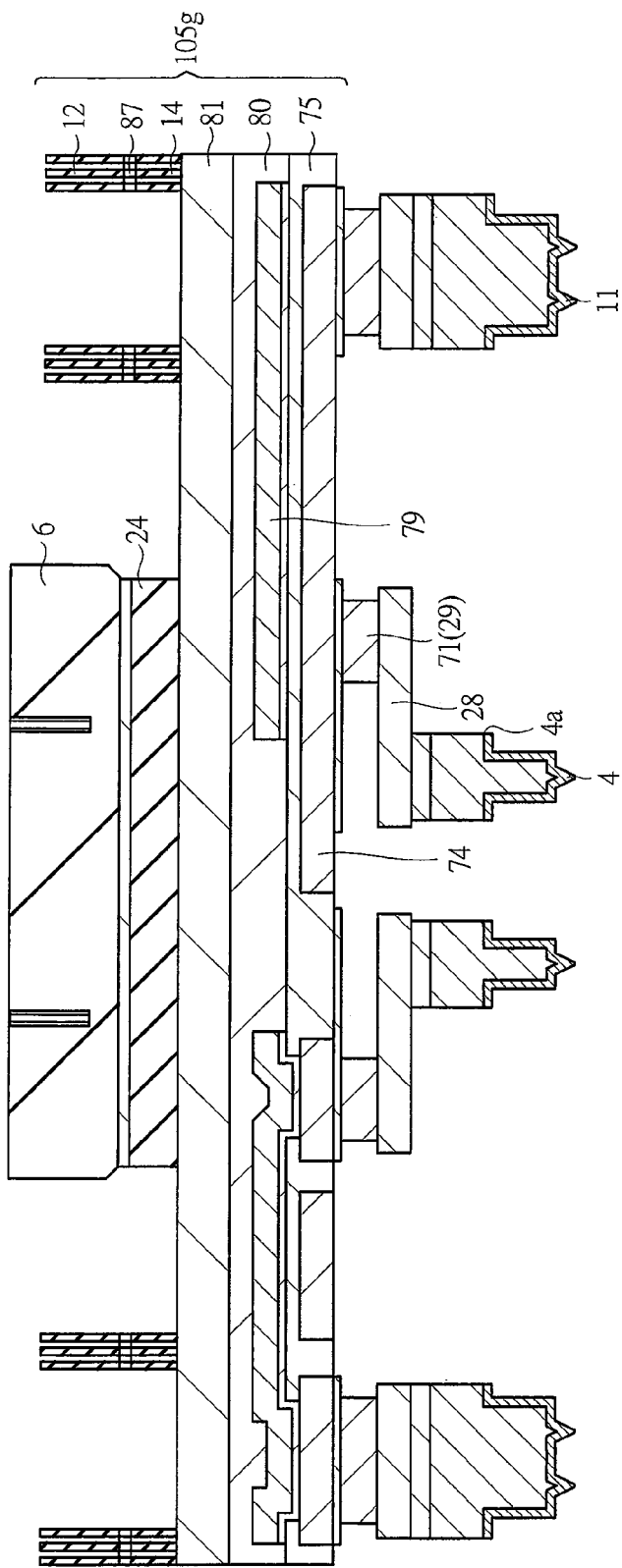
FIG. 49 is a cross sectional view showing the principal part of the manufacturing process of the probe sheet part subsequent to FIG. 48.

Next, the step shown in FIG. 49 is performed. In this step, through the steps similar to those shown in FIG. 18 to FIG. 24 and FIG. 25 to FIG. 27 in the above-described eighth embodiment, a probe sheet structure 105g of the fourteenth embodiment shown in FIG. 49 is fabricated.

Note that FIG. 47 shows the example in which the pattern in which the photoresist at the portions where the contact terminal portions 4a and the peripheral electrodes 11 are to be formed is removed is formed. Alternatively, after forming the photoresist mask 64c on the surfaces of the above-described photoresist mask 64b and the metal layer 92 while leaving the photoresist mask 64b, and further forming an aluminum film mask in accordance with needs, the photoresist mask 64c and the photoresist mask 64b at the portions where the desired contact terminal portions 4a and the peripheral electrodes 11 are to be formed may be removed by using dry etching or laser processing.

Further, in FIG. 47, after removing the photoresist mask 64b, forming the polyimide film 65 and further forming an aluminum film mask in accordance with needs, the polyimide film 65 at the portions where desired contact terminal portions 4a and the peripheral electrodes 11 are to be formed may be removed by using dry etching or laser processing.

Note that the manufacturing steps shown in FIG. 46 to FIG. 49 show the example in which the bonding layer 81 and the metal film 82 are used. However, it goes without saying that the bonding layer 81 and the metal film 82 may be omitted and a plating material may be used as the pattern material of the metal film 14 in the peripheries of the probe sheet in the fourteenth embodiment.

Fifteenth Embodiment

Next, a semiconductor inspection apparatus using any of the probe cards (probing devices) according to the above-described first to fourteenth embodiments will be described with reference to FIG. 50.

Figure 50:
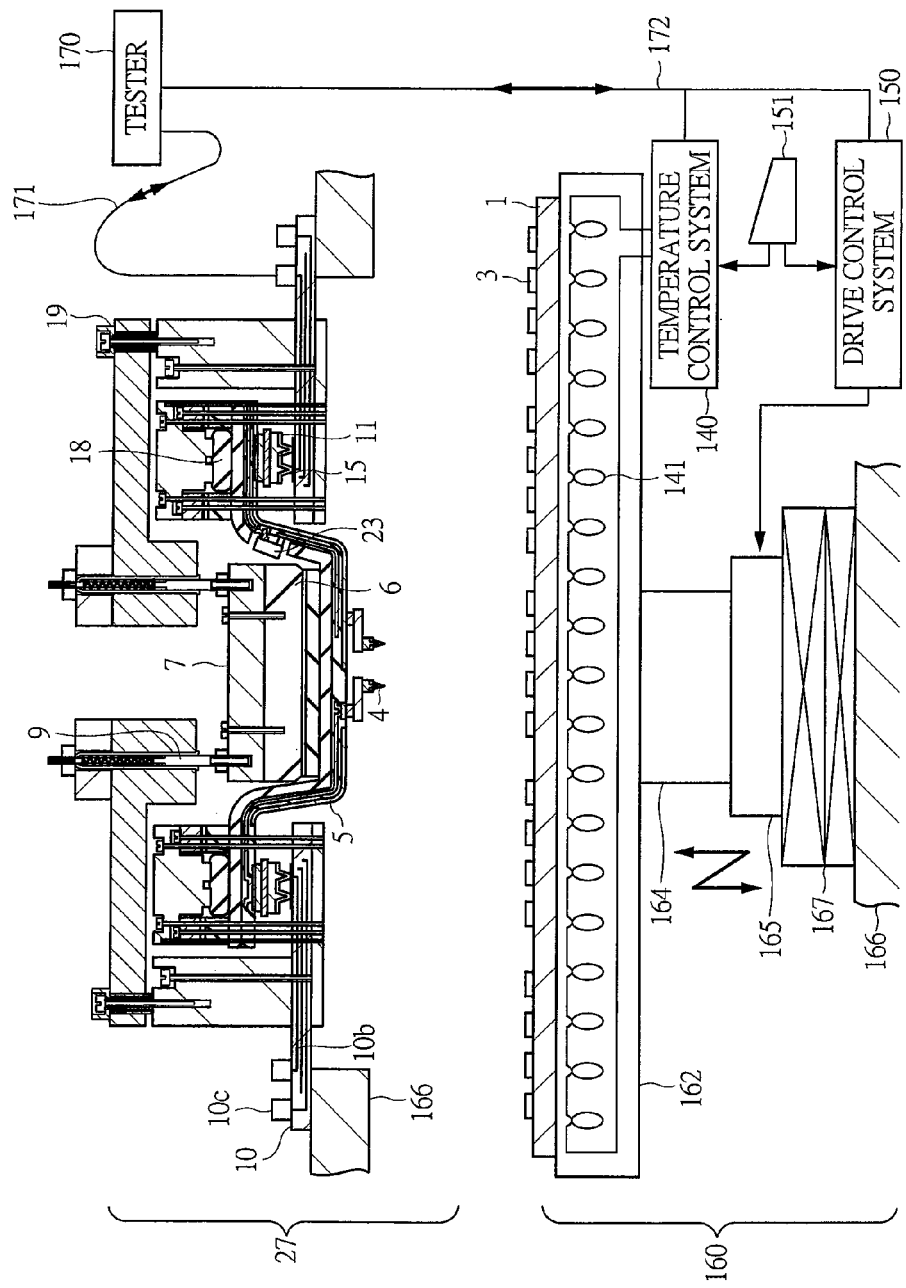
FIG. 50 is an entire schematic configuration drawing showing an example of an inspection system according to the fifteenth embodiment of the present invention.

FIG. 50 is an explanatory drawing showing the entire configuration of an inspection system including the semiconductor inspection apparatus according to the fifteenth embodiment, and FIG. 50 shows a test apparatus that carries out electrical characteristic inspection by applying desired contact loads on the surfaces of the respective electrodes 3 of the wafer 1 by the contact terminals 4 with the cantilever beam structures.

In the state shown in FIG. 50, the spring-incorporated guide pins 9a (may be substituted by the plate spring 26 (omitted in the drawing)) keep low loads by absorbing the load applied until the distal end surfaces of the group of the contact terminals 4 of the probe card 27 and the surfaces of the electrodes 3 of the wafer 1 are aligned with each other and the load increase due to the subsequent overdrive. In this state, the pressing force (loads) of the individual cantilever beam structures is applied to the contact terminals 4 formed at the distal ends of the cantilever beam structures, and electrical signals for inspection are transmitted to and received from a tester 170 that carries out the inspection of electrical characteristics of the semiconductor elements via the contact terminals 4 in contact with the electrodes 3 of the wafer 1, the lead-out wirings 16 (for example, the wiring materials 74 and 79), the peripheral electrodes 11, and the electrodes 15, internal wirings 10b, and electrodes 10c of the multi-layer wiring board 10.

In the entire configuration of the inspection system, the probe card 27 is formed as a wafer prober. This inspection system comprises: a sample supporting system 160 supporting the wafer 1 which is an object to be inspected; the probe card 27 which contacts the electrodes 3 of the object to be inspected (wafer 1) and carries out transmission/reception of electrical signals; a drive control system 150 which controls the operation of the sample supporting system 160; a temperature control system 140 which carries out temperature control of the object to be inspected; and the tester 170 which carries out the inspection of the electrical characteristics of the semiconductor elements (chips) 2. A large number of semiconductor elements (chips) 2 are arranged on the wafer 1, and a plurality of electrodes 3 which are external connection electrodes are arranged on the surface of each of the semiconductor elements 2. The sample supporting system 160 comprises: a sample stage 162 almost horizontally provided to detachably place the wafer 1 thereon; an elevating shaft 164 which is perpendicularly disposed so as to support the sample stage 162; an elevating driving unit 165 which moves up and down the elevating shaft 164; and an X-Y stage 167 which supports the elevating driving unit 165. The X-Y stage 167 is fixed onto a chassis 166. The elevating driving unit 165 comprises, for example, a stepping motor. The positioning operation of the sample stage 162 in the horizontal and perpendicular directions is carried out by the combination of the movement operation of the X-Y stage 167 within the horizontal plane and the vertical movement made by the elevating driving unit 165. Moreover, in the sample stage 162, a turning mechanism (not illustrated) is provided so as to enable turning displacement of the sample stage 162 within the horizontal plane.

Above the sample stage 162, a probe system (probe card 27) is disposed. More specifically, the probe card 27 and the multi-layer wiring board 10 shown also in FIG. 2 in the above-described first embodiment are provided in the posture of being parallelly opposed to the sample stage 162. Each of the contact terminals 4 is electrically connected to the electrode 10c provided on the multi-layer wiring board 10 via the lead-out wiring 16 (see FIG. 2 and FIG. 3) provided in the probe sheet 5 of the probe card 27 and the peripheral electrode 11 and the electrode 15 and the internal wire 10b of the multi-layer wiring board 10 and is electrically connected to the tester 170 via a cable 171 connected to the electrode 10c.

The drive control system 150 is connected to the tester 170 via a cable 172. Also, the drive control system 150 transmits control signals to actuators of each of driving units of the sample supporting system 160 so as to control the operation thereof. More specifically, the drive control system 150 has a computer therein and controls the operation of the sample supporting system 160 in accordance with progress information of the test operation of the tester 170 that is transmitted via the cable 172. Moreover, the drive control system 150 is provided with an operating unit 151 and receives inputs of various instructions related to the drive control such as the instruction for manual operation.

The sample stage 162 is provided with a heater 141 for heating the semiconductor elements 2. The temperature control system 140 controls the heater 141 or a cooling jig of the sample stage 162, thereby controlling the temperature of the wafer 1 mounted on the sample stage 162. Also, the temperature control system 140 is provided with the operating unit 151 and receives inputs of various instructions related to the temperature control such as the instruction for manual operation. Note that a heating element capable of carrying out temperature control provided at a part of the above-described probe sheet 5 or the probe card 27 and the heater 141 of the sample stage 162 may be operated in combination to carry out the temperature control.

Hereinafter, the operation of the semiconductor inspection apparatus will be described. First, the wafer 1 which is an object to be inspected is positioned above the sample stage 162 and placed thereon, and the X-Y stage 167 and the turning mechanism are driven so that the groups of the electrodes 3 formed on the plurality of the semiconductor elements 2 arranged on the wafer 1 are positioned immediately below the group of the many contact terminals 4 disposed on the probe card 27. Then, the drive control system 150 actuates the elevating driving unit 165 to move up the sample stage 162 until the surfaces of the many electrodes 3 which are the objects to be contacted are all pushed up by about 10 to 100 μm from the point when the surfaces are brought into contact with the distal ends of the contact terminals. By this means, the distal ends of the group of the individual contact terminals 4 formed at the distal ends of the cantilever beam structures for which flatness is highly accurately ensured initially by carrying out fine adjustment by the double screws 19 or shims in accordance with needs in the probe sheet 5 are leveled by the leveling mechanism (pressing mechanism) using the plurality of spring-incorporated guide pins 9a or the plate spring 26 so that the distal ends follow the surfaces of the groups of the many electrodes 3 (all) arranged on the semiconductor elements 2. Thereafter, the contacts are achieved with the pressing force based on the loads (about 3 to 150 mN per one pin) uniformly applied onto the objects to be contacted (electrodes 3) arranged on the wafer 1 by the loads by the flexure of the individual cantilever beam structures, and the contact terminals 4 and the electrodes 3 are electrically connected to each other with low resistance (0.01Ω to 0.1Ω).

At the initial pressing in this case, the fixing substrate 6 fixed to the surface on the side reverse to the contact terminal 4 side in the region in which the group of the contact terminals 4 is formed is inclined by the spring-incorporated guide pins 9a (or the plate spring 26), the distal end surfaces of the group of the contact terminals 4 on the surface reverse to the fixing substrate 6 are leveled so as to follow the surfaces of the groups of the electrodes 3 of the semiconductor elements 2, and the contact is achieved by the pressing force of the contact terminals 4 with the contact pressures by the flexure of the individual cantilever beam structures.

Furthermore, operating currents, operation inspection signals, and the like are transmitted/received between the semiconductor element 2 formed on the wafer 1 and the tester 170 via the cable 171, the multi-layer wiring board 10, and the contact terminals 4, and the operation characteristics of the corresponding semiconductor element 2 are checked. Further, the above-described series of inspection operations are carried out for each of the plurality of the semiconductor elements 2 formed on the wafer 1, and the operation characteristics thereof are checked.

Sixteenth Embodiment

Figure 51:
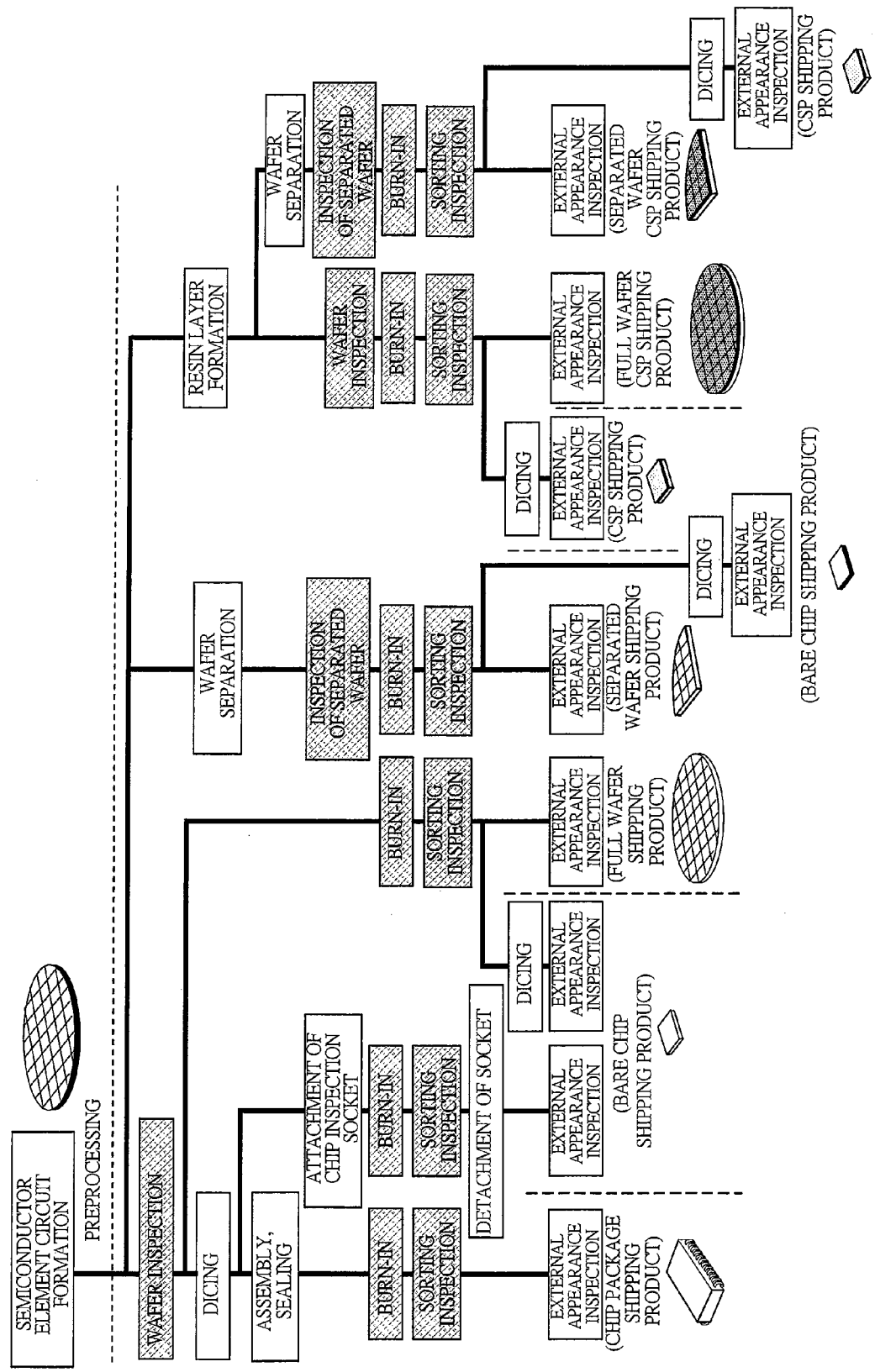
FIG. 51 is a process chart showing an example of an inspection process of a semiconductor device.
Figure 54:
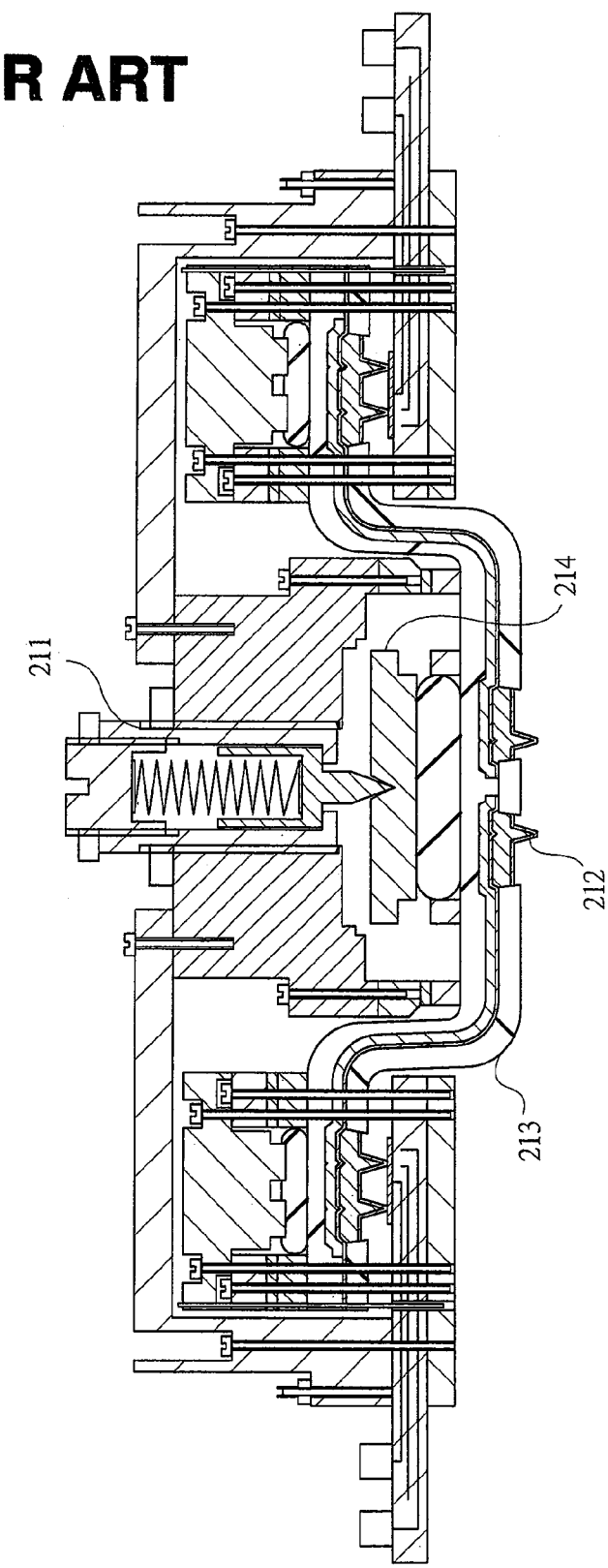
FIG. 54 is a cross sectional view showing the principal part of a conventional semiconductor element inspection apparatus using a probe sheet on which pyramidal contact terminals are formed.

Next, an example of the manufacturing method of a semiconductor device including the inspection process or the inspection method using the semiconductor inspection apparatus described in the fifteenth embodiment will be described with reference to FIG. 51.

(1) A manufacturing method of a semiconductor device according to the sixteenth embodiment includes a step of creating circuits on the wafer 1 to form semiconductor devices (semiconductor element circuit formation), a step of collectively inspecting the electrical characteristics of a plurality of semiconductor devices in a wafer level by the semiconductor inspection apparatus described in the fifteenth embodiment (wafer inspection), a step of cutting and separating the wafer 1 into semiconductor elements 2 (dicing), and a step of sealing the semiconductor elements 2 with resin or the like (assembly, sealing). Thereafter, through burn-in, sorting inspection, and external appearance inspection, they are shipped as chip package products.

(2) A manufacturing method of a semiconductor device according to the sixteenth embodiment includes a step of creating circuits on the wafer 1 to form semiconductor elements (semiconductor element circuit formation), a step of collectively inspecting the electrical characteristics of a plurality of semiconductor elements in a wafer level by the semiconductor inspection apparatus described in the fifteenth embodiment (wafer inspection), and a step of cutting and separating the wafer 1 into semiconductor elements 2 (dicing). Thereafter, through chip inspection socket attachment, burn-in, sorting inspection, removal from socket, and external appearance inspection, they are shipped as bare chip shipping products.

(3) A manufacturing method of a semiconductor device according to the sixteenth embodiment includes a step of creating circuits on the wafer 1 to form semiconductor devices (semiconductor element circuit formation), and a step of collectively inspecting the electrical characteristics of a plurality of semiconductor devices in a wafer level by the semiconductor inspection apparatus described in the fifteenth embodiment (wafer inspection). Thereafter, through burn-in, sorting inspection, and external appearance inspection, they are shipped as full wafer shipping products. Also in the burn-in and sorting inspection, the inspection by the semiconductor inspection apparatus described in the fifteenth embodiment is carried out.

(4) A manufacturing method of a semiconductor device according to the sixteenth embodiment includes a step of creating circuits on the wafer 1 to form semiconductor devices (semiconductor element circuit formation), and a step of collectively inspecting the electrical characteristics of a plurality of semiconductor devices in a wafer level by the semiconductor inspection apparatus described in the fifteenth embodiment (wafer inspection). Thereafter, through burn-in, external appearance inspection, a step of cutting and separating the wafer 1 into semiconductor elements 2 (dicing), and external appearance inspection, they are shipped as bare chip shipping products. Also in the burn-in and sorting inspection, the inspection by the semiconductor inspection apparatus described in the fifteenth embodiment is carried out.

(5) A manufacturing method of a semiconductor device according to the sixteenth embodiment includes a step of creating circuits on the wafer 1 to form semiconductor devices (semiconductor element circuit formation), a step of separating the wafer 1 (wafer separation), and a step of collectively inspecting the electrical characteristics of a plurality of semiconductor devices in separated wafer levels by the semiconductor inspection apparatus described in the fifteenth embodiment (separated wafer inspection). Thereafter, through burn-in, sorting inspection, and external appearance inspection, they are shipped as separated wafer shipping products. Also in the burn-in and sorting inspection, the inspection by the semiconductor inspection apparatus described in the fifteenth embodiment is carried out.

(6) A manufacturing method of a semiconductor device according to the sixteenth embodiment includes a step of creating circuits on the wafer 1 to form semiconductor devices (semiconductor element circuit formation), a step of separating the wafer (wafer separation), and a step of collectively inspecting the electrical characteristics of a plurality of semiconductor devices in separated wafer levels by the semiconductor inspection apparatus described in the fifteenth embodiment (separated wafer inspection). Thereafter, through burn-in, sorting inspection, a step of cutting the separated wafers into semiconductor elements (dicing), and external appearance inspection, they are shipped as bare chip shipping products. Also in the burn-in and sorting inspection, inspection by the semiconductor inspection apparatus described in the fifteenth embodiment is carried out.

(7) A manufacturing method of a semiconductor device according to the sixteenth embodiment includes a step of creating circuits on the wafer 1 to form semiconductor devices (semiconductor element circuit formation), a step of forming a resin layer and the like on the wafer 1 (resin layer formation), and a step of collectively inspecting the electrical characteristics of a plurality of semiconductor elements 2 formed on the wafer 1 on which the resin layer and the like are formed by the semiconductor inspection apparatus described in the fifteenth embodiment (wafer inspection). Thereafter, through burn-in, sorting inspection, a step of cutting and separating the wafer 1 into semiconductor elements 2 (dicing), and external appearance inspection, they are shipped as CSP shipping products. Also in the burn-in and sorting inspection, the inspection by the semiconductor inspection apparatus described in the fifteenth embodiment is carried out.

(8) A manufacturing method of a semiconductor device according to the sixteenth embodiment includes a step of creating circuits on the wafer 1 to form semiconductor devices (semiconductor element circuit formation), a step of forming a resin layer and the like on the wafer 1 (resin layer formation), and a step of collectively inspecting the electrical characteristics of a plurality of semiconductor elements 2 formed on the wafer 1 on which the resin layer and the like are formed by the semiconductor inspection apparatus described in the fifteenth embodiment (wafer inspection). Thereafter, through burn-in, sorting inspection, and external appearance inspection, they are shipped as full wafer CSP shipping products. Also in the burn-in and sorting inspection, the inspection by the semiconductor inspection apparatus described in the fifteenth embodiment is carried out.

(9) A manufacturing method of a semiconductor device according to the sixteenth embodiment includes a step of creating circuits on the wafer 1 to form semiconductor devices (semiconductor element circuit formation), a step of forming a resin layer and the like on the wafer 1 (resin layer formation), a step of separating the wafer 1 on which the resin layer and the like are formed (wafer separation), and a step of collectively inspecting the electrical characteristics of a plurality of semiconductor devices in separated wafer levels by the semiconductor inspection apparatus described in the fifteenth embodiment (separated wafer inspection). Thereafter, through burn-in, sorting inspection, and external appearance inspection, they are shipped as separated wafer CSP shipping products. Also in the burn-in and sorting inspection, inspection by the semiconductor inspection apparatus described in the fifteenth embodiment is carried out.

(10) A manufacturing method of a semiconductor device according to the sixteenth embodiment includes a step of creating circuits on the wafer 1 to form semiconductor devices (semiconductor element circuit formation), a step of forming a resin layer and the like on the wafer 1 (resin layer formation), a step of separating the wafer on which the resin layer and the like are formed (wafer separation), and a step of collectively inspecting the electrical characteristics of a plurality of semiconductor devices in separated wafer levels by the semiconductor inspection apparatus described in the fifteenth embodiment (separated wafer inspection). Thereafter, through burn-in, sorting inspection, a step of cutting and separating the wafer into semiconductor elements (dicing), and external appearance inspection, they are shipped as CSP shipping products. Also in the burn-in and sorting inspection, the inspection by the semiconductor inspection apparatus described in the fifteenth embodiment is carried out.

In the step of inspecting the electrical characteristics of the semiconductor elements 2 in the above-described manufacturing method of the semiconductor device, since the probe sheet structure described in the above-described first to thirteenth embodiments is used, the inspection having stable contact resistance values and good transmission characteristics can be realized with the low-load pressing force of several tens of mN or less and at high distal end positional accuracy of the contact terminals 4.

More specifically, each of the probe cards described in the above-described embodiments is provided with the probe sheet obtained by integrally forming the contact terminals with the cantilever beam structures having the pyramidal or truncated pyramidal shape and good positional accuracy, the lead-out wirings, the peripheral electrodes, and the polyimide films (insulating sheets) on the silicon substrate and sequentially removing the silicon substrate serving as a mold and predetermined polyimide films by etching, and the fixing substrate fixed to the region in which the contact terminals are formed is formed to be inclinable. According to such a probe card, even the probe sheet in which the contact terminals with the cantilever beam structures having a narrow pitch of about several tens of μm or less and having many pins are formed can be readily formed at a time, and designing and manufacture of electrical signal characteristics by multi-layers of thin-film wiring can be readily carried out by using photolithography techniques. Therefore, not only a probe card for the inspection of narrow pitches and many pins, but also a probe card having impedance-matched high-speed transmission circuits can be readily realized. Also, by virtue of the structure in which the metal sheet and the fixing substrate having linear expansion coefficients similar to that of an object to be inspected are directly fixed to the region in which the contact terminals are formed, the probe card having good distal end positional accuracy of the contact terminals in a wide temperature range can be realized.

Also, the probe card described in the above-described embodiments is provided with the probe sheet in which the cantilever beam structures in which the contact terminals having a pyramidal shape or truncated pyramidal shape are disposed at distal ends with good positional accuracy are formed at a time. Also, such a probe sheet is integrally formed with the fixing substrate on the sheet rear surface and an assembly material, inclining operations are realized by the spring-incorporated guide pins or the plate spring, and a desired pressing load of the individual contact terminals is realized by the cantilever beam structure. As a result, the probe card having good stability of the contact resistance value with a low load, good positional accuracy of the contact terminal group and good assembly properties can be realized.

In the probe card described in the embodiments above, a plurality of probes each of which has a block structure in which the fixing substrate fixed to the surface of the probe sheet reverse to the region where the contact terminals with the cantilever beam structures are formed is wrapped are combined and used in a semiconductor inspection. Therefore, a probe card for simultaneously inspecting many chips or a wafer cassette for a full-wafer inspection can be realized with a simple configuration.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above-described embodiments, the example in which the probe sheet fabricated in the steps described with reference to FIG. 16 to FIG. 28 is combined with the probe sheet structure having the configuration shown in FIG. 2 has been described. However, it goes without saying that the probe sheets formed by the various manufacturing processes as shown in FIG. 29 to FIG. 49 and the various probe sheet structures as shown in FIG. 7 to FIG. 15 may be arbitrarily combined.

The effects obtained by typical aspects of the present invention will be briefly described below.

In the probe card and the manufacturing method thereof of the present invention provided with the probe sheet in which the contact terminals with the cantilever beam structures having the pyramidal or truncated pyramidal shape and good positional accuracy, the lead-out wirings, the peripheral electrodes, and the insulating sheet are formed at a time, and the fixing substrate fixed to the region in which the contact terminals are formed is formed to be inclinable, the following effects are achieved when compared with a formation method of cantilever beams in which a membrane probe on which semispherical plating bumps are formed or contact terminal formation beams and a ceramic multi-layer wiring board are connected by solder, and thereafter, a sacrifice substrate thereof is removed by an etching solution.

(1) Even in the probe sheet in which the contact terminals with the cantilever beam structures having many pins at narrow pitches of several tens of μm or less are formed, the group of the contact terminals can be readily formed at a time, and the designing of electrical signal characteristics by the multiple layers of the wirings can be facilitated. Therefore, the probe card that can be applied to the inspection of narrow pitches and many pins and further has impedance-matched high-speed transmission circuits can be realized.

(2) By virtue of the structure in which the metal sheet and the fixing substrate having linear expansion coefficients similar to the object to be inspected are directly fixed to the region in which the contact terminals are formed, the probe card having good distal end positional accuracy of the contact terminals in a wide temperature range can be realized.

(3) Since the probe sheet in which the contact terminals having the pyramidal shape or the truncated pyramidal shape are formed at a time is formed integrally with an assembly material and both the individual pressing operation of the contact terminals with the cantilever beam structures and the inclining operation are achieved, stability of good contact resistance values at low loads can be realized even for an object to be inspected having a large area, and the probe card having good distal end positional accuracy of the contact terminals and good assembly properties can be realized.

Moreover, in the probe card of the present invention, a plurality of probes each of which has a block structure in which the fixing substrate fixed to the surface of the probe sheet reverse to the region where the contact terminals with the cantilever beam structures are formed is wrapped are combined and used in a semiconductor inspection. Therefore, a probe card for simultaneously inspecting many chips or a wafer cassette for a full-wafer inspection can be realized with a simple configuration.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A probe card comprising:
a probe sheet including a plurality of contact terminals to be in contact with electrodes provided on an object to be inspected, wirings electrically led out from the plurality of contact terminals, and a plurality of peripheral electrodes electrically connected to the wirings and connected to electrodes of a multi-layer wiring board;
a fixing substrate fixed to a region having the plurality of contact terminals formed therein at a second surface of the probe sheet on a side reverse to a first surface of the probe sheet on which the plurality of contact terminals are formed;
means for allowing the fixing substrate to be inclinable is provided;
a plurality of metallic materials fixed to the probe sheet and electrically connected to the probe sheet; and
a plurality of beams connected to the probe sheet through the plurality of metallic materials;
wherein each of the plurality of contact terminals is formed at an end of a corresponding one of the plurality of beams which extend so as to be spaced away from the probe sheet and is electrically connected to the probe sheet through the corresponding one of the plurality of beams, and
wherein another end of each of the plurality of beams is electrically connected to a corresponding one of the plurality of metallic materials.

2. The probe card according to claim 1,
wherein the multi-layer wiring board is electrically connected to a tester which inspects electrical characteristics of the object to be inspected.

3. The probe card according to claim 1,
wherein the means for allowing the fixing substrate to be inclinable is a plurality of guide pins having a spring characteristic.

4. The probe card according to claim 3,
wherein the means for allowing the fixing substrate to be inclinable further use a plurality of guide pins not having the spring characteristic.

5. The probe card according to claim 1,
wherein the means for allowing the fixing substrate to be inclinable is one or more plate springs.

6. The probe card according to claim 1,
wherein the contact terminal has a pyramidal shape or a truncated pyramidal shape.

7. The probe card according to claim 6,
wherein the contact terminals are formed by plating in which holes which are formed by performing anisotropic etching to a substrate having crystallinity are used as molds.

8. The probe card according to claim 7,
wherein the substrate having crystallinity is made of silicon.

9. A probe card comprising:
a probe sheet including a plurality of contact terminals to be in contact with electrodes provided on an object to be inspected, wirings electrically led out from the plurality of contact terminals, and a plurality of first and second peripheral electrodes electrically connected to the wirings and connected to electrodes of a multi-layer wiring board;
a fixing substrate fixed to a region having the plurality of contact terminals formed therein at a second surface of the probe sheet on a side reverse to a first surface of the probe sheet on which the plurality of contact terminals are formed;
means for allowing the fixing substrate to be inclinable is provided,
a plurality of metallic materials fixed to the probe sheet and electrically connected to the probe sheet; and
a plurality of beams connected to the probe sheet through the plurality of metallic materials;
wherein each of the plurality of contact terminals is formed at an end of a corresponding one of the plurality of beams which extend so as to be spaced away from the probe sheet and is electrically connected to the probe sheet through the corresponding one of the plurality of beams,
wherein another end of each of the plurality of beams is electrically connected to a corresponding one of the plurality of metallic materials, wherein each of the plurality of first peripheral electrodes is formed on the first surface of the probe sheet on a same side as the contact terminals, and wherein each of the plurality of second peripheral electrodes is formed on the second surface of the probe sheet on a side reverse to the contact terminals.

10. The probe card according to claim 9, wherein formation pitches of the first and second peripheral electrodes in the probe sheet are wider than a formation pitch of the plurality of contact terminals.

11. A semiconductor inspection apparatus comprising:

a sample stage on which an object to be inspected is placed; and a probe card including:

a probe sheet including a plurality of contact terminals to be in contact with electrodes provided on an object to be inserted, wirings electrically led out from the plurality of contact terminals, and a plurality of peripheral electrodes electrically connected to the wirings and connected to electrodes of a multi-layer wiring board;

a fixing substrate fixed to a region having the plurality of contact terminals formed therein at a second surface of the probe sheet on a side reverse to a first surface of the probe sheet on which the plurality of contact terminals are formed;

means for allowing the fixing substrate to be inclinable is provided;

a plurality of metallic materials fixed to the probe sheet and electrically connected to the probe sheet; and a plurality of beams connected to the probe sheet through the plurality of metallic materials;

wherein each of the plurality of contact terminals is formed at an end of a corresponding one of the plurality of beams which extend so as to be spaced away from the probe sheet and is electrically connected to the probe sheet through the corresponding one of the plurality of beams, and wherein another end of each of the plurality of beams is electrically connected to a corresponding one of the plurality of metallic materials.

12. The semiconductor inspection apparatus according to claim 11, wherein the probe sheet is formed by a process comprising:

(a) a step of forming the plurality of contact terminals by plating in which holes which are formed by performing anisotropic etching to a substrate having crystallinity are used as molds;

(b) a step of sequentially stacking the beams and the wirings electrically connected to the plurality of contact terminals and insulating layers on the substrate; and (c) a step of allowing the beams to be spaced away from the probe sheet by removing the insulating layers in same wiring layers as the plurality of contact terminals and the beams.

* * * * *